(12) United States Patent
Jiang et al.

(10) Patent No.: US 10,868,226 B2
(45) Date of Patent: Dec. 15, 2020

(54) LED LIGHT BULB HAVING FILAMENT WITH CONDUCTOR PRATLY OVERLAPPING WITH LED CHIP

(71) Applicant: JIAXING SUPER LIGHTING ELECTRIC APPLIANCE CO., LTD, Jiaxing (CN)

(72) Inventors: Tao Jiang, Jiaxing (CN); Weihong Xu, Jiaxing (CN); Yukihiro Saito, Jiaxing (CN); Hayato Unagike, Jiaxing (CN); Aiming Xiong, Jiaxing (CN); Junfeng Xu, Jiaxing (CN); Yiching Chen, Taichung (TW)

(73) Assignee: JIAXING SUPER LIGHTING ELECTRIC APPLIANCE CO., LTD, Jiaxing (CN)

(*) Notice: Subject to any disclaimer, the term of this patent is extended or adjusted under 35 U.S.C. 154(b) by 0 days.

(21) Appl. No.: 16/594,104

(22) Filed: Oct. 7, 2019

(65) Prior Publication Data

US 2020/0035876 A1 Jan. 30, 2020

Related U.S. Application Data

(63) Continuation of application No. 16/479,220, filed as application No. PCT/CN2018/123818 on Dec. 26, 2018, now Pat. No. 10,790,419.

(30) Foreign Application Priority Data

Dec. 26, 2017 (CN) .......................... 2017 1 1434993
Dec. 29, 2017 (CN) .......................... 2017 1 1477767
(Continued)

(51) Int. Cl.
*H01L 33/50* (2010.01)
*F21K 9/237* (2016.01)
(Continued)

(52) U.S. Cl.
CPC ............ *H01L 33/508* (2013.01); *F21K 9/237* (2016.08); *H01L 25/0753* (2013.01); *H01L 33/501* (2013.01); *H01L 33/62* (2013.01)

(58) Field of Classification Search
CPC ... H01L 33/508; H01L 33/62; H01L 25/0753; H01L 33/501; F21K 9/237
See application file for complete search history.

(56) References Cited

U.S. PATENT DOCUMENTS 8,455,895 B2 6/2013 Chai et al.
8,933,619 B1 1/2015 Ou
(Continued)

FOREIGN PATENT DOCUMENTS

CN 202209551 U 5/2012
CN 202719450 U 2/2013
(Continued)

*Primary Examiner* — Joseph L Williams
(74) *Attorney, Agent, or Firm* — Simon Kuang Lu

(57) ABSTRACT

An LED light bulb, consisting of: a lamp housing; a bulb base connected to the lamp housing; a stem connected to the bulb base and located in the lamp housing, the stem comprises a stand extending to the center of the lamp housing; a single LED filament, disposed in the lamp housing, the LED filament comprising: a plurality of LED sections, each of the LED sections includes at least two LED chips that are electrically connected to each other by a wire; a plurality of conductive sections, each of the conductive sections is located between the two adjacent LED sections and configured to electrically connect the two adjacent LED sections, each of the conductive section includes a conductor connecting the LED sections, and length of the wire being less than that of the conductor, the conductor comprises joint region and transition regions, the joint region is located between the transition regions and configured to connect the transition regions, wherein taking the central point of the LED chip as the center, the shortest distance from the center
(Continued)

to the closest boundary of the joint region is set to r1, and the shortest distance from the center to the closest boundary of the transition region is set to r2, where the distance r1 is greater than or equal to the distance r2; two conductive supports, a driving circuit, electrically connected with both the two conductive supports and the bulb base; and a plurality of supporting arms.

20 Claims, 21 Drawing Sheets

(30) Foreign Application Priority Data

| Date | | Number |
|---|---|---|
| Jan. 12, 2018 | (CN) | 2018 1 0031786 |
| Jan. 23, 2018 | (CN) | 2018 1 0065369 |
| Apr. 17, 2018 | (CN) | 2018 1 0343825 |
| Apr. 17, 2018 | (CN) | 2018 1 0344630 |
| May 23, 2018 | (CN) | 2018 1 0498980 |
| May 23, 2018 | (CN) | 2018 1 0501350 |
| Jun. 6, 2018 | (CN) | 2018 1 0573314 |
| Jul. 26, 2018 | (CN) | 2018 1 0836433 |
| Aug. 17, 2018 | (CN) | 2018 1 0943054 |
| Aug. 30, 2018 | (CN) | 2018 1 1005145 |
| Aug. 30, 2018 | (CN) | 2018 1 1005536 |
| Sep. 17, 2018 | (CN) | 2018 1 1079889 |
| Oct. 30, 2018 | (CN) | 2018 1 1277980 |
| Oct. 31, 2018 | (CN) | 2018 1 1285657 |
| Nov. 19, 2018 | (CN) | 2018 1 1378173 |
| Nov. 19, 2018 | (CN) | 2018 1 1378189 |
| Dec. 18, 2018 | (CN) | 2018 1 1549205 |

(51) Int. Cl.
 *H01L 25/075* (2006.01)
 *H01L 33/62* (2010.01)

(56) References Cited

U.S. PATENT DOCUMENTS

| | | |
|---|---|---|
| 9,016,900 B2 | 4/2015 | Takeuchi et al. |
| 9,488,767 B2 | 11/2016 | Nava et al. |
| 9,761,765 B2 | 9/2017 | Basin et al. |
| 2004/0008525 A1 | 1/2004 | Shibata |
| 2009/0184618 A1 | 7/2009 | Hakata et al. |
| 2012/0119647 A1 | 5/2012 | Hsu |
| 2012/0281411 A1 | 11/2012 | Kajiya et al. |
| 2013/0058080 A1 | 3/2013 | Ge et al. |
| 2013/0058580 A1 | 3/2013 | Ge et al. |
| 2013/0147348 A1 | 6/2013 | Motoya et al. |
| 2013/0235592 A1 | 9/2013 | Takeuchi et al. |
| 2013/0265796 A1 | 10/2013 | Kwisthout |
| 2013/0293098 A1 | 11/2013 | Li et al. |
| 2014/0268779 A1 | 9/2014 | Sorensen et al. |
| 2014/0369036 A1 | 12/2014 | Feng |
| 2015/0069442 A1 | 3/2015 | Liu et al. |
| 2015/0070871 A1 | 3/2015 | Chen et al. |
| 2015/0255440 A1 | 9/2015 | Hsieh |
| 2016/0238199 A1 | 8/2016 | Yeung et al. |
| 2016/0377237 A1 | 12/2016 | Zhang |
| 2017/0012177 A1 | 1/2017 | Trottier |
| 2017/0016582 A1 | 1/2017 | Yang et al. |
| 2017/0138542 A1 | 5/2017 | Gielen et al. |
| 2017/0167663 A1 | 6/2017 | Hsiao et al. |
| 2017/0167711 A1 | 6/2017 | Kadijk |

FOREIGN PATENT DOCUMENTS

| | | |
|---|---|---|
| CN | 101968181 B | 3/2013 |
| CN | 202834823 U | 3/2013 |
| CN | 103123949 A | 5/2013 |
| CN | 203367275 U | 12/2013 |
| CN | 103560128 A | 2/2014 |
| CN | 103682042 A | 3/2014 |
| CN | 203477967 U | 3/2014 |
| CN | 103890481 A | 6/2014 |
| CN | 203628391 U | 6/2014 |
| CN | 203628400 U | 6/2014 |
| CN | 203656627 U | 6/2014 |
| CN | 103939758 A | 7/2014 |
| CN | 203771136 U | 8/2014 |
| CN | 203857313 U | 10/2014 |
| CN | 203910792 U | 10/2014 |
| CN | 204062539 U | 12/2014 |
| CN | 104295945 A | 1/2015 |
| CN | 104319345 A | 1/2015 |
| CN | 204083941 U | 1/2015 |
| CN | 204153513 U | 2/2015 |
| CN | 104456165 A | 3/2015 |
| CN | 204289439 U | 4/2015 |
| CN | 104600174 A | 5/2015 |
| CN | 104600181 A | 5/2015 |
| CN | 104716247 A | 6/2015 |
| CN | 104913217 A | 9/2015 |
| CN | 105090789 A | 11/2015 |
| CN | 105098032 A | 11/2015 |
| CN | 105140381 A | 12/2015 |
| CN | 105161608 A | 12/2015 |
| CN | 204986570 U | 1/2016 |
| CN | 106468405 A | 3/2017 |
| CN | 106898681 A | 6/2017 |
| CN | 107123641 A | 9/2017 |
| CN | 107314258 A | 11/2017 |
| CN | 206973307 U | 2/2018 |
| CN | 105090782 B | 7/2018 |
| CN | 207849021 U | 9/2018 |
| EP | 2535640 A1 | 12/2012 |
| EP | 2760057 A1 | 7/2014 |
| EP | 2567145 B1 | 4/2016 |
| GB | 2547085 A | 8/2017 |
| JP | 2001126510 A | 5/2001 |
| JP | 2003037239 A | 2/2003 |
| WO | 2014167458 A1 | 10/2014 |
| WO | 2017037010 A1 | 3/2017 |

LED LIGHT BULB HAVING FILAMENT WITH CONDUCTOR PRATLY OVERLAPPING WITH LED CHIP

CROSS-REFERENCE TO RELATED APPLICATIONS

This application is a continuation application of U.S. application Ser. No. 16/479,220 filed on 2019 Jul. 19, which claims priority to Chinese Patent Applications No. 201711434993.3 filed on 2017 Dec. 26; No. 201711477767.3 filed on 2017 Dec. 29; No. 201810031786.1 filed on 2018 Jan. 12; No. 201810065369.9 filed on 2018 Jan. 23; No. 201810343825.1 filed on 2018 Apr. 17; No. 201810344630.9 filed on 2018 Apr. 17; No. 201810501350.4 filed on 2018 May 23; No. 201810498980.0 filed on 2018 May 23; No. 201810573314.9 filed on 2018 Jun. 6; No. 201810836433.9 filed on 2018 Jul. 26; No. 201810943054.X filed on 2018 Aug. 17; No. 201811005536.7 filed on 2018 Aug. 30; No. 201811005145.5 filed on 2018 Aug. 30; No. 201811079889.1 filed on 2018 Sep. 17; No. 201811277980.4 filed on 2018 Oct. 30; No. 201811285657.1 filed on 2018 Oct. 31; No. 201811378173.1 filed on 2018 Nov. 19; No. 201811378189.2 filed on 2018 Nov. 19; No. 201811549205.X filed on 2018 Dec. 18, each of which is hereby incorporated by reference in its entirety.

TECHNICAL FIELD

The present disclosure relates to a lighting field, and more particularly to an LED light bulb having filament with conductor partly overlapping with LED chip.

RELATED ART

Incandescent bulbs have been widely used for homes or commercial lighting for decades. However, incandescent bulbs are generally with lower efficiency in terms of energy application, and about 90% of energy input can be converted into a heat form to dissipate. In addition, because the incandescent bulb has a very limited lifespan (about 1,000 hours), it needs to be frequently replaced. These traditional incandescent bulbs are gradually replaced by other more efficient lighting devices, such as fluorescent lights, high-intensity discharge lamps, light-emitting diodes (LEDs) lights and the like. In these electric lamps, the LED light lamp attracts widespread attention in its lighting technology. The LED light lamp has the advantages of long lifespan, small in size, environmental protection and the like, therefore the application of the LED light lamp continuously grows.

In recent years, LED light bulbs with LED filaments have been provided on the market. At present, LED light bulbs using LED filaments as illumination sources still have the following problems to be improved.

Firstly, an LED hard filament is provided with a substrate (for example, a glass substrate) and a plurality of LED chips disposed on the substrate. However, the illumination appearance of the LED light bulbs relies on multiple combinations of the LED hard filaments to produce the better illumination appearances. The illumination appearance of the single LED hard filament cannot meet the general needs in the market. A traditional incandescent light bulb is provided with a tungsten filament, the uniform light emitting can be generated due to the natural bendable property of the tungsten filament. In contrast, the LED hard filament is difficult to achieve such uniform illumination appearances. There are many reasons why LED hard filaments are difficult to achieve the uniform illumination appearance. In addition to the aforementioned lower bendable property, one of the reasons is that the substrate blocks the light emitted by the LED chip, and furthermore the light generated by the LED chip is displayed similar to a point light source which causes the light showing concentrated illumination and with poor illumination uniformity. In other words, a uniform distribution of the light emitted from LED chip produces a uniform illumination appearance of the LED filament. On the other hand, the light ray distribution similar to a point light source may result in uneven and concentrated illumination.

Secondly, there is one kind of LED soft filament, which is similar to the structure of the above-mentioned LED hard filament and is employed a flexible printed circuit substrate (hereinafter referred to FPC) instead of the glass substrate to enable the LED filament having a certain degree of bending. However, by utilizing the LED soft filament made of the FPC, the FPC has a thermal expansion coefficient different from that of the silicon gel coated covering the LED soft filament, and the long-term use causes the displacement or even degumming of the LED chips. Moreover, the FPC may not beneficial to flexible adjustment of the process conditions and the like. Besides, during bending the LED soft filament it has a challenge in the stability of the metal wire bonded between LED chips. When the arrangement of the LED chips in the LED soft filament is dense, if the adjacent LED chips are connected by means of metal wire bonding, it is easy to cause the stress to be concentrated on a specific part of the LED soft filament when the LED soft filament is bent, thereby the metal wire bonding between the LED chips are damaged and even broken.

In addition, the LED filament is generally disposed inside the LED light bulb, and in order to present the aesthetic appearance and also to make the illumination of the LED filament more uniform and widespread, the LED filament is bent to exhibit a plurality of curves. Since the LED chips are arranged in the LED filaments, and the LED chips are relatively hard objects, it is difficult for the LED filaments to be bent into a desired shape. Moreover, the LED filament is also prone to cracks due to stress concentration during bending.

In order to increase the aesthetic appearance and make the illumination appearance more uniform, an LED light bulb has a plurality of LED filaments, which are disposed with different placement or angles. However, since the plurality of LED filaments need to be installed in a single LED light bulb, and these LED filaments need to be fixed individually, the assembly process will be more complicated and the production cost will be increased.

Patent No. CN202252991U discloses the light lamp employing with a flexible PCB board instead of the aluminum heat dissipation component to improve heat dissipation. Wherein, the phosphor is coated on the upper and lower sides of the LED chip or on the periphery thereof, and the LED chip is fixed on the flexible PCB board and sealed by an insulating adhesive. The insulating adhesive is epoxy resin, and the electrodes of the LED chip are connected to the circuitry on the flexible PCB board by gold wires. The flexible PCB board is transparent or translucent, and the flexible PCB board is made by printing the circuitry on a polyimide or polyester film substrate. Patent No. CN105161608A discloses an LED filament light-emitting strip and a preparation method thereof. Wherein the LED chips are disposed without overlapped, and the light-emitting surfaces of the LED chips are correspondingly arranged, so that the light emitting uniformity and heat dissipation is improved accordingly. Patent No. CN103939758A discloses that a transparent and thermally conductive heat dissipation layer is formed between the interface of the carrier and the LED chip for heat exchange with the LED chip. According to the aforementioned patents, which respectively use a PCB board, adjust the chips arrangement or form a heat dissipation layer, the heat dissipation of the filament of the lamp can be improved to a certain extent correspondingly; however, the heat is easy to accumulate due to the low efficiency in heat dissipation. The last one, Publication No. CN204289439U discloses an LED filament with omnidirectional light comprising a substrate mixed with phosphors, at least one electrode disposed on the substrate, at least one LED chip mounted on the substrate, and the encapsulant coated on the LED chip. The substrate formed by the silicone resin contained with phosphors eliminates the cost of glass or sapphire as a substrate, and the LED filament equipping with this kind of substrate avoids the influence of glass or sapphire on the light emitting of the LED chip. The 360-degree light emitting is realized, and the illumination uniformity and the light efficiency are greatly improved. However, due to the fact that the substrate is formed by silicon resin, the defect of poor heat resistance is a disadvantage.

SUMMARY

It is noted that the present disclosure includes one or more inventive solutions currently claimed or not claimed, and in order to avoid confusion between the illustration of these embodiments in the specification, a number of possible inventive aspects herein may be collectively referred to "present/the invention."

A number of embodiments are described herein with respect to "the invention." However, the word "the invention" is used merely to describe certain embodiments disclosed in this specification, whether or not in the claims, is not a complete description of all possible embodiments. Some embodiments of various features or aspects described below as "the invention" may be combined in various ways to form an LED light bulb or a portion thereof.

In accordance with another embodiment of the present invention, an LED filament comprises at least one LED section, a conductive section, at least two conductive electrodes and a light conversion layer. The conductive section is located between two adjacent LED sections. The two conductive electrodes are disposed on the LED filament correspondingly and electrically connected to each of the LED sections. The adjacent two LED sections are electrically connected to each other through the conductive section. Each of the LED sections includes at least two LED chips, and the LED chips are electrically connected to each other by at least one wire. The light conversion layer covers the LED sections, the conductive sections and the conductive electrodes, and a part of each of the two electrodes is exposed respectively.

In accordance with an embodiment of the present invention, the conductive section includes a conductor connecting with the LED section, and the length of the wire connecting between the LED chips is less than the length of the conductor.

In accordance with an embodiment of the present invention, the light conversion layer includes at least one top layer and one base layer.

In accordance with another embodiment of the present invention, an LED filament comprises at least one LED section, a conductive section, at least two conductive electrodes and a light conversion layer. The conductive section is located between two adjacent LED sections. The two conductive electrodes are electrically connected to the LED sections. The adjacent two LED sections are electrically connected to each other through the conductive section. Each of the conductive sections is electrically connected to the LED section by at least one wire.

In accordance with an embodiment of the present invention, each of the LED sections includes at least two LED chips, and the LED chips are electrically connected to each other by the wire.

In accordance with an embodiment with the present invention, the structure of the conductive section may in the form of a wavy concave, a wavy convex or a spiral shape.

In accordance with an embodiment of the present invention, the structure of a conductor of the conductive section may in the form of wavy shaped.

In accordance with another embodiment of the present invention, an LED filament comprises a base layer, at least one LED chip and a top layer disposed on the base layer. The top layer having an arc-shaped concave surface is collapsed naturally from the boundary of the top layer, and the thickness of the base layer is less than or equal to the thickness of the top layer.

In accordance with an embodiment of the present invention, the phosphor concentration of the top layer can be greater than the phosphor concentration of the base layer.

In accordance with an embodiment of the present invention, the proportional relationship between the width W1 of the base layer or the top layer and the width W2 of the LED chip is W1:W2=1:0.8 to 0.9.

In accordance with another embodiment of the present invention provides a composition which is suitable for use as a filament substrate or a light conversion layer, wherein the composition comprises at least a main material, a modifier and an additive. The main material is an organosilicon-modified polyimide; the modifier is a thermal curing agent; and the additives comprise microparticles added into the main material, which may comprise phosphor particles, heat dispersing particles. The additive also comprises a coupling agent.

The present disclosure provides a composition which is suitable for use as a filament substrate or a light-conversion layer, wherein the main material in the composition is an organosilicon-modified polyimide, i.e. a polyimide comprising a siloxane moiety, wherein the organosilicon-modified polyimide comprises a repeating unit represented by the general Formula (I):

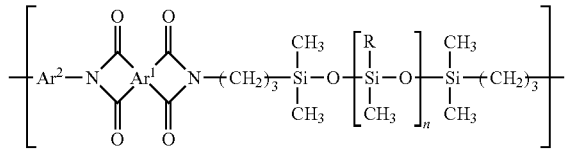

Formula (I)

In general Formula (I), $Ar^1$ is a tetra-valent organic group having a benzene ring or an alicyclic hydrocarbon structure, $Ar^2$ is a di-valent organic group, R is each independently methyl or phenyl, and n is 1~5.

According to an embodiment of the present disclosure, $Ar^1$ is a tetra-valent organic group having a monocyclic alicyclic hydrocarbon structure or a bridged-ring alicyclic hydrocarbon structure.

According to another embodiment of the present disclosure, $Ar^2$ is a di-valent organic group having a monocyclic alicyclic hydrocarbon structure.

In accordance with an embodiment of the present invention, a perspective diagram of the light emission spectrum of an LED light bulb is provided. The LED light bulb may be any LED light bulb disclosed in the previous embodiments, the spectral distribution of the LED light bulb is mainly between the wavelength range of about 400 nm to 800 nm. Moreover, there are three peak wavelengths P1, P2, P3 in wavelength ranges corresponding to the light emitted by the LED light bulb. The wavelength of the peak value P1 is between about 430 nm and 480 nm, the wavelength of the peak value P2 is between about 580 nm and 620 nm, and the wavelength of the peak value peak P3 is between about 680 nm and 750 nm. The light intensity of the peak P1 is less than that of the peak P2, and the light intensity of the peak P2 is less than the light intensity of the peak P3.

To make the above and other objects, features, and advantages of the present invention clearer and easier to understand, the following embodiments will be described in detail with reference to the accompanying drawings.

BRIEF DESCRIPTION OF THE DRAWINGS

The present invention will become more readily apparent to those ordinarily skilled in the art after reviewing the following detailed description and accompanying drawings, in which:

FIGS. 2J to 2M are schematic views showing an LED filament with attaching strength being enhanced in accordance with the present invention, wherein FIG. 2J is a perspective view of a conductor, FIG. 2K is a perspective view showing a base layer, a conductor and a top layer, and FIGS. 2L and 2M are cross sectional views along a line E1-E2 in FIG. 2K for different structures;

DETAILED DESCRIPTION

Figure 1A:
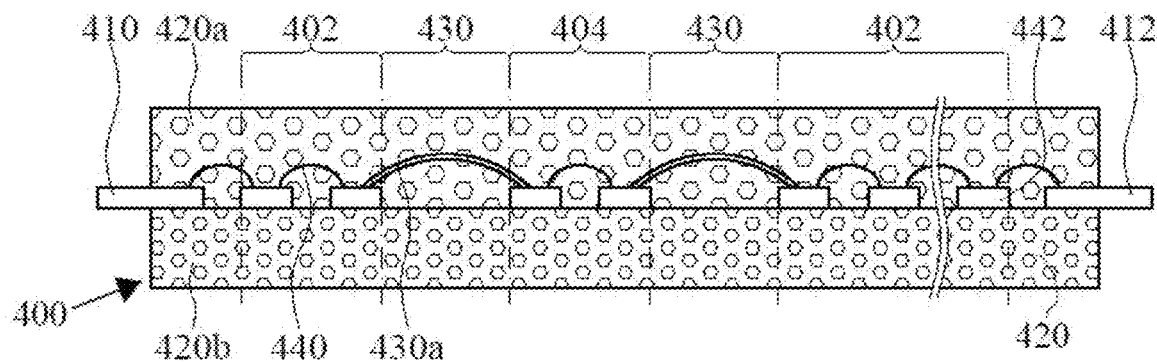
FIG. 1A is a cross sectional view of an LED filament in accordance with an embodiment of the present invention.

The present disclosure provides a novel LED filament and its application the LED light bulb. The present disclosure will now be described in the following embodiments with reference to the drawings. The following descriptions of various implementations are presented herein for purpose of illustration and giving examples only. This invention is not intended to be exhaustive or to be limited to the precise form disclosed. These example embodiments are just that—examples—and many implementations and variations are possible that do not require the details provided herein. It should also be emphasized that the disclosure provides details of alternative examples, but such listing of alternatives is not exhaustive. Furthermore, any consistency of detail between various examples should not be interpreted as requiring such detail—it is impracticable to list every possible variation for every feature described herein. The language of the claims should be referenced in determining the requirements of the invention.

In the drawings, the size and relative sizes of components may be exaggerated for clarity. Like numbers refer to like elements throughout.

The terminology used herein is for the purpose of describing particular embodiments only and is not intended to be limiting of the invention. As used herein, the singular forms "a", "an" and "the" are intended to include the plural forms as well, unless the context clearly indicates otherwise. As used herein, the term "and/or" includes any and all combinations of one or more of the associated listed items and may be abbreviated as "/".

It will be understood that, although the terms first, second, third etc. may be used herein to describe various elements, components, regions, layers, or steps, these elements, components, regions, layers, and/or steps should not be limited by these terms. Unless the context indicates otherwise, these terms are only used to distinguish one element, component, region, layer, or step from another element, component, region, or step, for example as a naming convention. Thus, a first element, component, region, layer, or step discussed below in one section of the specification could be termed a second element, component, region, layer, or step in another section of the specification or in the claims without departing from the teachings of the present invention. In addition, in certain cases, even if a term is not described using "first," "second," etc., in the specification, it may still be referred to as "first" or "second" in a claim in order to distinguish different claimed elements from each other.

It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

It will be understood that when an element is referred to as being "connected" or "coupled" to or "on" another element, it can be directly connected or coupled to or on the other element or intervening elements may be present. In contrast, when an element is referred to as being "directly connected" or "directly coupled," or "immediately connected" or "immediately coupled" to another element, there are no intervening elements present. Other words used to describe the relationship between elements should be interpreted in a like fashion (e.g., "between" versus "directly between," "adjacent" versus "directly adjacent," etc.). However, the term "contact," as used herein refers to a direct connection (i.e., touching) unless the context indicates otherwise.

Embodiments described herein will be described referring to plan views and/or cross-sectional views by way of ideal schematic views. Accordingly, the exemplary views may be modified depending on manufacturing technologies and/or tolerances. Therefore, the disclosed embodiments are not limited to those shown in the views, but include modifications in configuration formed on the basis of manufacturing processes. Therefore, regions exemplified in figures may have schematic properties, and shapes of regions shown in figures may exemplify specific shapes of regions of elements to which aspects of the invention are not limited.

Spatially relative terms, such as "beneath," "below," "lower," "above," "upper" and the like, may be used herein for ease of description to describe one element's or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the term "below" can encompass both an orientation of above and below. The device may be otherwise oriented (rotated 90 degrees or at other orientations) and the spatially relative descriptors used herein interpreted accordingly.

Terms such as "same," "equal," "planar," or "coplanar," as used herein when referring to orientation, layout, location, position, shapes, sizes, amounts, or other measures do not necessarily mean an exactly identical orientation, layout, location, position, shape, size, amount, or other measure, but are intended to encompass nearly identical orientation, layout, location, position, shapes, sizes, amounts, or other measures within acceptable variations that may occur, for example, due to manufacturing processes. The term "substantially" may be used herein to emphasize this meaning, unless the context or other statements indicate otherwise. For example, items described as "substantially the same," "substantially equal," or "substantially planar," may be exactly the same, equal, or planar, or may be the same, equal, or planar within acceptable variations that may occur, for example, due to manufacturing processes.

Terms such as "about" or "approximately" may reflect sizes, orientations, or layouts that vary only in a small relative manner, and/or in a way that does not significantly alter the operation, functionality, or structure of certain elements. For example, a range from "about 0.1 to about 1" may encompass a range such as a 0%-5% deviation around 0.1 and a 0% to 5% deviation around 1, especially if such deviation maintains the same effect as the listed range.

Unless otherwise defined, all terms (including technical and scientific terms) used herein have the same meaning as commonly understood by one of ordinary skill in the art to which the present invention belongs. It will be further understood that terms, such as those defined in commonly used dictionaries, should be interpreted as having a meaning that is consistent with their meaning in the context of the relevant art and the present application, and will not be interpreted in an idealized or overly formal sense unless expressly so defined herein.

Referring to FIGS. 1A to 1G, FIG. 1A is a schematic structural view of another embodiment of an LED filament of the present invention. As shown in FIG. 1A, the LED filament 400 has a light conversion layer 420, LED sections 402, 404, conductive electrodes 410, 412, and a conductive section 430 for electrically connecting adjacent two LED sections 402, 404. Each of the LED sections 402, 404 includes at least two LED chips 442 that are electrically connected to each other by the wires 440. In the present embodiment, the conductive section 430 includes at least one conductor 430a that connects the adjacent LED sections 402, 404, wherein the shortest distance between the two LED chips 442 respectively located in the two adjacent LED sections 402, 404 is greater than the distance between two adjacent LED chips 442 within the one LED section 402/404. Therefore, it is ensured that when the two LED sections 402, 404 are bent, the conductive section 430 is not easily broken due to the stress of bending. The length of the wire 440 is less than the length of the conductor 430a. The light conversion layer 420 is coated on at least two sides of the LED chip 442 and conductive electrodes 410, 412, and a portion of each of the conductive electrodes 410, 412 is not coated with the light conversion layer 420. The light conversion layer 420 may have at least one top layer 420a (or upper layer) and one base layer 420b (or lower layer). In the present embodiment, the top layer 420a and the base layer 420b are disposed on the opposing surface of the LED chip 442 and conductive electrodes 410, 412, and a portion of each of the conductive electrodes 410, 412 is excluded. It should be particularly noted that the thickness, diameter or width of the top layer 420a in the LED sections 402, 404 or the conductive section 430 described pertaining to FIGS. 1A-1M refers to the radial direction of the LED filament. The thickness of the top layer 420a is the distance between its outer surface to the interface of the top layer 420a and the base layer 420b, or the distance from its outer surface and the interface of the LED chip 442 or the conductor 430a and the base layer 420b, wherein the outer surface of the top layer 420a is a surface away from the base layer.

In the present embodiment, the top layer 420a and the base layer 420b may be composed of different particles or particle densities according to the requirements or designed structures. For example, in the case where the main emitting surface of the LED chip 442 is toward to the top layer 420a but not the base layer 420b, the base layer 420b may be composed of light scattering particles to increase the light dispersion. Thereby the brightness of the base layer 420b can be maximized, or even the brightness that can be produced close to the top layer 420a. In addition, the base layer 420b may also be composed of phosphor particles with high density to increase the hardness of the base layer 420b. In the manufacturing process of the LED filament 400, the base layer 420b may be prepared first, and then the LED chip 442, the wire 440 and the conductor 430a are disposed on the base layer 420b. Since the base layer 420b has a hardness that can support the subsequent manufacturing process of the LED chips and the wires, therefore the yield and the firmness of the LED chips 442, the wires 440, and the conductors 430a disposed on the base layer 420b can be improved and resulted in less or even no sink or skew. Finally, the top layer 420a is overlaid on the base layer 420b, the LED chip 442, the wires 440, and the conductor 430a.

Figure 1B:
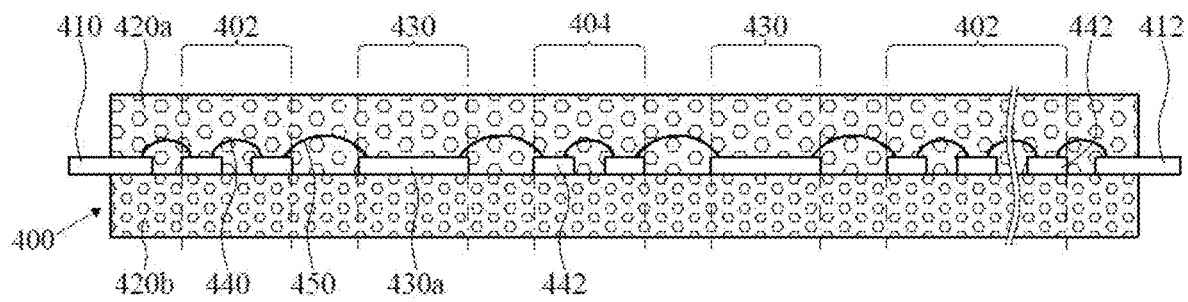
FIGS. 1B to 1J are cross sectional views of various LED filaments in accordance with the present invention.

As shown in FIG. 1B, in the present embodiment, the conductive section 430 is also located between the two adjacent LED sections 402, 404, and the plurality of LED chips 442 in the LED sections 402, 404 are electrically connected to each other through the wires 440. However, the conductor 430a in the conductive section 430 in FIG. 1B is not in the form of a wire but in a sheet or film form. In some embodiments, the conductor 430a can be a copper foil, a gold foil, or other materials that can conduct electrical conduction. In the present embodiment, the conductor 430a is attached to the surface of the base layer 420b and contact with the top layer 420a, that is, located between the base layer 420b and the top layer 420a. Moreover, the conductive section 430 and the LED sections 402, 404 are electrically connected by wires 450, that is, the two closest LED chips 442 respectively located in the adjacent two LED sections 402, 404 are electrically connected by the wires 450 and the conductors 430a of the conductive section 430. Wherein, the length of the conductive section 430 is greater than the distance between two adjacent LED chips of one LED sections 402, 404, and the length of the wire 440 in the LED sections 402, 404 is less than the length of the conductor 430a. This design ensures that the conductive section 430 has good bendability. Assuming that the maximum thickness of the LED chip in the radial direction of the filament is H, the thickness of the conductive electrode and the conductor 430a in the radial direction of the filament is around 0.5H to 1.4H, preferably around 0.5H to 0.7H. This ensures the wire bonding process can be carried out while ensures the quality of the LED filament and the precision of the wire bonding process, thereby the LED filament has good strength and the stability of the product is improved.

Figure 1C:
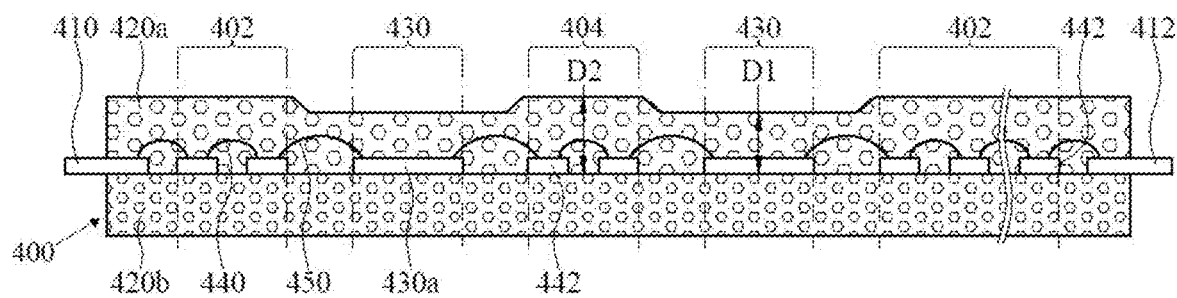

As shown in FIG. 1C, in the present embodiment, the LED sections 402, 404 and the conductive section 430 of the LED filament have different structural features. In the present embodiment, the LED sections 402, 404 and the conductive section 430 have different widths, thicknesses, or diameters in the radial direction of the LED filaments. As shown in FIG. 1C, the conductive section 430 is relatively thinner compared to the LED sections 402, 404, therefore it is helpful to the LED filament curling to various curves. In the present embodiment, the base layer 420b is substantially uniform in width, thickness or diameter in the radial direction of the LED filament, whether in the LED sections 402, 404 or in the conductive section 430. And, the top layer 420a has different widths, thicknesses or diameters in the radial direction of the LED filaments for the LED section 402, 404 and the conductive section 430. As shown in FIG. 1C, the top layer 420a of the LED sections 402, 404 has a maximum diameter D2 in the radial direction of the LED filament, while the top layer 420a of the conductive section 430 has the largest diameter D1 in the radial direction of the LED filament, D2 will be greater than D1. The diameter of the top layer 420a is gradually reduced from the LED sections 402, 404 toward to the conductive section 430, and is gradually increased from the conductive section 430 toward to adjacent LED sections 402, 404, so that the top layer 420a is conformally covered the LED filament and forms a smooth concave-convex curve along the axial direction of the LED filament.

Figure 1D:
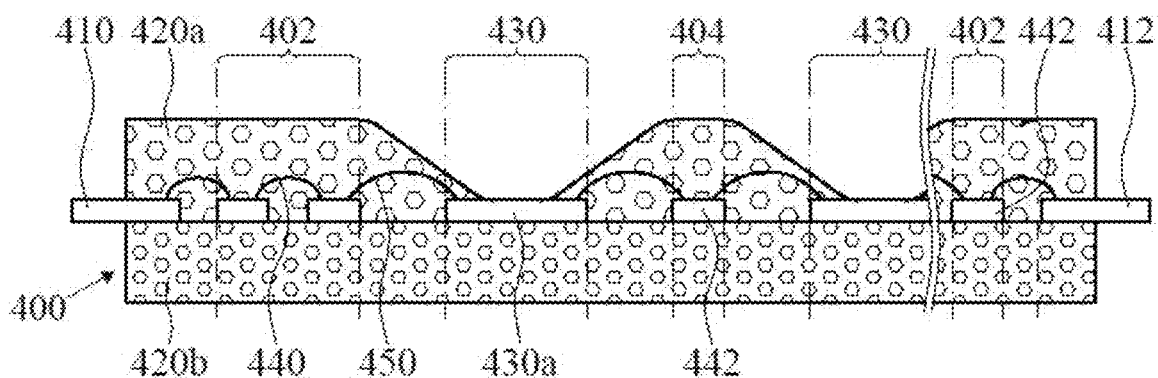

As shown in FIG. 1D, in the present embodiment, the top layer 420a of the LED sections 402, 404 has the largest diameter (or maximum thickness) in the radial direction of the LED filament and the diameter of the top layer 420a is gradually reduced from the LED sections 402, 404 to the conductive section 430, and a portion of the conductor 430a (for example, the intermediate portion) is not covered by the top layer 420a. The base layer 420b, whether in the LED sections 402, 404 or in the conductive section 430, has substantially the same width, thickness or diameter in the radial direction of the LED filament. In the present embodiment, the number of LED chips 442 in each of the LED sections 402, 404 may be different. For example, some LED sections 402, 404 have only one LED chip 442, and some LED sections 402, 404 have two or more LED chips 442. In addition to the number of the LED chip 442 designing in each LED section 402, 402 is different, the types of the LED chip 442 may also be different. It is acceptable as well that the number of the LED chip 442 designing in each LED section 402, 402 is consistent, and the types of the LED chip 442 is different.

Figure 1E:
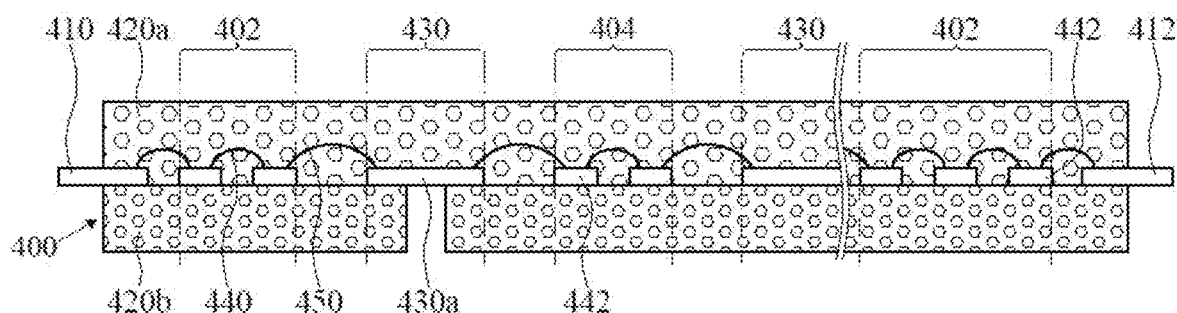

As shown in FIG. 1E, in the present embodiment, the top layer 420a is substantially uniform in width, thickness or diameter in the radial direction of the LED filament, whether in the LED sections 402, 404 or in the conductive section 430. A portion of the base layer 420b has been recessed or hollowed out corresponding to a portion of at least one conductor 430a, for example, the intermediate portion of the at least one conductor 430a is not covered by the base layer 420b, and at least one of the other conductors 430a is completely covered by the base layer 420b.

Figure 1F:
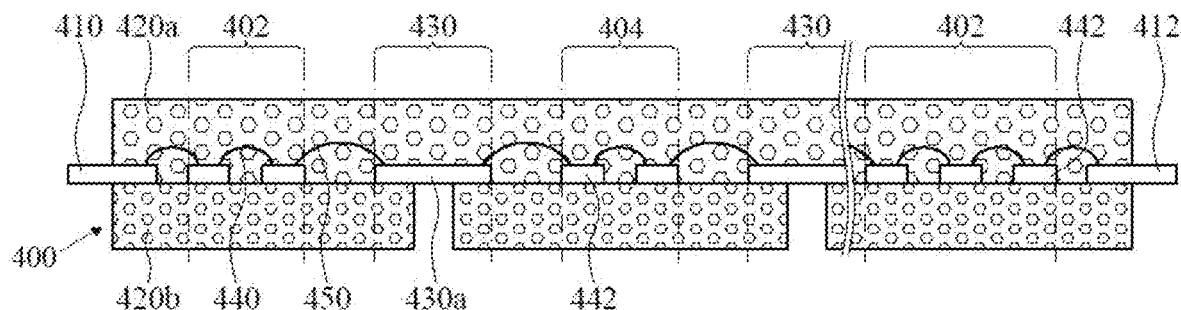

As shown in FIG. 1F, in the present embodiment, the top layer 420a is substantially uniform in width, thickness or diameter in the radial direction of the LED filament, whether in the LED sections 402, 404 or in the conductive section 430. A portion of the base layer 420b has been recessed or hollowed out corresponding to a portion of each conductor 430a, for example, the intermediate portion of the conductor 430a is not covered by the base layer 420b.

Figure 1G:
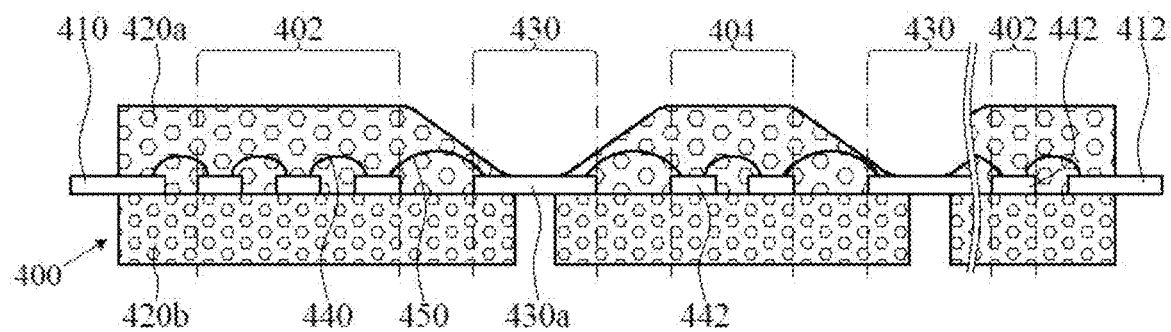

As shown in FIG. 1G, in the present embodiment, the top layer 420a of the LED sections 402, 404 has the largest diameter in the radial direction of the LED filament, and the diameter of the top layer 420a is gradually decreased from the LED sections 402, 404 to the conductive section 430. Moreover, a portion of the conductor 430a (for example, the middle portion) is not covered by the top layer 420a, and a portion of the base layer 420b is recessed or hollowed out such that a portion of the conductor 430a (for example, the intermediate portion) is not covered by the base layer 420b. In other words, at least a portion of the conductor 430a at the opposite sides thereof are not covered by the top layer 420a and the base layer 420b, respectively.

As described above with respect to the embodiments of FIGS. 1E to 1G, when the base layer 420b has a recession region or hollow region corresponding to a part of or all of the conductive sections 430, and the recession region or the hollow region may be in the form of a slit or a groove. Therefore, the conductor 430a is not completely exposed and the conductive section 430 can be provided with better bendability.

Figure 1H:
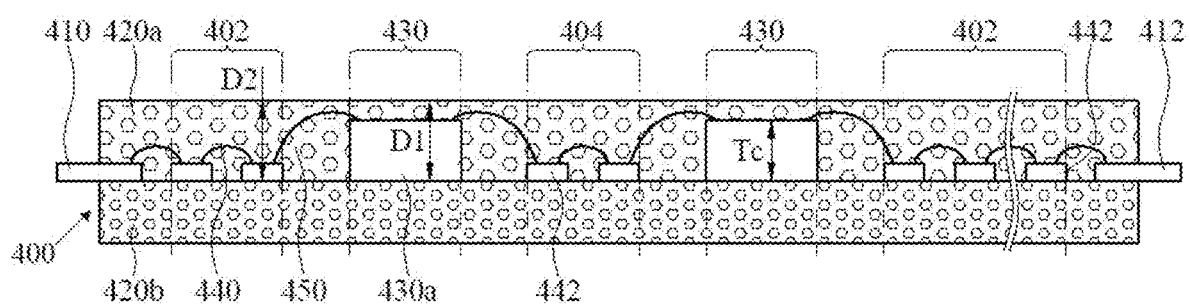

As shown in FIG. 1H, in the present embodiment, the conductor 430a is, for example, a conductive metal sheet or a metal strip. The conductor 430a has a thickness Tc, and since the thickness of the LED chip 442 is thinner than the conductor 430a, the thickness Tc of the conductor 430a is significantly greater than the thickness of the LED chip 442. In addition, with respect to the thickness of the LED chip 442, the thickness Tc of the conductor 430a is closer to the thickness of the top layer 420a at the conductive section 430, for example, Tc=(0.7~0.9)×D1, preferably Tc=(0.7~0.8)× D1. In the meanwhile, the thickness of the top layer 420a in the conductive section 430 can refer to the diameter D1 in the radial direction of the aforementioned top layer 420a. Furthermore, in the present embodiment, the thickness of the top layer 420a disposed on the LED sections 402, 404 and on the conductive section 430 is substantially consistent with the same. In the meanwhile, the thickness of the top layer 420a in the LED sections 402, 404 can be referred to the diameter D2 in the radial direction of the aforementioned top layer 420a.

Figure 1I:
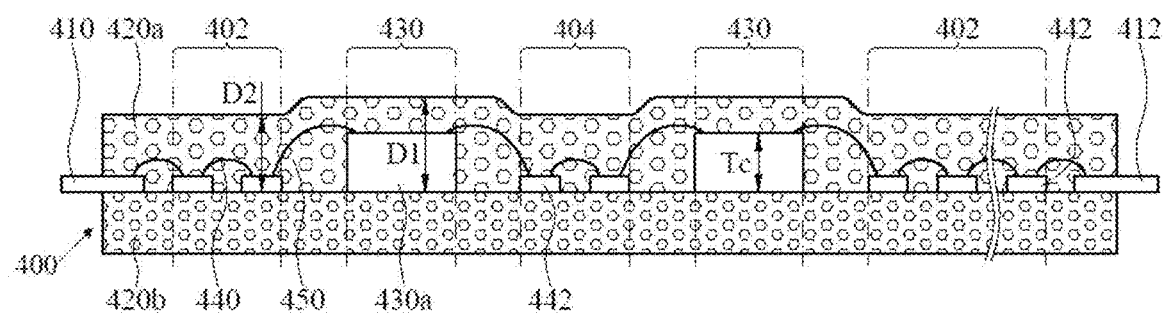

As shown in FIG. 1I, in the present embodiment, the thickness Tc of the conductor 430a is also significantly greater than the thickness of the LED chip 442, and the thickness Tc of the conductor 430a is closer to the thickness of the top layer 420a on the conductive section 430 (diameter D1). Also, in the present embodiment, the thickness of the top layer 420a in the conductive section 430 and that in the LED sections 402, 404 are inconsistent. As shown in FIG. 1I, the top layer 420a of the LED sections 402, 404 has a minimum diameter D2 in the radial direction of the LED filament, while the top layer 420a of the conductive section 430 has the largest diameter D1 in the radial direction of the LED filament, D1 will be greater than D2. The diameter of the top layer 420a is gradually increased from the LED sections 402, 404 to the conductive section 430, and is gradually reduced from the conductive section 430 to the LED sections 402, 404, so that the top layer 420a forms a smooth concave-convex curve along the axial direction of the LED filament.

Figure 1J:
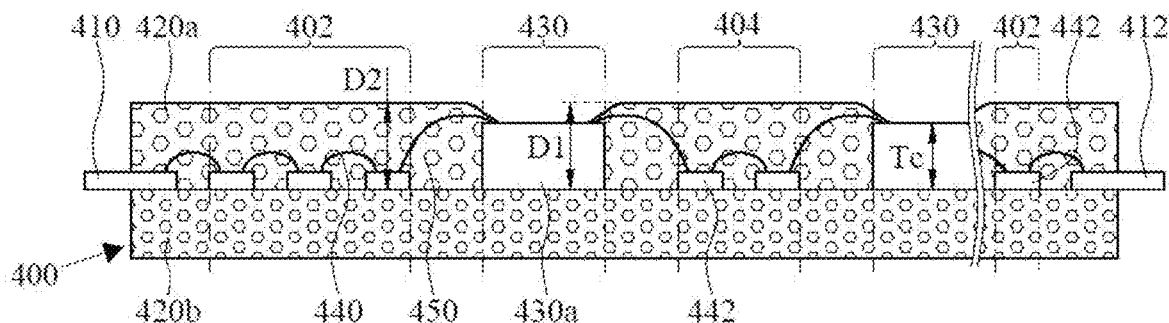

As shown in FIG. 1J, in the present embodiment, the thickness Tc of the conductor 430a is also significantly greater than the thickness of the LED chip 442, however, the top layer 420a of the LED sections 402, 404 has the largest diameter in the radial direction of the LED filament. The diameter of the top layer 420a is gradually reduced from the LED sections 402, 404 to the conductive section 430, and a portion of the conductor 430a, for example the intermediate portion, is not covered by the top layer 420a.

Figure 1K:
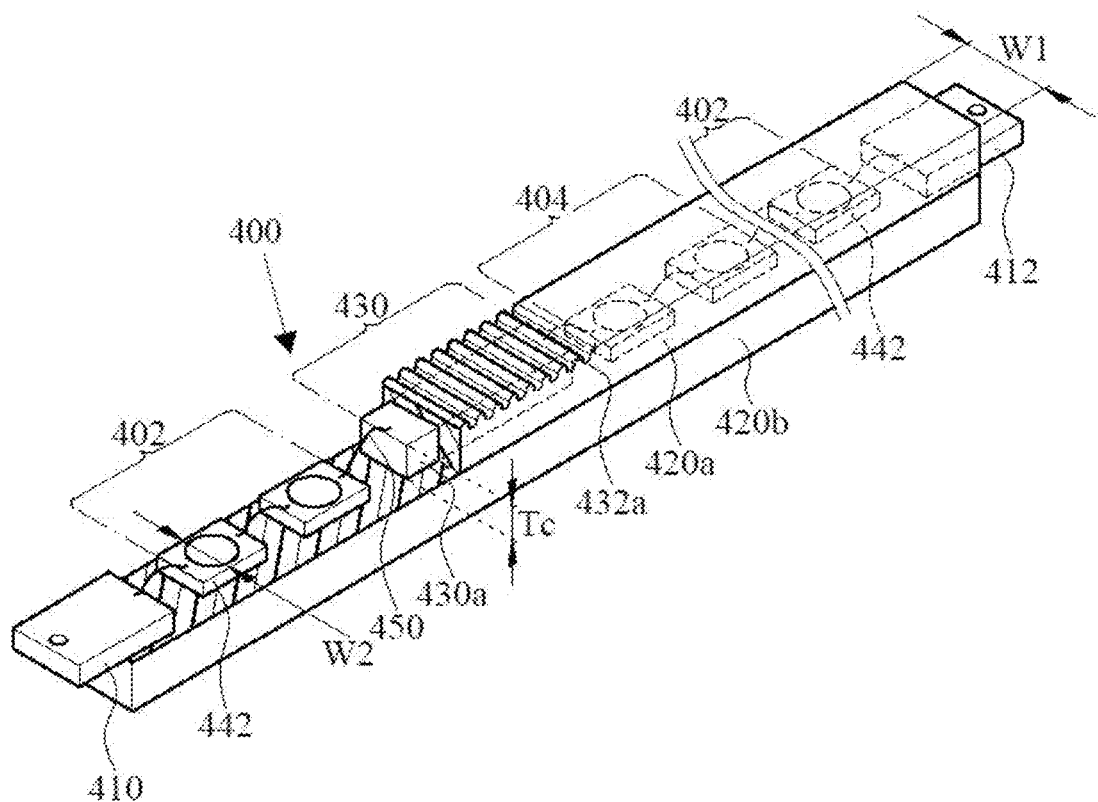
FIGS. 1K and 1L are perspective views of various LED filaments in accordance with the present invention.

As shown in FIG. 1K, in the present embodiment, the thickness of the conductor 430a is also significantly larger than the thickness of the LED chip 442. Besides, compared with the thickness of the LED chip 442, the thickness of the conductor 430a is closer to the thickness of the top layer 420a corresponding to the conductive section 430. In the width direction of the LED filament, the top layer 420a has a width W1, and the LED chip 442 has a width W2, and the width W2 of the LED chip 442 is close to the width W1 of the top layer 420a, wherein the width direction is perpendicular to both the axial direction and the aforementioned thickness direction. That is, the top layer 420a is slightly larger than the LED chip 442 in the width direction and slightly larger than the conductor 430a in the thickness direction. In other embodiments, the ratio of the width W1 of the top layer 420a to the width W2 of the LED chip 442 is around 2 to 5, i.e., W1:W2=2~5:1. In the present embodiment, the base layer 420b has the same width W1 as the top layer 420a, but is not limited thereto. In addition, as shown in FIG. 1K, in the present embodiment, the conductive section 430 further includes a wavy concave structure 432a disposed on one side surface of the conductive section 430. In the present embodiment, the wavy concave structure 432a is recessed by the upper side surface of the top layer 420a of the conductive section 430. The plurality of wavy concave structures 432a are spaced apart in the axial direction and are parallel to each other to present a continuous wave shape. In some embodiments, the plurality of wavy concave structures 432a are continuously closely aligned along the axial direction. In some embodiments, the wavy concave structure 432a may also be disposed around the entire circumferential surface of the conductive section 430 centering on the axial direction of the LED filament. In some embodiments, the wavy concave structure 432a may also be replaced by a wavy convex structure. In some embodiments, the wavy concave structure and the wavy convex structure may be staggered together to form a wavy concave-convex structure.

Figure 1L:
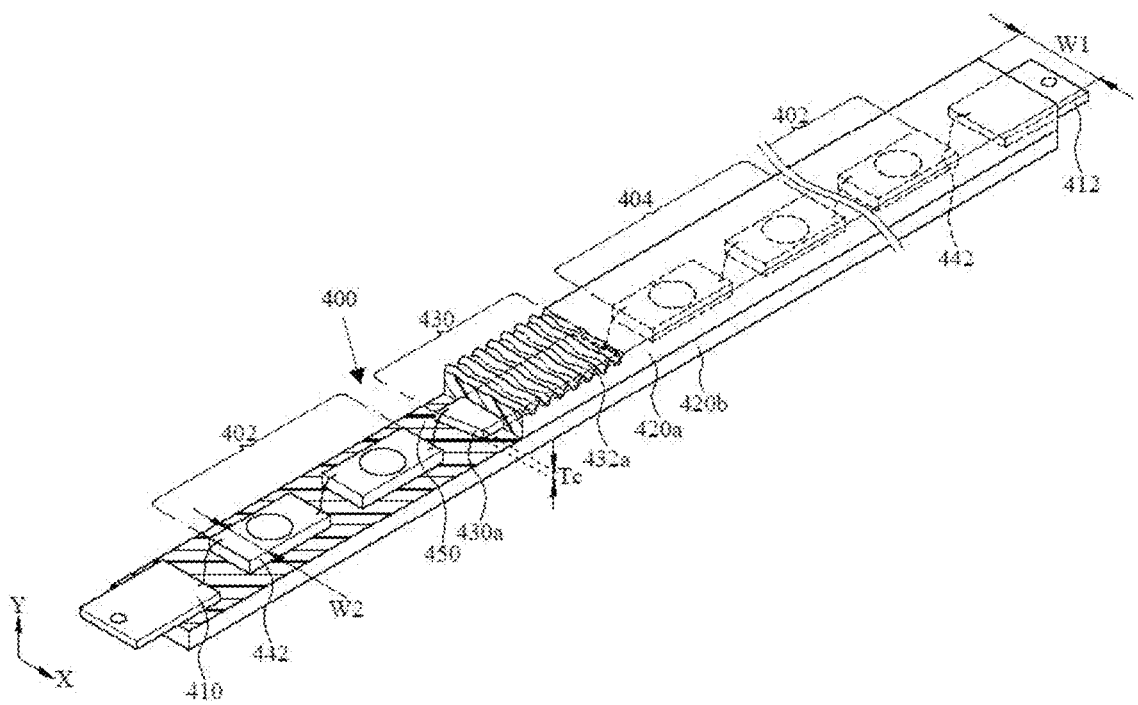

As shown in FIG. 1L, in the present embodiment, the LED chip 442 has a length in the axial direction of the LED filament and has a width in the X direction, and the ratio of the length to the width of the LED chip 442 is around 2:1 to 6:1. For example, in one embodiment, two LED chips are electrically connected as one LED chip unit, and the LED chip unit can have an aspect ratio of 6:1, which enables the LED filament to have a larger luminous flux. Moreover, the LED chip 442, the conductive electrodes 410, 412 and the conductor 430a have a thickness in the Y direction, the thickness of the conductive electrodes 410, 412 is smaller than the thickness of the LED chip 442, and the thickness Tc of the conductor 430a is also smaller than the thickness of the chip 442, that is, the conductor 430a and the conductive electrodes 410, 412 are thinner than the chip 442. Further, the top layer 420a and the base layer 420b have a thickness in the Y direction, and the thickness of the base layer 420b is smaller than the maximum thickness of the top layer 420a. In the present embodiment, the shape of the conductor 430a is a parallelogram rather than a rectangle in the top view along the Y direction, that is, the angle of the four sides of the conductor 430a is not 90 degrees presented in the top view. In addition, the two ends of the LED chip 442 are respectively connected to the wire 440 or the wire 450 and to be connected to the other chip 442 or the conductor 430a through the wire 440 or the wire 450. Furthermore, the connection points of the two ends of the LED chip 442 using to connect with the wire 440 or the wires 450 are not aligned with each other in the axial direction of the LED filaments.

For example, the connection point of one end of the chip 442 is offset toward the negative X direction, and the connection point of the other end of the chip 442 is offset toward the positive X direction, that is, there will be a distance between the two connection points of the two ends of the chip 442 in the X direction.

A wavy concave or convex structure 432a as shown in FIG. 1K, which is a wave shape showing depressions and ridges in the Y direction, and is kept linear perpendicularly to the axial direction of the LED filament in the top view. It is to be noted that each groove of the wavy concave structure 432a or each protrusion of convex structure 432a is a straight line perpendicularly arranged along the axial direction of the LED filament, or the line connecting the lowest point of each groove of the wavy concave structure 432a in the Y direction is a straight line or the line connecting the highest point of each protrusion of the convex structure 432a in the Y direction is a straight line. The wavy concave or convex structure 432a as shown in FIG. 1L is not only wavy in the Y direction but also curved in the axial direction of the LED filament in the top view, that is, each groove of the wavy concave structure 432a and each protrusion of convex structure 432a is separately curved in a straight line and the two straight lines are perpendicularly arranged along the axial direction of the LED filament. Moreover, a line connecting the lowest point of each groove of the wavy concave structure 432a in the Y direction or a line connecting the highest point of each protrusion of the convex structure 432a in the Y direction is in a curve.

Figure 1M:
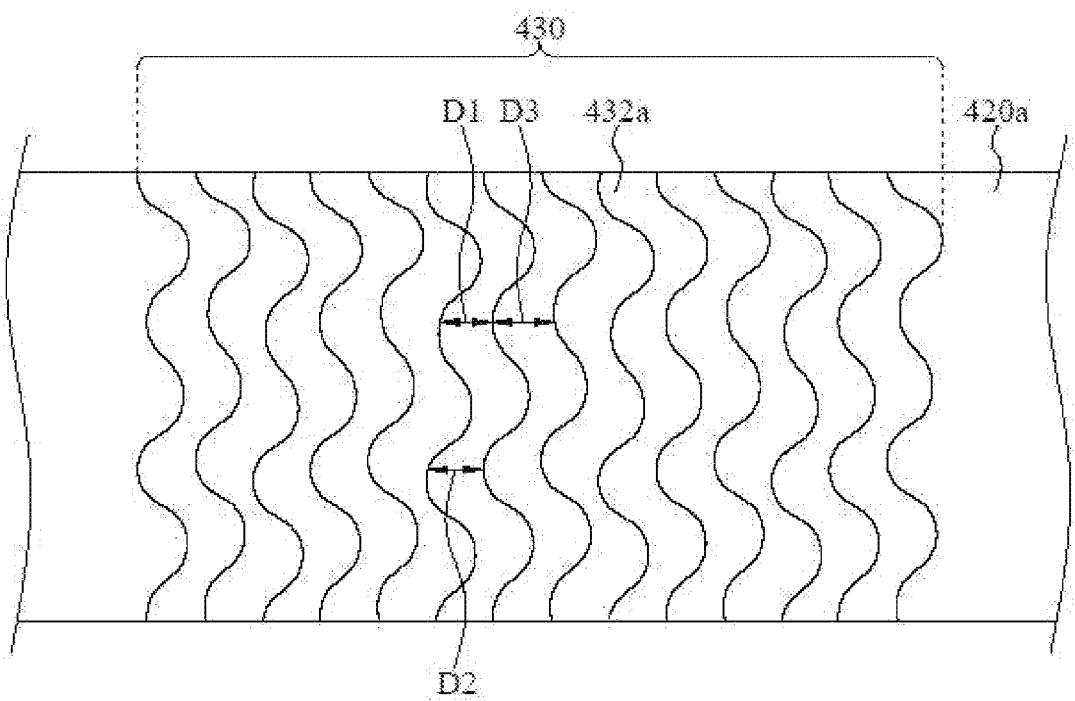
FIG. 1M illustrates a partial top view of FIG. 1L.

As shown in FIG. 1M, which is a partial top view of the conductive section 430 of FIG. 1L. FIG. 1M presents a wavy concave or convex structure 432a and FIG. 1L presents a curved configuration of the conductive section 430 in the axial direction of the LED filament. Moreover, in the present embodiment, the width of each groove of the wavy concave structure 432a itself in the axial direction of the LED filament is irregular, that is, the width of any two places of each groove is unequal. For example, two places of a certain groove of the wavy concave structure 432a in FIG. 1M have a width D1 and a width D2 respectively, and the width D1 and the width D2 are not equal. In addition, in the present embodiment, the width of each groove of the wavy concave structure 432a in the axial direction of the LED filament is also irregular. For example, each groove of the wavy concave structure 432a is aligned in parallel along the axial direction of the LED filament, however, the widths of each grooves are unequal. For example, two adjacent grooves of the wavy concave structures 432a in FIG. 1M have a width D1 and a width D3 at two positions aligned in the axial direction, and the width D1 and the width D3 are not equal. In other embodiments, the shape of the wavy concave or convex structure 432a is a straight strip or a combination of a straight strip and a wave from the top view of the conductive section. In other words, the surface of the top layer 420a at the conductive section 430 can be a straight line or a combination of a straight line and a wavy line in the side view.

Figure 2A:
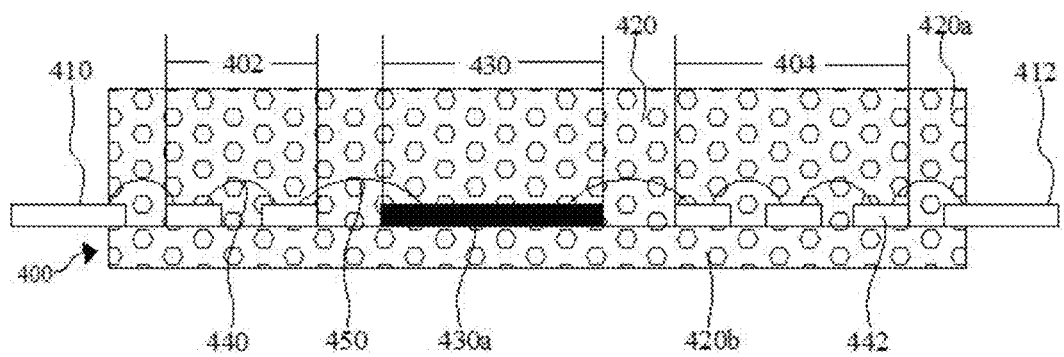
FIG. 2A is a cross sectional view of an LED filament in accordance with an embodiment of the present invention.

The connection mode between the conductor in the conductive section and the light conversion layer is described as follows. Referring to FIG. 2A, in the LED filament structure shown in FIG. 2A, the LED filament 400 has a light conversion layer 420, the LED sections 402, 404, the conductive electrodes 410, 412, and at least one conductive section 430. The conductive section 430 is located between adjacent LED sections 402 and 404. The LED sections 402 and 404 include at least two LED chips 442 electrically connected to each other through the wires 440. In the present embodiment, the conductive section 430 includes a conductor 430a. The conductive section 430 and the LED sections 402, 404 are electrically connected by wires 450, that is, two LED chips respectively located in the adjacent two LED sections 402, 404 and closest to the conductive section 430 are electrically connected to each other through the wires 450 connecting with the conductor 430a in the conductive section 430. The length of the conductive section 430 is greater than the distance between two adjacent LED chips in one single LED sections 402, 404, and the length of the wire 440 is less than the length of the conductor 430a. The light conversion layer 420 is disposed on at least one side of the LED chip 442 and the conductive electrode 410, 412, and a part of the two conductive electrodes is exposed from the light conversion layer. The light conversion layer 420 includes at least a top layer 420a and a base layer 420b. In the present embodiment, the LED sections 402, 404, the conductive electrodes 410, 412, and the conductive section 430 are all attached to the base layer 420b.

The conductor 430a can be a copper foil or other electrically conductive material. The upper surface of the conductor 430a may further have a silver plating layer, and subsequently, the LED chip 442 may be attached to the base layer 420b by means of die bond paste or the like. Thereafter, a phosphor glue or phosphor film is applied to coat over the LED chip 442, the wires 440, 450, and a portion of the conductive electrodes 410, 412 to form a light conversion layer 420. At least two of the six faces of the LED chip, generally five faces in the present embodiment, being covered by the phosphor glue. The wires 440, 450 may be gold wires. In the present embodiment, the combination of copper foil 460 and the gold wire 440 provides a solid conductive structure and also maintaining the flexibleness of the LED filament. Besides, the silver plating layer 461 has an effect of increasing light reflection in addition to good electrical conductivity.

Figure 2B:
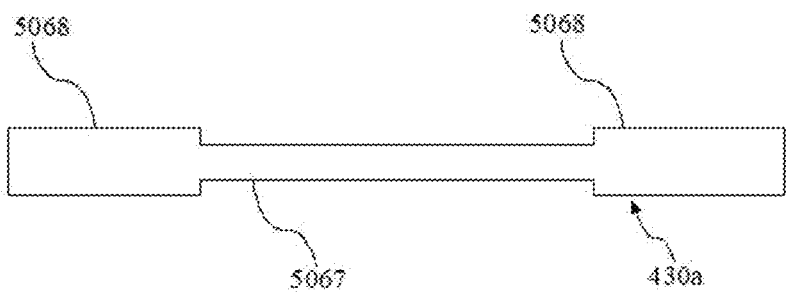
FIG. 2B is a top view of the conductor of an LED filament in accordance with an embodiment of the present invention.

In an embodiment, the shape of the conductor may also result from considering the gold wire connection or filament bending. For example, in one embodiment, a top view of conductor 430a is shown in FIG. 2B, the conductor 430a has a joint region 5068 and a transition region 5067. The joint region 5068 is at the end of the conductor 430a for being electrically connected with other components. In the present embodiment, the conductor 430a comprises two joint regions 5068, and the transition region 5067 is located between two joint regions 5068 and for connecting the two joint regions 5068. The width of the joint region 5068 may be greater than that of the transition region 5067. Since the joint region 5068 is used to serve as a pad for electrical contact, a relatively sufficient width is required. For example, if the width of the LED filament is W, the width of the joint region 5068 of the conductor 430a can be between around ¼W and W. The joint region 5068 can be multiple and the width thereof may be not consistent. Because the transition region 5067 between the joint regions 5068 is not required to form any joint point, the width can be less than that of the joint region 5068. For example, if the width of the LED filament is W, the width of the transition region 5067 can be between ⅒W and ⅕W, the conductor 430a is easy to be bent along with the bending of the filament due to the less width of the transition region 5067 of the conductor 430a; therefore, the risk that a wire close to the conductor may be easily broken by stress of bending is lower.

Figure 2C:
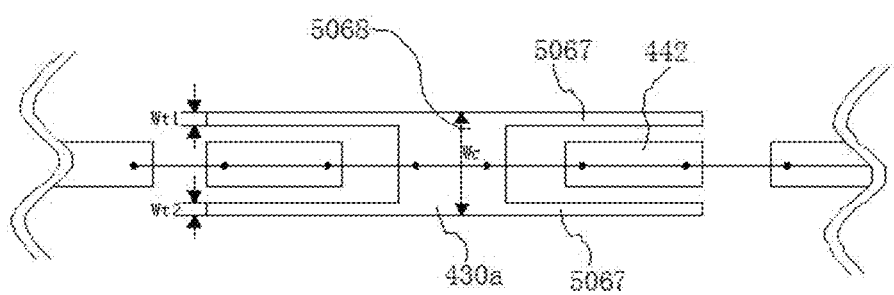
FIG. 2C is a top view of the conductor of an LED filament in accordance with an embodiment of the present invention.

In one embodiment, as shown in the top view of FIG. 2C, one of the LED chips 442 constituting an LED filament is connected to the conductor 430a via the wire 450, wherein the conductor 430a has two openings like notch or rabbet with the quadrilateral shape symmetrically at the two terminals of the conductor 430a. Therefore, the LED chip disposed in the opening has three sides opposite to the part of the conductor 430a. Moreover, two terminals of the conductor 430a being defined as the transition region 5067 and the middle area between the terminals being defined as the joint region 5068 having a width Wc. Furthermore, each transition region 5067 of the conductor 430a is divided into two strips with the width Wt1 and Wt2 symmetrically aligned with the longitudinal centerline of the conductor 430a. Moreover, the sum of the widths of the two strips of the transition regions 5067, that is the width Wt1 and Wt2, is less than the width of the joint region 5068 Wc. As shown in FIG. 2C, the sum of the widths Wt1, Wt2 of the two strips of the transition regions 5067 is less than the width Wc of the joint region 5068 in the direction perpendicular to the longitudinal of the LED filament, which can increase the mechanical strength between the conductor and the LED chip 442 of the LED filament and also to avoid the damage of the wires 450 connecting the LED chips and the conductors. In an embodiment, the length of the strip of the transition region may extend to the LED section adjacent to the conductive section in the longitudinal direction of the LED filament, thereby slow down the impact of the external force on the LED chip and improving product stability. In the present embodiment, the width Wc of the joint region 5068 is equal to the width of the base layer 420b or the width of the LED filament, and the side of the LED chip 442 disposed in the opening without opposing the conductor 430a is electrically connected to other LED chips through the wire 440. The length of the wire 450 between the LED chip 442 and the conductor 430a is shorter than the distance between any two LED chips in the LED section. For example, the length of the wire between the LED chip 442 and the conductor 430a is shorter than the distance between two adjacent LED chips in the LED section. As a result, the risk of the LED filaments being broken caused by the elastic setback stress is also lower.

Figure 2D:
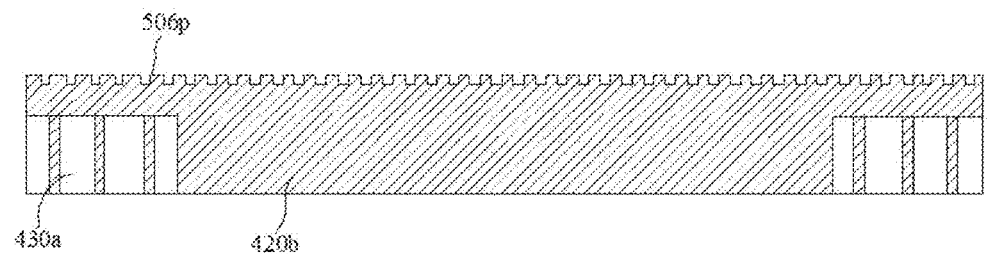
FIG. 2D is a cross sectional view of the conductor of an LED filament in accordance with an embodiment of the present invention.
Figure 2E:
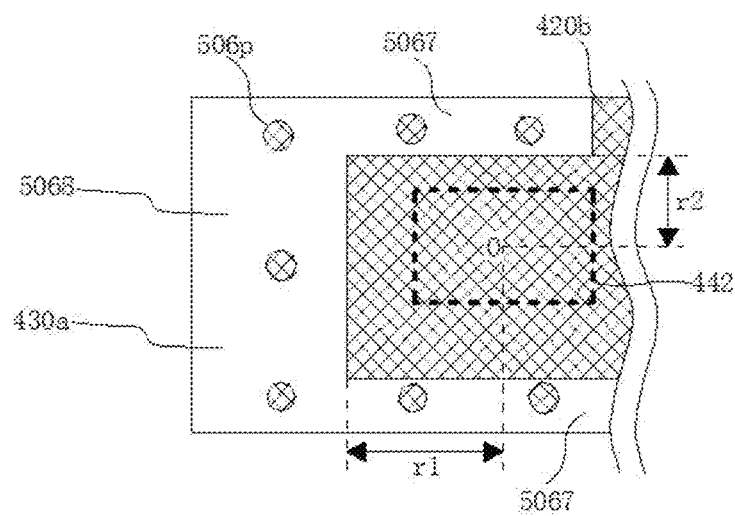
FIGS. 2E to 2I are bottom views of various designs of the conductor of an LED filament in accordance with the present invention.

In one embodiment, the conductor 430a in the LED filament has a contour consisting of a joint region 5068 and four strip shaped transition regions 5067 as shown in FIG. 2C. Further, the conductor 430a can be illustrated with a left half portion and a right half portion symmetrically aligned with the short axis centerline thereof such as a left half portion or a right half portion of the bottom view shown in the FIG. 2E, FIG. 2G, FIG. 2H and FIG. 2I. In other embodiments, the conductor 430a may not have symmetric contour with respect to the short axis centerline thereof, and the transition region 5067 for connecting the joint regions 5068 may be any combination of the transition regions 5067 shown in FIG. 2E, FIG. 2F, and FIGS. 2G, 2H, and 2I. As shown in FIG. 2J, the conductor 430a has at least one through hole 506p, and also referring to FIG. 2D and FIG. 2E. FIG. 2D is a cross sectional view of the conductor 430a and the FIG. 2E is a bottom view shown a left half portion or a right half portion of the conductor 430a in the FIG. 2D. Wherein the base layer 420b, for example the phosphor film, infiltrates the hole 506p from one end, and optionally selected to fill up to the other end of the hole 506p. The phosphor film shown in FIG. 2D is not filled to overflow the through hole. Moreover, in the present embodiment, the upward surface of FIG. 2D is roughened so that the surface thereof has better thermal dissipation capability. In other embodiments, the conductor 430a may be located between the top layer 420a and the base layer 420b as shown in FIG. 2L, the base layer 420b has a beveled groove, and the through hole size of the conductor 430a is smaller than the maximum size of the bevel groove of the base layer 420b. Therefore, when the phosphor film, that is, the material of the top layer 420a, overlies the conductor 430a and fills the through hole, the phosphor film in the bevel groove partially contacts the area under the conductor 430a. As shown in FIG. 2L, FIG. 2L is a cross sectional view taken along the line E1-E2 of FIG. 2K. The phosphor glue used to form the top layer 420a is filled into the through hole 506p of the conductor 430a and then further filled into the beveled groove of the base layer 420a. In another embodiment, as shown in FIG. 2M, the phosphor film used to form the base layer 420b is filled into the through hole 506p of the conductor 430a and then further filled till contacting the surface of the top layer 420a. As shown in FIG. 2L and FIG. 2M, since the conductor 430a is similarly riveted by the top layer 420a or the base layer 420b in the axial direction of the LED filament, the contact area between the conductor 430a and the top layer 420a or the base layer 420b is increased. The increase in the contact area that increases the bonding strength between the conductor 430a and the top layer 420a or the base layer 420b, and the bendability of the conductive section is thereby improved.

Figure 2F:
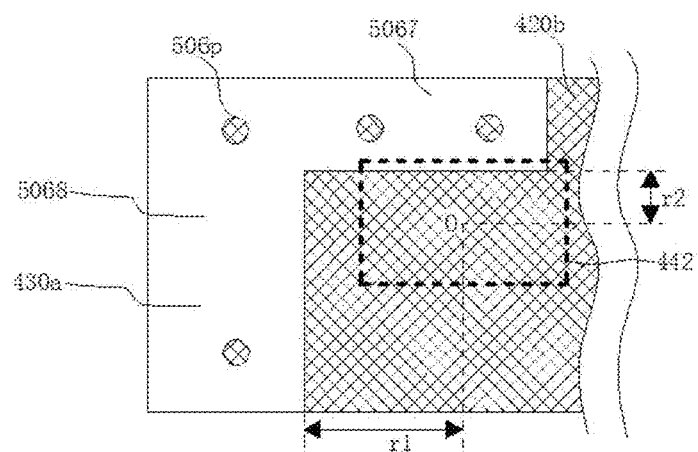

FIGS. 2F, 2G, 2H and 2I are embodiments of the conductors 430a having through holes. The FIG. 2F is a partial bottom view of an LED filament of an embodiment in which the conductor 430a has only one transition regions 5067 connected to the joint region 5068, whether the transition region 5067 or the joint region 5068 has a rectangular shape. The FIG. 2F is a bottom view showing only a left half portion or a right half portion of the conductor 430a symmetrically aligned with the short axis centerline thereof, and it is arranged with one strip shaped transition region 5067 connected to the joint region 5068. When the left half portion is combined with the right half portion, the contour of the conductor 430a may be any combination of the transition regions 5067 and the joint regions 5068 shown in FIGS. 2E, 2F, 2G, 2H, and 2I. Taking the central point of the LED chip 442 as the center, the shortest distance from the center to the closest boundary of the joint region is set to r1, and the shortest distance from the center to the closest boundary of the transition region is set to r2. When the distance r1 is greater than or equal to the distance r2, the broken risk of the LED filament caused by the elastic frustration stress can be reduced. The FIG. 2F shows the case where r1 is greater than r2. In the case where the conductor 430a is enclosed by the base layer 420b, for example a phosphor film, referring to schematic diagram of FIG. 2F, the location of the chip 442 is present with the dotted line due to the chip 442 is blocked by the base layer 420b. From the bottom view, it is seen that the LED chip 442 overlaps the portion of the transition region 5067. In other embodiments, the LED chip 442 does not overlap the portion of the transition region 5067 in a bottom view. In other embodiments, the conductor comprises one joint region and two transition regions, one transition region 5067 can be connected to the middle of the joint region 5068, and another transition region can be connected to the middle or one end of the joint region 5068, alternatively, another transition region 5067 can also be connected to the joint region 5068 any position between the ends and the middle of the joint region 5068. When another transition region 5067 is connected to the middle joint region 5068, the transition region 5067 and the joint region 5068 form a shape like a cross in the bottom view.

Figure 2G:
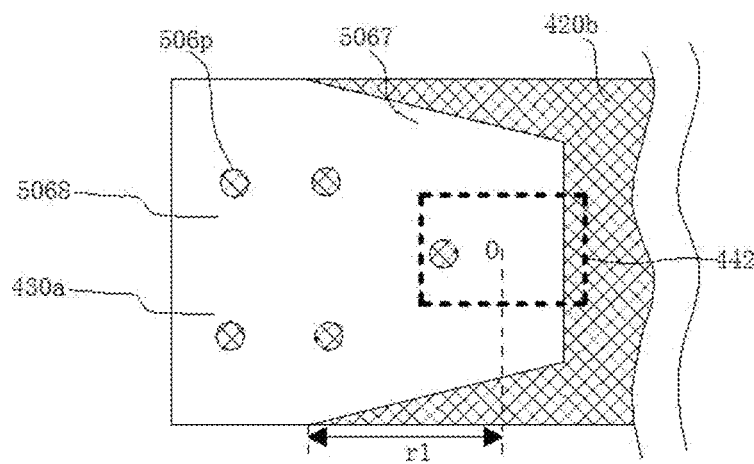

The difference between embodiments showing in the FIG. 2G and FIG. 2E is the conductor 430a in the embodiment of FIG. 2G having simply two transition regions, each transition region 5067 of the conductor 430a having two symmetrical contours symmetrically arranged about the longitudinal axis of the LED filament and a portion of the contour is in contact with the joint region 5068. For example, each transition region 5067 of the conductor 430a is in a shape of trapezoid extending from the boundary of the joint region 5068 and the shorter trapezoidal side away from the joint region 5068. In other words, in the bottom view, the transition region 5067 has a fixed end, that is the boundary of the joint region 5068 connecting with the transition region 5067, whose width is equal to the length of the long side of the trapezoid or the width of the joint region 5068 and the base layer 420b. In other embodiments, the transition region 5067 whose width is gradually reduced from the fixed end to the other end may also be in a shape of triangular or semicircular. The average width of the transition region 5067 is less than that of the joint region 5068. As shown in FIG. 2G, in the case where the embedded conductor 430a is enclosed by the base layer 420b (for example, a phosphor film), therefore the chip 442 is covered by the base layer 420b and from the bottom view the LED chip 442 illustrated by the dashed line is overlapped with the transition region 5067.

Figure 2H:
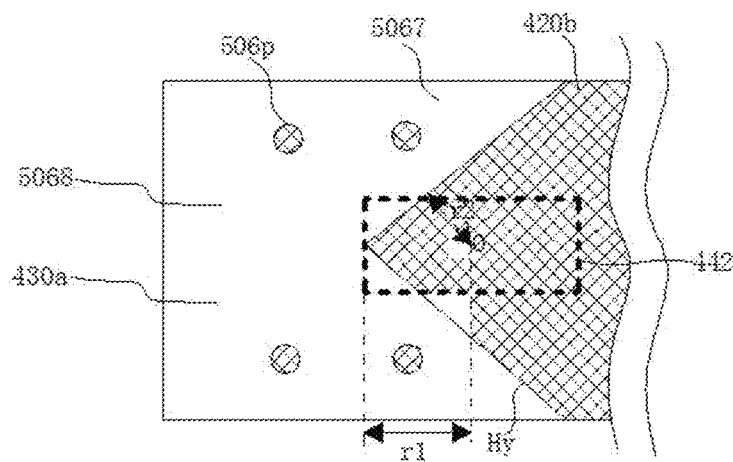

The difference between the FIG. 2H and FIG. 2F is the transition region 5067 of FIG. 2H having two triangles symmetrical about the longitudinal axis of the LED filament, one lateral of the triangle is aligned with the outer side of the LED filament, and the other lateral is connected with the joint region 5068, and the oblique lateral of the triangle has an end point intersecting with the joint region 5068 in the longitudinal axis of the LED filament. The triangle being symmetrical designed in the transition region 5067 may be an equilateral triangle, an acute triangle, or an obtuse triangle, etc. In the present embodiment, the two oblique laterals of the two symmetrically triangles are intersected, but are not limited thereto. The distance between two oblique laterals in parallel with the short axial direction of the LED filament will gradually increase along the distance move away from a fixed end to the other end, that is, the two oblique laterals respectively intersecting with the opposite sides of the base layer 420b at the other end. Wherein the fixed end is the boundary of the joint region 5068 connecting with the transition region 5067.

Figure 2I:
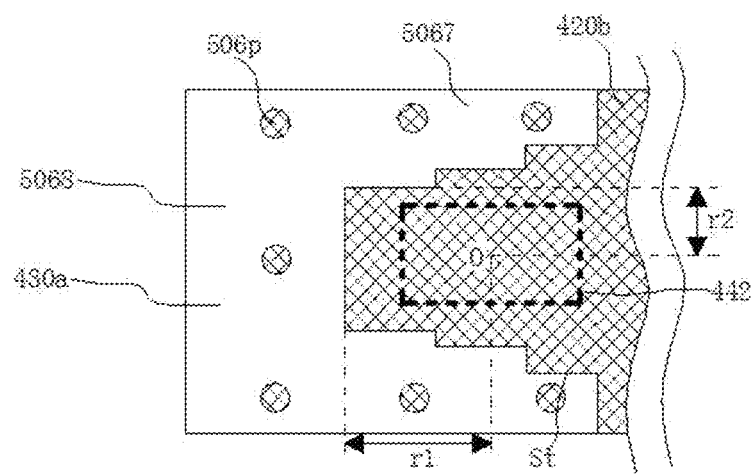
Figure 2J:
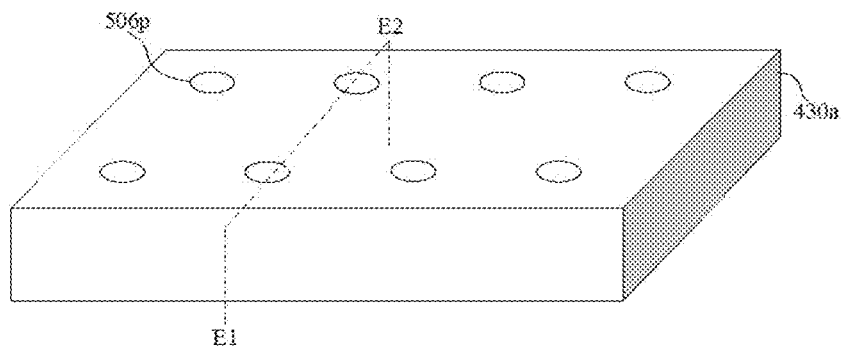
Figure 2K:
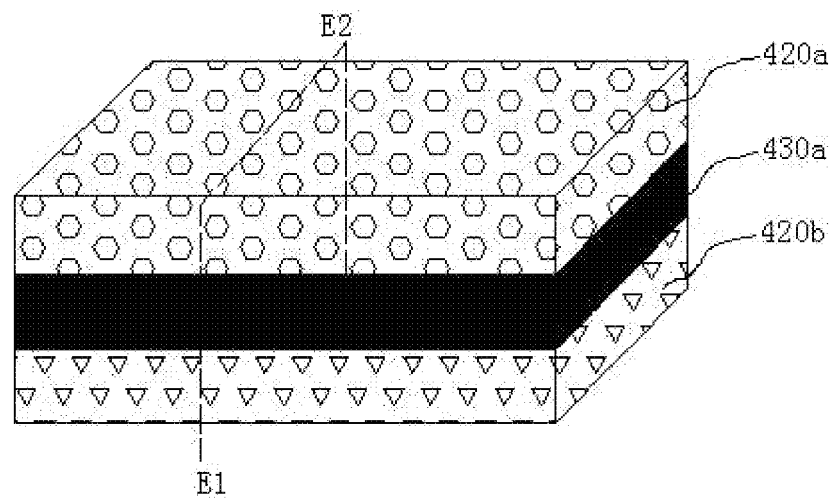
Figure 2L:
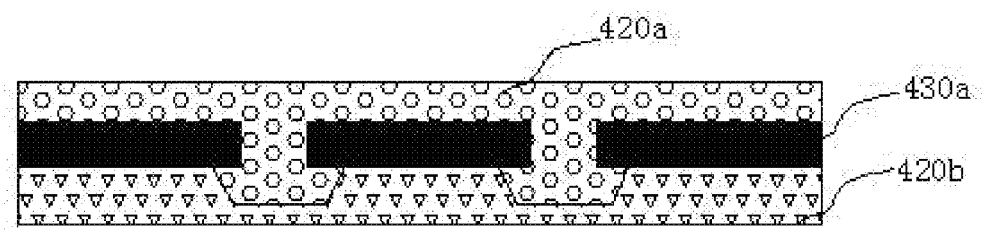
Figure 2M:
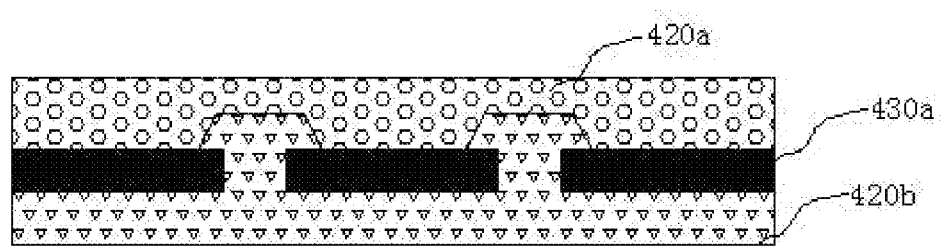

The embodiment of FIG. 2I is similar to FIG. 2H, the difference is the oblique lateral of the triangle of the transition region 5067 in FIG. 2I is not a straight line but a stepped shape. In other embodiments, the oblique lateral of the triangle of the transition region 5067 can be in the shape of curved, arched, or wavy. And all the structures described based on FIG. 2C to FIG. 2I also are able to be applied to the structure of electrode 410, 412.

Figure 2N:
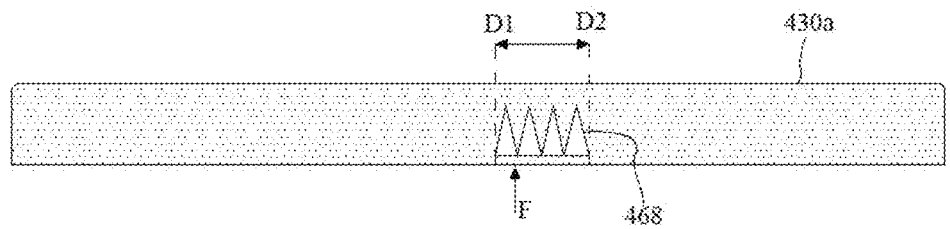
FIG. 2N is a cross sectional view of the conductor of an LED filament in accordance with an embodiment of the present invention.

Since the LED filament is placed inside the LED light bulb with undulating posture, the bending portion with a small radian may be weakened by the thermal stress due to thermal expansion caused by the heat generating from the LED light bulb. Therefore, the holes or notches can be appropriately placed in the LED filament near the bending portion to mitigate this effect. In one embodiment, as shown in schematic diagram FIG. 2N which the LED chip and the conductive electrode of the LED filament are omitted, the region between the D1 to D2 is a predetermined bending portion. The conductor 430a is provided with a plurality of holes. Preferably, the size of the holes 468 are gradually increased from outer bending portion (showing as upper in the figure) to the inner thereof (showing as), and the hole 468 is triangular in the cross sectional view of the present embodiment. When the LED filament is bent upward by the F direction, the LED filament is easier to bent due to the plurality of holes 468 between the region from D1 to D2, and the hole 468 at the bending portion can buffer the thermal stress. Moreover, the deformation of the LED filament is followed the designed hole shape and the bending angle.

Figure 2O:
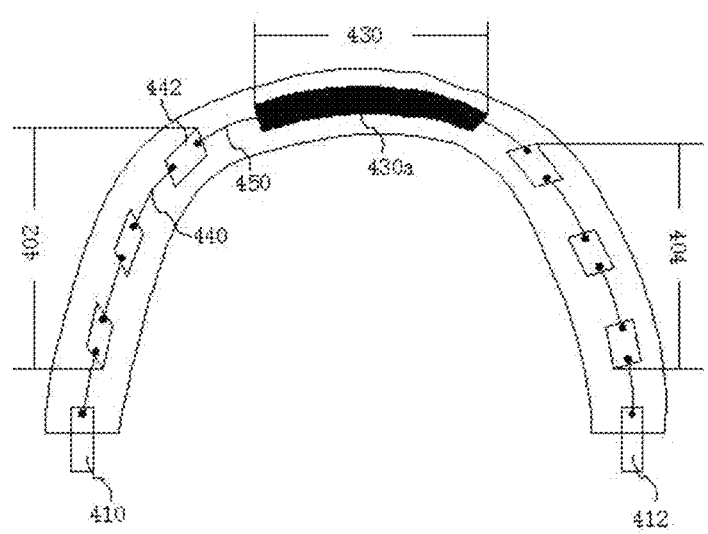
FIG. 2O is a schematic view showing the bent state of the LED filament of FIG. 2A in accordance with an embodiment of the present invention.

FIG. 2O is a bending form of the LED filament shown in FIG. 2A of the present invention. In the related art, a plurality of LED filaments are generally connected by the conductive electrode to realize the requirement of curling the LED filament. Since bending occurs at the conductive electrode, the strength of the electrode is weakened and the electrode can be broken easily, further, the conductive electrode takes up some space to make the light emitting area of the LED filament smaller. In the present invention, the conductive section 430 is a bent portion of the LED filament, and the rivet structure and the conductor reinforcement are formed by the conductor 430a shown in FIGS. 2C to 2M, so that the wire 450 connecting the LED chip 442 and the conductor 430a is less likely to be broken. In various embodiments, the conductors may be arranged in a configuration as shown in FIG. 2B or provided with an accommodating space on the conductor 430a (e.g., the hole structure shown in FIG. 2N) to reduce the probability of the LED filament cracking during bending. The LED filament of the invention has the advantages of good bendability and high luminous efficiency.

Figure 3:
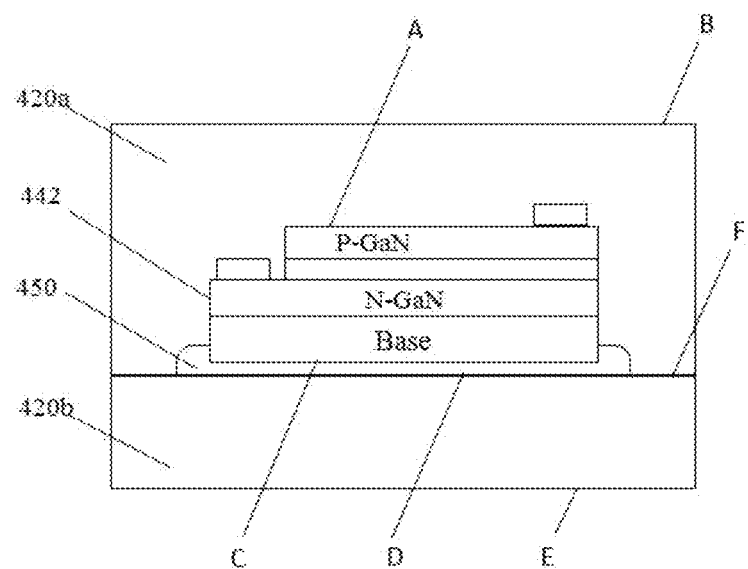
FIG. 3 is a schematic view showing the interfaces passing through by the light emitted by the LED chip in accordance with the present invention.

When the LED filament is illuminated in an LED light bulb encapsulation with the inert gas, as shown in FIG. 3, the light emitted by the LED chip 442 passes through the interfaces A, B, C, D, E and F respectively, wherein the interface A is the interface between the p-GaN gate and the top layer 420a in the LED chip 442. The interface B is the interface between the top layer 420a and the inert gas, interface C is the interface between the substrate and the paste 450 (e.g., die bond paste) in the LED chip 442, the D interface is the interface between the paste 450 and the base layer 420b, the interface E is the interface between the base layer 420b and the inert gas, and the interface F is the interface between the base layer 420b and the top layer 420a. When light passes through the interfaces A, B, C, D, E and F respectively, the refractive index of the two substances in any interface is n1 and n2 respectively, then |n1−n2|<1.0, preferably |n1−n2|<0.5, more preferably |n1−n2|<0.2. In one embodiment, the refractive index of two substances in any one of the four interfaces of B, E, D and F is n1 and n2 respectively, and then |n1−n2|<1.0, preferably |n1−n2|<0.5, More preferably |n1−n2|<0.2. In one embodiment, the refractive index of two substances in any interface of D and F two interfaces is n1 and n2 respectively, then |n1−n2|<1.0, preferably |n1−n2|<0.5, preferably |n1−n2|<0.2. The absolute value of the difference in refractive index of the two substances in each interface is smaller, the light emitting efficiency is higher. For example, when the light emitted by the LED chip 442 passes from the base layer 420b to the top layer 420a, the incident angle is θ1, the refraction angle is θ2, and the refractive index of the base layer 420b is n1, and the refractive index of the top layer 420a is n2, according to the equation sin θ1/sin θ2=n2/n1, when the absolute value of the difference between n1 and n2 is smaller, the incident angle closer to the refraction angle, and then the light-emitting efficiency of the LED filament is higher.

The next part will describe the material of the filament of the present invention. The material suitable for manufacturing a filament substrate or a light-conversion layer for LED should have properties such as excellent light transmission, good heat resistance, excellent thermal conductivity, appropriate refraction rate, excellent mechanical properties and good warpage resistance. All the above properties can be achieved by adjusting the type and the content of the main material, the modifier and the additive contained in the organosilicon-modified polyimide composition. The present disclosure provides a filament substrate or a light-conversion layer formed from a composition comprising an organosilicon-modified polyimide. The composition can meet the requirements on the above properties. In addition, the type and the content of one or more of the main material, the modifier (thermal curing agent) and the additive in the composition can be modified to adjust the properties of the filament substrate or the light-conversion layer, so as to meet special environmental requirements. The modification of each property is described herein below.

Adjustment of the Organosilicon-Modified Polyimide

The organosilicon-modified polyimide provided herein comprises a repeating unit represented by the following general Formula (I):

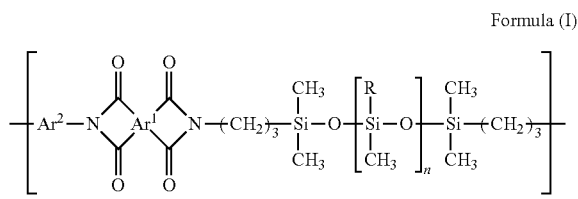

Formula (I)

In general Formula (I), $Ar^1$ is a tetra-valent organic group. The organic group has a benzene ring or an alicyclic hydrocarbon structure. The alicyclic hydrocarbon structure may be monocyclic alicyclic hydrocarbon structure or a bridged-ring alicyclic hydrocarbon structure, which may be a dicyclic alicyclic hydrocarbon structure or a tricyclic alicyclic hydrocarbon structure. The organic group may also be a benzene ring or an alicyclic hydrocarbon structure comprising a functional group having active hydrogen, wherein the functional group having active hydrogen is one or more of hydroxyl, amino, carboxy, amido and mercapto.

$Ar^2$ is a di-valent organic group, which organic group may have for example a monocyclic alicyclic hydrocarbon structure or a di-valent organic group comprising a functional group having active hydrogen, wherein the functional group having active hydrogen is one or more of hydroxyl, amino, carboxy, amido and mercapto.

R is each independently methyl or phenyl.

n is 1~5, preferably 1, 2, 3 or 5.

The polymer of general Formula (I) has a number average molecular weight of 5000~100000, preferably 10000~60000, more preferably 20000~40000. The number average molecular weight is determined by gel permeation chromatography (GPC) and calculated based on a calibration curve obtained by using standard polystyrene. When the number average molecular weight is below 5000, a good mechanical property is hard to be obtained after curing, especially the elongation tends to decrease. On the other hand, when it exceeds 100000, the viscosity becomes too high and the resin is hard to be formed.

$Ar^1$ is a component derived from a dianhydride, which may be an aromatic anhydride or an aliphatic anhydride. The aromatic anhydride includes an aromatic anhydride comprising only a benzene ring, a fluorinated aromatic anhydride, an aromatic anhydride comprising amido group, an aromatic anhydride comprising ester group, an aromatic anhydride comprising ether group, an aromatic anhydride comprising sulfide group, an aromatic anhydride comprising sulfonyl group, and an aromatic anhydride comprising carbonyl group.

Examples of the aromatic anhydride comprising only a benzene ring include pyromellitic dianhydride (PMDA), 2,3,3',4'-biphenyl tetracarboxylic dianhydride (aBPDA), 3,3',4,4'-biphenyl tetracarboxylic dianhydride (sBPDA), and 4-(2,5-dioxotetrahydrofuran-3-yl)-1,2,3,4-tetrahydro naphthalene-1,2-dicarboxylic anhydride (TDA). Examples of the fluorinated aromatic anhydride include 4,4'-(hexafluoroisopropylidene)diphthalic anhydride which is referred to as 6FDA. Examples of the aromatic anhydride comprising amido group include N,N'-(5,5'-(perfluoropropane-2,2-diyl) bis(2-hydroxy-5,1-phenylene))bis(1,3-dioxo-1,3-dihydroisobenzofuran)-5-arboxamide) (6FAP-ATA), and N,N'-(9H-fluoren-9-ylidenedi-4,1-phenylene)bis[1,3-dihydro-1,3-dioxo-5-isobenzofuran carboxamide] (FDA-ATA). Examples of the aromatic anhydride comprising ester group include p-phenylene bis(trimellitate) dianhydride (TAHQ). Examples of the aromatic anhydride comprising ether group include 4,4'-(4,4'-isopropylidenediphenoxy)bis(phthalic anhydride) (BPADA), 4,4'-oxydiphthalic dianhydride (sODPA), 2,3,3',4'-diphenyl ether tetracarboxylic dianhydride (aODPA), and 4,4'-(4,4'-isopropylidenediphenoxy)bis (phthalic anhydride)(BPADA). Examples of the aromatic anhydride comprising sulfide group include 4,4'-bis(phthalic anhydride)sulfide (TPDA). Examples of the aromatic anhydride comprising sulfonyl group include 3,3',4,4'-diphenylsulfonetetracarboxylic dianhydride (DSDA). Examples of the aromatic anhydride comprising carbonyl group include 3,3',4,4'-benzophenonetetracarboxylic dianhydride (BTDA).

The alicyclic anhydride includes 1,2,4,5-cyclohexanetetracarboxylic acid dianhydride which is referred to as HPMDA, 1,2,3,4-butanetetracarboxylic dianhydride (BDA), tetrahydro-1H-5,9-methanopyrano[3,4-d]oxepine-1,3,6,8(4H)-tetrone (TCA), hexahydro-4,8-ethano-1H,3H-benzo [1,2-C:4,5-C']difuran-1,3,5,7-tetrone (BODA), cyclobutane-1,2,3,4-tetracarboxylic dianhydride (CBDA), and 1,2,3,4-cyclopentanetetracarboxylic dianhydride (CpDA); or alicyclic anhydride comprising an olefin structure, such as bicyclo[2.2.2]oct-7-ene-2,3,5,6-tetracarboxylic dianhydride (COeDA). When an anhydride comprising ethynyl such as 4,4'-(ethyne-1,2-diyl)diphthalic anhydride (EBPA) is used, the mechanical strength of the light-conversion layer can be further ensured by post-curing.

Considering the solubility, 4,4'-oxydiphthalic anhydride (sODPA), 3,3',4,4'-benzophenonetetracarboxylic dianhydride (BTDA), cyclobutanetetracarboxylic dianhydride (CBDA) and 4,4'-(hexafluoroisopropylidene)diphthalic anhydride (6FDA) are preferred. The above dianhydride can be used alone or in combination.

$Ar^2$ is derived from diamine which may be an aromatic diamine or an aliphatic diamine. The aromatic diamine includes an aromatic diamine comprising only a benzene ring, a fluorinated aromatic diamine, an aromatic diamine comprising ester group, an aromatic diamine comprising ether group, an aromatic diamine comprising amido group, an aromatic diamine comprising carbonyl group, an aromatic diamine comprising hydroxyl group, an aromatic diamine comprising carboxy group, an aromatic diamine comprising sulfonyl group, and an aromatic diamine comprising sulfide group.

The aromatic diamine comprising only a benzene ring includes m-phenylenediamine, p-phenylenediamine, 2,4-diaminotoluene, 2,6-diamino-3,5-diethyltoluene, 3,3'-dimethylbiphenyl-4,4'-diamine 9,9-bis(4-aminophenyl)fluorene (FDA), 9,9-bis(4-amino-3-methylphenyl)fluorene, 2,2-bis(4-aminophenyl)propane, 2,2-bis(3-methyl-4-aminophenyl)propane, 4,4'-diamino-2,2'-dimethylbiphenyl(APB). The fluorinated aromatic diamine includes 2,2'-bis(trifluoromethyl)benzidine (TFMB), 2,2-bis(4-aminophenyl)hexafluoropropane (6FDAM), 2,2-bis[4-(4-aminophenoxy)phenyl] hexafluoropropane (HFBAPP), and 2,2-bis(3-amino-4-methylphenyl)hexafluoropropane (BIS-AF-AF). The aromatic diamine comprising ester group includes [4-(4-aminobenzoyl)oxyphenyl]4-aminobenzoate (ABHQ), bis(4-aminophenyl)terephthalate (BPTP), and 4-aminophenyl 4-aminobenzoate (APAB). The aromatic diamine comprising ether group includes 2,2-bis[4-(4-aminophenoxy)phenyl]propane)(BAPP), 2,2'-bis[4-(4-aminophenoxy)phenyl] propane (ET-BDM), 2,7-bis(4-aminophenoxy)-naphthalene (ET-2,7-Na), 1,3-bis(3-aminophenoxy)benzene (TPE-M), 4,4'-[1,4-phenyldi(oxy)]bis[3-(trifluoromethyl)aniline] (p-6FAPB), 3,4'-diaminodiphenyl ether, 4,4'-diaminodiphenyl ether (ODA), 1,3-bis(4-aminophenoxy)benzene (TPE-R), 1,4-bis(4-aminophenoxy)benzene (TPE-Q), and 4,4'-bis (4-aminophenoxy)biphenyl(BAPB). The aromatic diamine comprising amido group includes N,N'-bis(4-aminophenyl) benzene-1,4-dicarboxamide (BPTPA), 3,4'-diamino benzanilide (m-APABA), and 4,4'-diaminobenzanilide (DABA). The aromatic diamine comprising carbonyl group includes 4,4'-diaminobenzophenone (4,4'-DABP), and bis(4-amino-3-carboxyphenyl) methane (or referred to as 6,6'-diamino-3,3'-methylanediyl-dibenzoic acid). The aromatic diamine comprising hydroxyl group includes 3,3'-dihydroxybenzidine (HAB), and 2,2-bis(3-amino-4-hydroxyphenyl) hexafluoropropane (6FAP). The aromatic diamine comprising carboxy group includes 6,6'-diamino-3,3'-methylanediyl-dibenzoic acid (MBAA), and 3,5-diaminobenzoic acid (DBA). The aromatic diamine comprising sulfonyl group includes 3,3'-diaminodiphenyl sulfone (DDS), 4,4'-diaminodiphenyl sulfone, bis[4-(4-aminophenoxy)phenyl]sulfone (BAPS) (or referred to as 4,4'-bis(4-aminophenoxy)diphenylsulfone), and 3,3'-diamino-4,4'-dihydroxydiphenyl sulfone (ABPS). The aromatic diamine comprising sulfide group includes 4,4'-diaminodiphenyl sulfide.

The aliphatic diamine is a diamine which does not comprise any aromatic structure (e.g., benzene ring). The aliphatic diamine includes monocyclic alicyclic amine and straight chain aliphatic diamine, wherein the straight chain aliphatic diamine include siloxane diamine, straight chain alkyl diamine and straight chain aliphatic diamine comprising ether group. The monocyclic alicyclic diamine includes 4,4'-diaminodicyclohexylmethane (PACM), and 3,3'-dimethyl-4,4-diaminodicyclohexylmethane (DMDC). The siloxane diamine (or referred to as amino-modified silicone) includes α,ω-(3-aminopropyl)polysiloxane (KF8010), X22-161A, X22-161B, NH15D, and 1,3-bis(3-aminopropyl)-1,1,3,3-tetramethyldisiloxane (PAME). The straight chain alkyl diamine has 6~12 carbon atoms, and is preferably unsubstituted straight chain alkyl diamine. The straight chain aliphatic diamine comprising ether group includes ethylene glycol di(3-aminopropyl) ether.

The diamine can also be a diamine comprising fluorenyl group. The fluorenyl group has a bulky free volume and rigid fused-ring structure, which renders the polyimide good heat resistance, thermal and oxidation stabilities, mechanical properties, optical transparency and good solubility in organic solvents. The diamine comprising fluorenyl group, such as 9,9-bis(3,5-difluoro-4-aminophenyl)fluorene, may be obtained through a reaction between 9-fluorenone and 2,6-dichloroaniline. The fluorinated diamine can be 1,4-bis(3'-amino-5'-trifluoromethylphenoxy)biphenyl, which is a meta-substituted fluorine-containing diamine having a rigid biphenyl structure. The meta-substituted structure can hinder the charge flow along the molecular chain and reduce the intermolecular conjugation, thereby reducing the absorption of visible lights. Using asymmetric diamine or anhydride can increase to some extent the transparency of the organosilicon-modified polyimide resin composition. The above diamines can be used alone or in combination.

Examples of diamines having active hydrogen include diamines comprising hydroxyl group, such as 3,3'-diamino-4,4'-dihydroxybiphenyl, 4,4'-diamino-3,3'-dihydroxy-1,1'-biphenyl (or referred to as 3,3'-dihydroxybenzidine) (HAB), 2,2-bis(3-amino-4-hydroxyphenyl)propane (BAP), 2,2-bis(3-amino-4-hydroxyphenyl)hexafluoropropane (6FAP), 1,3-bis(3-hydro-4-aminophenoxy) benzene, 1,4-bis(3-hydroxy-4-aminophenyl)benzene and 3,3'-diamino-4,4'-dihydroxydiphenyl sulfone (ABPS). Examples of diamines comprising carboxy group include 3,5-diaminobenzoic acid, bis(4-amino-3-carboxyphenyl)methane (or referred to as 6,6'-diamino-3,3'-methylenedibenzoic acid), 3,5-bis(4-aminophenoxy)benzoic acid, and 1,3-bis(4-amino-2-carboxyphenoxy)benzene. Examples of diamines comprising amino group include 4,4'-diaminobenzanilide (DABA), 2-(4-aminophenyl)-5-aminobenzoimidazole, diethylenetriamine, 3,3'-diaminodipropylamine, triethylenetetramine, and N,N'-bis(3-aminopropyl)ethylenediamine (or referred to as N,N-di(3-aminopropyl)ethylethylamine). Examples of diamines comprising thiol group include 3,4-diaminobenzenethiol. The above diamines can be used alone or in combination.

The organosilicon-modified polyimide can be synthesized by well-known synthesis methods. For example, it can be prepared from a dianhydride and a diamine which are dissolved in an organic solvent and subjected to imidation in the presence of a catalyst. Examples of the catalyst include acetic anhydride/triethylamine, and valerolactone/pyridine. Preferably, removal of water produced in the azeotropic process in the imidation is promoted by using a dehydrant such as toluene.

Polyimide can also be obtained by carrying out an equilibrium reaction to give a poly (amic acid) which is heated to dehydrate. In other embodiments, the polyimide backbone may have a small amount of amic acid. For example, the ratio of amic acid to imide in the polyimide molecule may be 1~3:100. Due to the interaction between amic acid and the epoxy resin, the substrate has superior properties. In other embodiments, a solid state material such as a thermal curing agent, inorganic heat dispersing particles and phosphor can also be added at the state of poly (amic acid) to give the substrate. In addition, solubilized polyimide can also be obtained by direct heating and dehydration after mixing of alicylic anhydride and diamine. Such solubilized polyimide, as an adhesive material, has a good light transmittance. In addition, it is liquid state; therefore, other solid materials (such as the inorganic heat dispersing particles and the phosphor) can be dispersed in the adhesive material more sufficiently.

In one embodiment for preparing the organosilicon-modified polyimide, the organosilicon-modified polyimide can be produced by dissolving the polyimide obtained by heating and dehydration after mixing a diamine and an anhydride and a siloxane diamine in a solvent. In another embodiment, the amidic acid, before converting to polyimide, is reacted with the siloxane diamine.

In addition, the polyimide compound may be obtained by dehydration and ring-closing and condensation polymerization from an anhydride and a diamine, such as an anhydride and a diamine in a molar ratio of 1:1. In one embodiment, 200 micromole (mmol) of 4,4'-(hexafluoroisopropylidene) diphthalic anhydride (6FDA), 20 micromole (mmol) of 2,2-bis(3-amino-4-hydroxyphenyl)hexafluoropropane (6FAP), 50 micromole (mmol) of 2,2'-di(trifluoromethyl) diaminobiphenyl(TFMB) and 130 micromole (mmol) of aminopropyl-terminated poly (dimethylsiloxane) are used to give the PI synthesis solution.

The above methods can be used to produce amino-terminated polyimide compounds. However, other methods can be used to produce carboxy-terminated polyimide compounds. In addition, in the above reaction between anhydride and diamine, where the backbone of the anhydride comprises a carbon-carbon triple bond, the affinity of the carbon-carbon triple bond can promote the molecular structure.

Alternatively, a diamine comprising vinyl siloxane structure can be used. The molar ratio of dianhydride to diamine may be 1:1. The molar percentage of the diamine comprising a functional group having active hydrogen may be 5~25% of the total amount of diamine. The temperature under which the polyimide is synthesized is preferably 80~250° C., more preferably 100~200° C. The reaction time may vary depending on the size of the batch. For example, the reaction time for obtaining 10~30 g polyimide is 6~10 hours.

The organosilicon-modified polyimide can be classified as fluorinated aromatic organosilicon-modified polyimides and aliphatic organosilicon-modified polyimides. The fluorinated aromatic organosilicon-modified polyimides are synthesized from siloxane-type diamine, aromatic diamine comprising fluoro (F) group (or referred to as fluorinated aromatic diamine) and aromatic dianhydride comprising fluoro (F) group (or referred to as fluorinated aromatic anhydride). The aliphatic organosilicon-modified polyimides are synthesized from dianhydride, siloxane-type diamine and at least one diamine not comprising aromatic structure (e.g., benzene ring) (or referred to as aliphatic diamine), or from diamine (one of which is siloxane-type diamine) and at least one dianhydride not comprising aromatic structure (e.g., benzene ring) (or referred to as aliphatic anhydride). The aliphatic organosilicon-modified polyimide includes semi-aliphatic organosilicon-modified polyimide and fully aliphatic organosilicon-modified polyimide. The fully aliphatic organosilicon-modified polyimide is synthesized from at least one aliphatic dianhydride, siloxane-type diamine and at least one aliphatic diamine. The raw materials for synthesizing the semi-aliphatic organosilicon-modified polyimide include at least one aliphatic dianhydride or aliphatic diamine. The raw materials required for synthesizing the organosilicon-modified polyimide and the siloxane content in the organosilicon-modified polyimide would have certain effects on transparency, chromism, mechanical property, warpage extent and refractivity of the substrate.

The organosilicon-modified polyimide of the present disclosure has a siloxane content of 20~75 wt %, preferably 30~70 wt %, and a glass transition temperature of below 150° C. The glass transition temperature (Tg) is determined on TMA-60 manufactured by Shimadzu Corporation after adding a thermal curing agent to the organosilicon-modified polyimide. The determination conditions include: load: 5 gram; heating rate: 10° C./min; determination environment: nitrogen atmosphere; nitrogen flow rate: 20 ml/min; temperature range: −40 to 300° C. When the siloxane content is below 20%, the film prepared from the organosilicon-modified polyimide resin composition may become very hard and brittle due to the filling of the phosphor and thermal conductive fillers, and tend to warp after drying and curing, and therefore has a low processability. In addition, its resistance to thermochromism becomes lower. On the other hand, when the siloxane content is above 75%, the film prepared from the organosilicon-modified polyimide resin composition becomes opaque, and has reduced transparency and tensile strength. Here, the siloxane content is the weight ratio of siloxane-type diamine (having a structure shown in Formula (A)) to the organosilicon-modified polyimide, wherein the weight of the organosilicon-modified polyimide is the total weight of the diamine and the dianhydride used for synthesizing the organosilicon-modified polyimide subtracted by the weight of water produced during the synthesis.

Formula (A)

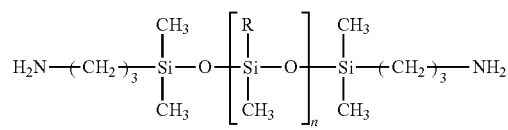

Wherein R is methyl or phenyl, preferably methyl, n is 1~5, preferably 1, 2, 3 or 5.

The only requirements on the organic solvent used for synthesizing the organosilicon-modified polyimide are to dissolve the organosilicon-modified polyimide and to ensure the affinity (wettability) to the phosphor or the fillers to be added. However, excessive residue of the solvent in the product should be avoided. Normally, the number of moles of the solvent is equal to that of water produced by the reaction between diamine and anhydride. For example, 1 mol diamine reacts with 1 mol anhydride to give 1 mol water; then the amount of solvent is 1 mol. In addition, the organic solvent used has a boiling point of above 80° C. and below 300° C., more preferably above 120° C. and below 250° C., under standard atmospheric pressure. Since drying and curing under a lower temperature are needed after coating, if the temperature is lower than 120° C., good coating cannot be achieved due to high drying speed during the coating process. If the boiling point of the organic solvent is higher than 250° C., the drying under a lower temperature may be deferred. Specifically, the organic solvent may be an ether-type organic solvent, an ester-type organic solvent, a dimethyl ether-type organic solvent, a ketone-type organic solvent, an alcohol-type organic solvent, an aromatic hydrocarbon solvent or other solvents. The ether-type organic solvent includes ethylene glycol monomethyl ether, ethylene glycol monoethyl ether, propylene glycol monomethyl ether, propylene glycol monoethyl ether, ethylene glycol dimethyl ether, ethylene glycol diethyl ether, ethylene glycol dibutyl ether, diethylene glycol dimethyl ether, diethylene glycol diethyl ether, diethylene glycol methyl ethyl ether, dipropylene glycol dimethyl ether or diethylene glycol dibutyl ether, and diethylene glycol butyl methyl ether. The ester-type organic solvent includes acetates, including ethylene glycol monoethyl ether acetate, diethylene glycol monobutyl ether acetate, propylene glycol monomethyl ether acetate, propyl acetate, propylene glycol diacetate, butyl acetate, isobutyl acetate, 3-methoxybutyl acetate, 3-methyl-3-methoxybutyl acetate, benzyl acetate and 2-(2-butoxyethoxy)ethyl acetate; and methyl lactate, ethyl lactate, n-butyl acetate, methyl benzoate and ethyl benzoate. The dimethyl ether-type solvent includes triethylene glycol dimethyl ether and tetraethylene glycol dimethyl ether. The ketone-type solvent includes acetylacetone, methyl propyl ketone, methyl butyl ketone, methyl isobutyl ketone, cyclopentanone, and 2-heptanone. The alcohol-type solvent includes butanol, isobutanol, isopentanol, 4-methyl-2-pentanol, 3-methyl-2-butanol, 3-methyl-3-methoxybutanol, and diacetone alcohol. The aromatic hydrocarbon solvent includes toluene and xylene. Other solvents include γ-butyrolactone, N-methylpyrrolidone, N,N-dimethylformamide, N,N-dimethylacetamide and dimethyl sulfoxide.

The present disclosure provides an organosilicon-modified polyimide resin composition comprising the above organosilicon-modified polyimide and a thermal curing agent, which may be epoxy resin, hydrogen isocyanate or bisoxazoline compound. In one embodiment, based on the weight of the organosilicon-modified polyimide, the amount of the thermal curing agent is 5~12% of the weight of the organosilicon-modified polyimide. The organosilicon-modified polyimide resin composition may further comprise heat dispersing particles and phosphor.

Light Transmittance

The factors affecting the light transmittance of the organosilicon-modified polyimide resin composition at least include the type of the main material, the type of the modifier (thermal curing agent), the type and content of the heat dispersing particles, and the siloxane content. Light transmittance refers to the transmittance of the light near the main light-emitting wavelength range of the LED chip. For example, blue LED chip has a main light-emitting wavelength of around 450 nm, then the composition or the polyimide should have low enough or even no absorption to the light having a wavelength around 450 nm, so as to ensure that most or even all the light can pass through the composition or the polyimide. In addition, when the light emitted by the LED chip passes through the interface of two materials, the closer the refractive indexes of the two materials, the higher the light output efficiency. In order to be close to the refractive index of the material (such as die bonding glue) contacting with the filament substrate (or base layer), the organosilicon-modified polyimide composition has a refractive index of 1.4~1.7, preferably 1.4~1.55. In order to use the organosilicon-modified polyimide resin composition as substrate in the filament, the organosilicon-modified polyimide resin composition is required to have good light transmittance at the peak wavelength of InGaN of the blue-excited white LED. In order to obtain a good transmittance, the raw materials for synthesizing the organosilicon-modified polyimide, the thermal curing agent and the heat dispersing particles can be adjusted. Because the phosphor in the organosilicon-modified polyimide resin composition may have certain effect on the transmittance test, the organosilicon-modified polyimide resin composition used for the transmittance test does not comprise phosphor. Such an organosilicon-modified polyimide resin composition has a transmittance of 86~93%, preferably 88~91%, or preferably 89~92%, or preferably 90~93%.

In the reaction of anhydride and diamine to produce polyimide, the anhydride and the diamine may vary. In other words, the polyimides produced from different anhydrides and different diamines may have different light transmittances. The aliphatic organosilicon-modified polyimide resin composition comprises the aliphatic organosilicon-modified polyimide and the thermal curing agent, while the fluorinated aromatic organosilicon-modified polyimide resin composition comprises the fluorinated aromatic organosilicon-modified polyimide and the thermal curing agent. Since the aliphatic organosilicon-modified polyimide has an alicyclic structure, the aliphatic organosilicon-modified polyimide resin composition has a relatively high light transmittance. In addition, the fluorinated aromatic, semi-aliphatic and full aliphatic polyimides all have good light transmittance in respect of the blue LED chips. The fluorinated aromatic organosilicon-modified polyimide is synthesized from a siloxane-type diamine, an aromatic diamine comprising a fluoro (F) group (or referred to as fluorinated aromatic diamine) and an aromatic dianhydride comprising a fluoro (F) group (or referred to as fluorinated aromatic anhydride). In other words, both $Ar^1$ and $Ar^2$ comprise a fluoro (F) group. The semi-aliphatic and full aliphatic organosilicon-modified polyimides are synthesized from a dianhydride, a siloxane-type diamine and at least one diamine not comprising an aromatic structure (e.g. a benzene ring) (or referred to as aliphatic diamine), or from a diamine (one of the diamine is siloxane-type diamine) and at least one dianhydride not comprising an aromatic structure (e.g. a benzene ring) (or referred to as aliphatic anhydride). In other words, at least one of $Ar^1$ and $Ar^2$ has an alicyclic hydrocarbon structure.

Although blue LED chips have a main light-emitting wavelength of 450 nm, they may still emit a minor light having a shorter wavelength of around 400 nm, due to the difference in the conditions during the manufacture of the chips and the effect of the environment. The fluorinated aromatic, semi-aliphatic and full aliphatic polyimides have different absorptions to the light having a shorter wavelength of 400 nm. The fluorinated aromatic polyimide has an absorbance of about 20% to the light having a shorter wavelength of around 400 nm, i.e. the light transmittance of the light having a wavelength of 400 nm is about 80% after passing through the fluorinated aromatic polyimide. The semi-aliphatic and full aliphatic polyimides have even lower absorbance to the light having a shorter wavelength of 400 nm than the fluorinated aromatic polyimide, which is only 12%. Accordingly, in an embodiment, if the LED chips used in the LED filament have a uniform quality, and emit less blue light having a shorter wavelength, the fluorinated aromatic organosilicon-modified polyimide may be used to produce the filament substrate or the light-conversion layer. In another embodiment, if the LED chips used in the LED filament have different qualities, and emit more blue light having a shorter wavelength, the semi-aliphatic or full aliphatic organosilicon-modified polyimides may be used to produce the filament substrate or the light-conversion layer.

Adding different thermal curing agents imposes different effects on the light transmittance of the organosilicon-modified polyimide. Table 1~1 shows the effect of the addition of different thermal curing agents on the light transmittance of the full aliphatic organosilicon-modified polyimide. At the main light-emitting wavelength of 450 nm for the blue LED chip, the addition of different thermal curing agents renders no significant difference to the light transmittance of the full aliphatic organosilicon-modified polyimide; while at a short wavelength of 380 nm, the addition of different thermal curing agents does affect the light transmittance of the full aliphatic organosilicon-modified polyimide. The organosilicon-modified polyimide itself has a poorer transmittance to the light having a short wavelength (380 nm) than to the light having a long wavelength (450 nm). However, the extent of the difference varies with the addition of different thermal curing agents. For example, when the thermal curing agent KF105 is added to the full aliphatic organosilicon-modified polyimide, the extent of the reduction in the light transmittance is less. In comparison, when the thermal curing agent 2021p is added to the full aliphatic organosilicon-modified polyimide, the extent of the reduction in the light transmittance is more. Accordingly, in an embodiment, if the LED chips used in the LED filament have a uniform quality, and emit less blue light having a short wavelength, the thermal curing agent BPA or the thermal curing agent 2021p may be added. In comparison, in an embodiment, if the LED chips used in the LED filament have different qualities, and emit more blue light having a short wavelength, the thermal curing agent KF105 may be used. Both Table 1-1 and Table 1-2 show the results obtained in the transmittance test using Shimadzu UV-Vis Spectrometer UV-1800. The light transmittances at wavelengths 380 nm, 410 nm and 450 nm are tested based on the light emission of white LEDs.

Different heat dispersing particles would have different transmittances. If heat dispersing particles with low light transmittance or low light reflection are used, the light transmittance of the organosilicon-modified polyimide resin composition will be lower. The heat dispersing particles in the organosilicon-modified polyimide resin composition of the present disclosure are preferably selected to be transparent powders or particles with high light transmittance or high light reflection. Since the soft filament for the LED is mainly for the light emission, the filament substrate should have good light transmittance. In addition, when two or more types of heat dispersing particles are mixed, particles with high light transmittance and those with low light

TABLE 1-1

| Organosilicon-Modified Polyimides | Thermal Curing Agent | | Light Transmittance (%) | | | Film Thickness (µm) | Mechanical Strength | |
|---|---|---|---|---|---|---|---|---|
| | Types | Amount (%) | 380 nm | 410 nm | 450 nm | | Elongation (%) | Tensile Strength (MPa) |
| Full Aliphatic | BPA | 8.0 | 87.1 | 89.1 | 90.6 | 44 | 24.4 | 10.5 |
| Full Aliphatic | X22-163 | 8.0 | 86.6 | 88.6 | 90.2 | 44 | 43.4 | 8.0 |
| Full Aliphatic | KF105 | 8.0 | 87.2 | 88.9 | 90.4 | 44 | 72.6 | 7.1 |
| Full Aliphatic | EHPE3150 | 8.0 | 87.1 | 88.9 | 90.5 | 44 | 40.9 | 13.1 |
| Full Aliphatic | 2021p | 8.0 | 86.1 | 88.1 | 90.1 | 44 | 61.3 | 12.9 |

TABLE 1-2

| Organosilicon-Modified Polyimide | Thermal Curing Agent | | Light Transmittance (%) | | | Film Thickness (mm) | Mechanical Strength | |
|---|---|---|---|---|---|---|---|---|
| | Type | Amount (%) | 380 nm | 410 nm | 450 nm | | Elongation (%) | Tensile Strength (MPa) |
| Full Aliphatic | BPA | 4.0 | 86.2 | 88.4 | 89.7 | 44 | 22.5 | 9.8 |
| Full Aliphatic | | 8.0 | 87.1 | 89.1 | 90.6 | 44 | 24.4 | 10.5 |
| Full Aliphatic | | 12.0 | 87.3 | 88.9 | 90.5 | 44 | 20.1 | 9.0 |

Even when the same thermal curing agent is added, different added amount thereof will have different effects on the light transmittance. Table 1-2 shows that when the added amount of the thermal curing agent BPA to the full aliphatic organosilicon-modified polyimide is increased from 4% to 8%, the light transmittance increases. However, when the added amount is further increased to 12%, the light transmittance keeps almost constant. It is shown that the light transmittance increases with the increase of the added amount of the thermal curing agent, but after the light transmittance increases to certain degree, adding more thermal curing agent will have limited effect on the light transmittance.

transmittance can be used in combination, wherein the proportion of particles with high light transmittance is higher than that of particles with low light transmittance. In an embodiment, for example, the weight ratio of particles with high light transmittance to particles with low light transmittance is 3~5:1.

Different siloxane content also affects the light transmittance. As can be seen from Table 2, when the siloxane content is only 37 wt %, the light transmittance is only 85%. When the siloxane content is increased to above 45%, the light transmittance exceeds 94%.

TABLE 2

| Organosilicon-Modified Polyimide | Siloxane Content (wt %) | Thermal Curing Agent | Tg (° C.) | Tensile Strength (MPa) | Elastic Modulus (GPa) | Elongation at Break (%) | Transmittance | Chemical Resistance | Resistance to Thermochromism |
|---|---|---|---|---|---|---|---|---|---|
| 1 | 37 | BPA | 158 | 33.2 | 1.7 | 10 | 85 | Δ | 83 |
| 2 | 41 | BPA | 142 | 38.0 | 1.4 | 12 | 92 | ○ | 90 |
| 3 | 45 | BPA | 145 | 24.2 | 1.1 | 15 | 97 | Δ | 90 |
| 4 | 64 | BPA | 30 | 8.9 | 0.04 | 232 | 94 | ○ | 92 |
| 5 | 73 | BPA | 0 | 1.8 | 0.001 | 291 | 96 | ○ | 95 |

Heat Resistance

The factors affecting the heat resistance of the organosilicon-modified polyimide resin composition include at least the type of the main material, the siloxane content, and the type and content of the modifier (thermal curing agent).

All the organosilicon-modified polyimide resin composition synthesized from fluorinated aromatic, semi-aliphatic and, full aliphatic organosilicon-modified polyimide have superior heat resistance, and are suitable for producing the filament substrate or the light-conversion layer. Detailed results from the accelerated heat resistance and aging tests (300° C.×1 hr) show that the fluorinated aromatic organosilicon-modified polyimide has better heat resistance than the aliphatic organosilicon-modified polyimide. Accordingly, in an embodiment, if a high power, high brightness LED chip is used as the LED filament, the fluorinated aromatic organosilicon-modified polyimide may be used to produce the filament substrate or the light-conversion layer.

The siloxane content in the organosilicon-modified polyimide will affect the resistance to thermochromism of the organosilicon-modified polyimide resin composition. The resistance to thermochromism refers to the transmittance determined at 460 nm after placing the sample at 200° C. for 24 hours. As can be seen from Table 2, when the siloxane content is only 37 wt %, the light transmittance after 24 hours at 200° C. is only 83%. As the siloxane content is increased, the light transmittance after 24 hours at 200° C. increases gradually. When the siloxane content is 73 wt %, the light transmittance after 24 hours at 200° C. is still as high as 95%. Accordingly, increasing the siloxane content can effectively increase the resistance to thermochromism of the organosilicon-modified polyimide.

Figure 4:
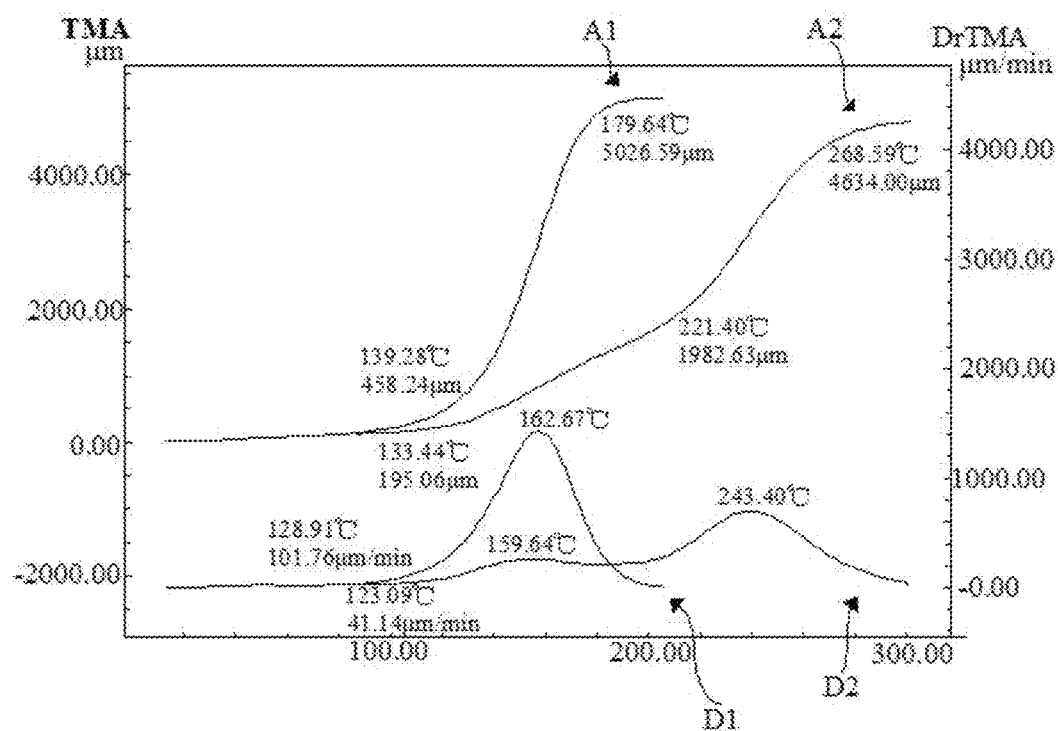
FIG. 4 shows the TMA analysis of the polyimide before and after adding the thermal curing agent.

Adding a thermal curing agent can lead to increased heat resistance and glass transition temperature. As shown in FIG. 4, A1 and A2 represent the curves before and after adding the thermal curing agent, respectively; and the curves D1 and D2 represent the values after differential computation on curves A1 and A2, respectively, representing the extent of the change of curves A1 and A2. As can be seen from the analysis results from TMA (thermomechanical analysis) shown in FIG. 4, the addition of the thermal curing agent leads to a trend that the thermal deformation slows down. Accordingly, adding a thermal curing agent can lead to increase of the heat resistance.

In the cross-linking reaction between the organosilicon-modified polyimide and the thermal curing agent, the thermal curing agent should have an organic group which is capable of reacting with the functional group having active hydrogen in the polyimide. The amount and the type of the thermal curing agent have certain effects on chromism, mechanical property and refractive index of the substrate. Accordingly, a thermal curing agent with good heat resistance and transmittance can be selected. Examples of the thermal curing agent include epoxy resin, isocyanate, bismaleimide, and bisoxazoline compounds. The epoxy resin may be bisphenol A epoxy resin, such as BPA; or siloxane-type epoxy resin, such as KF105, X22-163, and X22-163A; or alicylic epoxy resin, such as 3,4-epoxycyclohexylmethyl3,4-epoxycyclohexanecarboxylate (2021P), EHPE3150, and EHPE3150CE. Through the bridging reaction by the epoxy resin, a three dimensional bridge structure is formed between the organosilicon-modified polyimide and the epoxy resin, increasing the structural strength of the adhesive itself. In an embodiment, the amount of the thermal curing agent may be determined according to the molar amount of the thermal curing agent reacting with the functional group having active hydrogen in the organosilicon-modified polyimide. In an embodiment, the molar amount of the functional group having active hydrogen reacting with the thermal curing agent is equal to that of the thermal curing agent. For example, when the molar amount of the functional group having active hydrogen reacting with the thermal curing agent is 1 mol, the molar amount of the thermal curing agent is 1 mol.

Thermal Conductivity

The factors affecting the thermal conductivity of the organosilicon-modified polyimide resin composition include at least the type and content of the phosphor, the type and content of the heat dispersing particles and the addition and the type of the coupling agent. In addition, the particle size and the particle size distribution of the heat dispersing particles would also affect the thermal conductivity.

The organosilicon-modified polyimide resin composition may also comprise phosphor for obtaining the desired light-emitting properties. The phosphor can convert the wavelength of the light emitted from the light-emitting semiconductor. For example, yellow phosphor can convert blue light to yellow light, and red phosphor can convert blue light to red light. Examples of yellow phosphor include transparent phosphor such as $(Ba,Sr,Ca)_2SiO_4$:Eu, and $(Sr,Ba)_2$ $SiO_4$: Eu(barium orthosilicate (BOS)); silicate-type phosphor having a silicate structure such as $Y_3Al_5O_{12}$:Ce(YAG(yttrium.aluminum.garnet):Ce), and $Tb_3Al_3O_{12}$:Ce(YAG (terbium.aluminum.garnet):Ce); and oxynitride phosphor such as Ca-α-SiAlON. Examples of red phosphor include nitride phosphor, such as $CaAlSiN_3$:Eu, and $CaSiN_2$:Eu. Examples of green phosphor include rare earth-halide phosphor, and silicate phosphor. The ratio of the phosphor in the organosilicon-modified polyimide resin composition may be determined arbitrarily according to the desired light-emitting property. In addition, since the phosphor have a thermal conductivity which is significantly higher than that of the organosilicon-modified polyimide resin, the thermal conductivity of the organosilicon-modified polyimide resin composition as a whole will increase as the ratio of the phosphor in the organosilicon-modified polyimide resin composition increases. Accordingly, in an embodiment, as long as the light-emitting property is fulfilled, the content of the phosphor can be suitably increased to increase the thermal conductivity of the organosilicon-modified polyimide resin composition, which is beneficial to the heat dissipation of the filament substrate or the light-conversion layer. Furthermore, when the organosilicon-modified polyimide resin composition is used as the filament substrate, the content, shape and particle size of the phosphor in the organosilicon-modified polyimide resin composition also have certain effect on the mechanical property (such as the elastic modulus, elongation, tensile strength) and the warpage extent of the substrate. In order to render superior mechanical property and thermal conductivity as well as small warpage extent to the substrate, the phosphor included in the organosilicon-modified polyimide resin composition are particulate, and the shape thereof may be sphere, plate or needle, preferably sphere. The maximum average length of the phosphor (the average particle size when they are spherical) is above 0.1 μm, preferably over 1 μm, further preferably 1~100 μm, and more preferably 1~50 μm. The content of phosphor is no less than 0.05 times, preferably no less than 0.1 times, and no more than 8 times, preferably no more than 7 times, the weight of the organosilicon-modified polyimide. For example, when the weight of the organosilicon-modified polyimide is 100 parts in weight, the content of the phosphor is no less than 5 parts in weight, preferably no less than 10 parts in weight, and no more than 800 parts in weight, preferably no more than 700 parts in weight. When the content of the phosphor in the organosilicon-modified polyimide resin composition exceeds 800 parts in weight, the mechanical property of the organosilicon-modified polyimide resin composition may not achieve the strength as required for a filament substrate, resulting in the increase of the defective rate of the product. In an embodiment, two kinds of phosphor are added at the same time. For example, when red phosphor and green phosphor are added at the same time, the added ratio of red phosphor to green phosphor is 1:5~8, preferably 1:6~7. In another embodiment, red phosphor and yellow phosphor are added at the same time, wherein the added ratio of red phosphor to yellow phosphor is 1:5~8, preferably 1:6~7. In another embodiment, three or more kinds of phosphor are added at the same time.

The main purposes of adding the heat dispersing particles are to increase the thermal conductivity of the organosilicon-modified polyimide resin composition, to maintain the color temperature of the light emission of the LED chip, and to prolong the service life of the LED chip. Examples of the heat dispersing particles include silica, alumina, magnesia, magnesium carbonate, aluminum nitride, boron nitride and diamond. Considering the dispersity, silica, alumina or the combination thereof are some preferable choices. The shape of the heat dispersing particles may be sphere, block, etc., where the sphere shape encompasses shapes which are similar to sphere. In an embodiment, heat dispersing particles may be in a shape of sphere or non-sphere, to ensure the dispersity of the heat dispersing particles and the thermal conductivity of the substrate, wherein the added weight ratio of the spherical and non-spherical heat dispersing particles is 1:0.15~0.35.

Table 3-1 shows the relationship between the content of the heat dispersing particles and the thermal conductivity of the organosilicon-modified polyimide resin composition. As the content of the heat dispersing particles increases, the thermal conductivity of the organosilicon-modified polyimide resin composition increases. However, when the content of the heat dispersing particles in the organosilicon-modified polyimide resin composition exceeds 1200 parts in weight, the mechanical property of the organosilicon-modified polyimide resin composition may not achieve the strength as required for a filament substrate, resulting in the increase of the defective rate of the product. In an embodiment, high content of heat dispersing particles with high light transmittance or high reflectivity (such as $SiO_2$, $Al_2O_3$) may be added, which, in addition to maintaining the transmittance of the organosilicon-modified polyimide resin composition, increases the heat dissipation of the organosilicon-modified polyimide resin composition. The heat conductivities shown in Tables 3-1 and 3-2 were measured by a thermal conductivity meter DRL-III manufactured by Xiangtan city instruments Co., Ltd. under the following test conditions: heating temperature: 90° C.; cooling temperature: 20° C.; load: 350N, after cutting the resultant organosilicon-modified polyimide resin composition into test pieces having a film thickness of 300 μm and a diameter of 30 mm.

TABLE 3-1

| Weight Ratio [wt %] | 0.0% | 37.9% | 59.8% | 69.8% | 77.6% | 83.9% | 89.0% |
|---|---|---|---|---|---|---|---|
| Volume Ratio [vol %] | 0.0% | 15.0% | 30.0% | 40.0% | 50.0% | 60.0% | 70.0% |
| Thermal Conductivity[W/m*K] | 0.17 | 0.20 | 0.38 | 0.54 | 0.61 | 0.74 | 0.81 |

TABLE 3-2

| Specification | 1 | 2 | 3 | 4 | 5 | 6 | 7 |
|---|---|---|---|---|---|---|---|
| Average Particle Size[μm] | 2.7 | 6.6 | 9.0 | 9.6 | 13 | 4.1 | 12 |
| Particle Size Distribution[μm] | 1~7 | 1~20 | 1~30 | 0.2~30 | 0.2~110 | 0.1~20 | 0.1~100 |
| Thermal Conductivity[W/m*K] | 1.65 | 1.48 | 1.52 | 1.86 | 1.68 | 1.87 | 2.10 |

Figure 5:
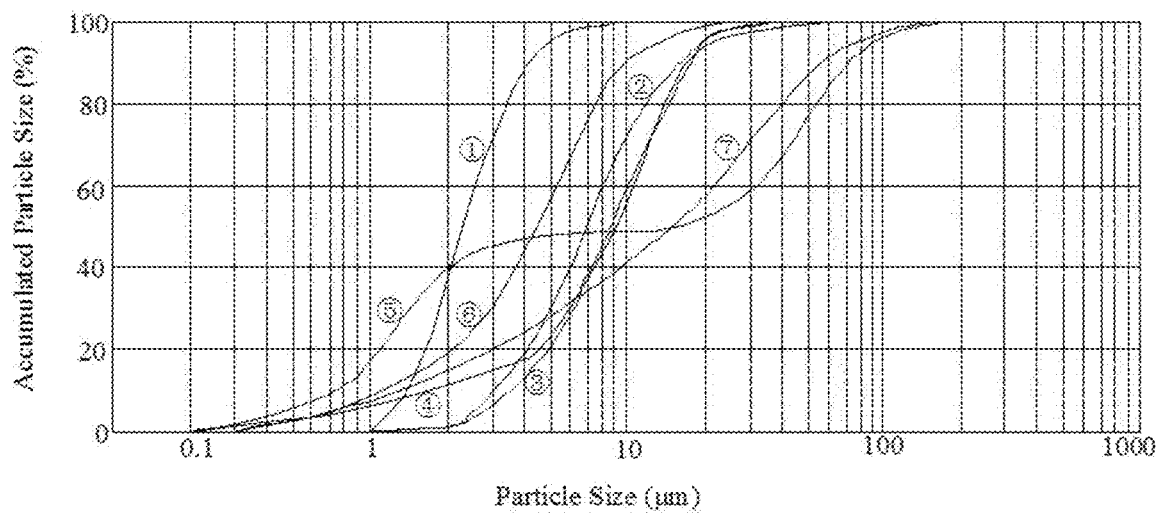
FIG. 5 shows the particle size distributions of the heat dispersing particles with different specifications.

For the effects of the particle size and the particle size distribution of the heat dispersing particles on the thermal conductivity of the organosilicon-modified polyimide resin composition, see both Table 3-2 and FIG. 5. Table 3-2 and FIG. 5 show seven heat dispersing particles with different specifications added into the organosilicon-modified polyimide resin composition in the same ratio and their effects on the thermal conductivity. The particle size of the heat dispersing particles suitable to be added to the organosilicon-modified polyimide resin composition can be roughly classified as small particle size (less than 1 μm), medium particle size (1-30 μm) and large particle size (above 30 μm).

Comparing specifications 1, 2 and 3, wherein only heat dispersing particles with medium particle size but different average particle sizes are added, when only heat dispersing particles with medium particle size are added, the average particle size of the heat dispersing particles does not significantly affect the thermal conductivity of the organosilicon-modified polyimide resin composition. Comparing specifications 3 and 4, wherein the average particle sizes are similar, the specification 4 comprising small particle size and medium particle size obviously exhibits higher thermal conductivity than specification 3 comprising only medium particle size. Comparing specifications 4 and 6, which comprise heat dispersing particles with both small particle size and medium particle size, although the average particle sizes of the heat dispersing particles are different, they have no significant effect on the thermal conductivity of the organosilicon-modified polyimide resin composition. Comparing specifications 4 and 7, specification 7, which comprises heat dispersing particles with large particle size in addition to small particle size and medium particle size, exhibits the most excellent thermal conductivity. Comparing specifications 5 and 7, which both comprise heat dispersing particles with large, medium and small particle sizes and have similar average particle sizes, the thermal conductivity of specification 7 is significantly superior to that of specification 5 due to the difference in the particle size distribution. See FIG. 5 for the particle size distribution of specification 7, the curve is smooth, and the difference in the slope is small, showing that specification 7 not only comprises each particle size, but also have moderate proportions of each particle size, and the particle size is normally distributed. For example, the small particle size represents about 10%, the medium particle size represents about 60%, and the large particle size represents about 30%. In contrast, the curve for specification 5 has two regions with large slopes, which locate in the region of particle size 1-2 μm and particle size 30-70 μm, respectively, indicating that most of the particle size in specification 5 is distributed in particle size 1-2 μm and particle size 30-70 μm, and only small amount of heat dispersing particles with particle size 3-20 μm are present, i.e. exhibiting a two-sided distribution.

Accordingly, the extent of the particle size distribution of the heat dispersing particles affecting the thermal conductivity is greater than that of the average particle size of the heat dispersing particles. When large, medium and small particle sizes of the heat dispersing particles are added, and the small particle size represents about 5-20%, the medium particle size represents about 50-70%, and large particle size represents about 20-40%, the organosilicon-modified polyimide resin will have optimum thermal conductivity. That is because when large, medium and small particle sizes are present, there would be denser packing and contacting each other of heat dispersing particles in a same volume, so as to form an effective heat dissipating route.

In an embodiment, for example, alumina with a particle size distribution of 0.1~100 μm and an average particle size of 12 μm or with a particle size distribution of 0.1~20 μm and an average particle size of 4.1 μm is used, wherein the particle size distribution is the range of the particle size of alumina. In another embodiment, considering the smoothness of the substrate, the average particle size may be selected as ⅕~⅖, preferably ⅕~⅓ of the thickness of the substrate. The amount of the heat dispersing particles may be 1~12 times the weight (amount) of the organosilicon-modified polyimide. For example, if the amount of the organosilicon-modified polyimide is 100 parts in weight, the amount of the heat dispersing particles may be 100~1200 parts in weight, preferably 400~900 parts in weight. Two different heat dispersing particles such as silica and alumina may be added at the same time, wherein the weight ratio of alumina to silica may be 0.4~25:1, preferably 1~10:1.

In the synthesis of the organosilicon-modified polyimide resin composition, a coupling agent such as a silicone coupling agent may be added to improve the adhesion between the solid material (such as the phosphor and/or the heat dispersing particles) and the adhesive material (such as the organosilicon-modified polyimide), and to improve the dispersion uniformity of the whole solid materials, and to further improve the heat dissipation and the mechanical strength of the light-conversion layer. The coupling agent may also be titanate coupling agent, preferably epoxy titanate coupling agent. The amount of the coupling agent is related to the amount of the heat dispersing particles and the specific surface area thereof. The amount of the coupling agent=(the amount of the heat dispersing particles* the specific surface area of the heat dispersing particles)/the minimum coating area of the coupling agent. For example, when an epoxy titanate coupling agent is used, the amount of the coupling agent=(the amount of the heat dispersing particles* the specific surface area of the heat dispersing particles)/331.5.

In other specific embodiments of the present invention, in order to further improve the properties of the organosilicon-modified polyimide resin composition in the synthesis process, an additive such as a defoaming agent, a leveling agent or an adhesive may be selectively added in the process of synthesizing the organosilicon-modified polyimide resin composition, as long as it does not affect light resistance, mechanical strength, heat resistance and chromism of the product. The defoaming agent is used to eliminate the foams produced in printing, coating and curing. For example, acrylic acid or silicone surfactants may be used as the defoaming agent. The leveling agent is used to eliminate the bumps in the film surface produced in printing and coating. Specifically, adding preferably 0.01~2 wt % of a surfactant component can inhibit foams. The coating film can be smoothened by using acrylic acid or silicone leveling agents, preferably non-ionic surfactants free of ionic impurities. Examples of the adhesive include imidazole compounds, thiazole compounds, triazole compounds, organoaluminum compounds, organotitanium compounds and silane coupling agents. Preferably, the amount of these additives is no more than 10% of the weight of the organosilicon-modified polyimide. When the mixed amount of the additive exceeds 10 wt %, the physical properties of the resultant coating film tend to decline, and it even leads to deterioration of the light resistance due to the presence of the volatile components.

Mechanical Strength

The factors affecting the mechanical strength of the organosilicon-modified polyimide resin composition include at least the type of the main material, the siloxane content, the type of the modifier (thermal curing agent), the phosphor and the content of the heat dispersing particles.

Different organosilicon-modified polyimide resins have different properties. Table 4 lists the main properties of the fluorinated aromatic, semi-aliphatic and full aliphatic organosilicon-modified polyimide, respectively, with a siloxane content of about 45% (wt %). The fluorinated aromatic has the best resistance to thermo chromism. The full aliphatic has the best light transmittance. The fluorinated aromatic has both high tensile strength and high elastic modulus. The conditions for testing the mechanical strengths shown in Table 4~6: the organosilicon-modified polyimide resin composition has a thickness of 50 μm and a width of 10 mm, and the tensile strength of the film is determined according to ISO527-3:1995 standard with a drawing speed of 10 mm/min.

than 2.0 GPa, preferably 2~6 GPa, more preferably 4~6 GPa. Table 5 shows the effects of different siloxane contents and the presence of particles (phosphor and alumina) on the elastic modulus of the organosilicon-modified polyimide resin composition. Where no fluorescent powder or alumina particle is added, the elastic modulus of the organosilicon-modified polyimide resin composition is always less than 2.0 GPa, and as the siloxane content increases, the elastic modulus tends to decline, i.e. the organosilicon-modified polyimide resin composition tends to soften. However, where phosphor and alumina particles are added, the elastic modulus of the organosilicon-modified polyimide resin composition may be significantly increased, and is always higher than 2.0 GPa. Accordingly, the increase in the siloxane content may lead to softening of the organosilicon-modified polyimide resin composition, which is advanta-

TABLE 4

| Organosilicon-Modified Polyimide | Siloxane Content (wt %) | Thermal Curing Agent | Tensile Strength (MPa) | Elastic Modulus (GPa) | Elongation at Break (%) | Transmittance | Resistance to Thermochromism |
|---|---|---|---|---|---|---|---|
| Fluorinated Aromatic | 44 | X22-163 | 22.4 | 1.0 | 83 | 96 | 95 |
| Semi-Aliphatic | 44 | X22-163 | 20.4 | 0.9 | 30 | 96 | 91 |
| Full Aliphatic | 47 | X22-163 | 19.8 | 0.8 | 14 | 98 | 88 |

TABLE 5

| Siloxane Content (wt %) | Addition of Phosphor, Alumina | Thermal Curing Agent | Tg (° C.) | Tensile Strength (MPa) | Elastic Modulus (GPa) | Elongation at Break (%) | Transmittance | Chemical Resistance | Resistance to Thermochromism |
|---|---|---|---|---|---|---|---|---|---|
| 37 | x | BPA | 158 | 33.2 | 1.7 | 10 | 85 | Δ | 83 |
| 37 | o | BPA | — | 26.3 | 5.1 | 0.7 | — | — | — |
| 41 | x | BPA | 142 | 38.0 | 1.4 | 12 | 92 | o | 90 |
| 41 | o | BPA | — | 19.8 | 4.8 | 0.8 | — | — | — |
| 45 | x | BPA | 145 | 24.2 | 1.1 | 15 | 97 | Δ | 90 |
| 45 | o | BPA | — | 21.5 | 4.2 | 0.9 | — | — | — |
| 64 | x | BPA | 30 | 8.9 | 0.04 | 232 | 94 | o | 92 |
| 64 | o | BPA | — | 12.3 | 3.1 | 1.6 | — | — | — |
| 73 | x | BPA | 0 | 1.8 | 0.001 | 291 | 96 | o | 95 |
| 73 | o | BPA | — | 9.6 | 2.5 | 2 | — | — | — |

TABLE 6

| Organosilicon-Modified Polyimide | Thermal Curing Agent Type | Amount (%) | Transmittance (%) | | | Film Thickness (μm) | Mechanical Strength | |
|---|---|---|---|---|---|---|---|---|
| | | | 380 nm | 410 nm | 450 nm | | Elongation (%) | Tensile Strength (MPa) |
| Full Aliphatic | BPA | 8.0 | 87.1 | 89.1 | 90.6 | 44 | 24.4 | 10.5 |
| Full Aliphatic | X22-163 | 8.0 | 86.6 | 88.6 | 90.2 | 40 | 43.4 | 8.0 |
| Full Aliphatic | KF105 | 12.0 | 87.5 | 89.2 | 90.8 | 43 | 80.8 | 7.5 |
| Full Aliphatic | EHPE3150 | 7.5 | 87.1 | 88.9 | 90.5 | 44 | 40.9 | 13.1 |
| Full Aliphatic | 2021p | 5.5 | 86.1 | 88.1 | 90.1 | 44 | 64.0 | 12.5 |

In the manufacture of the filament, the LED chip and the electrodes are first fixed on the filament substrate formed by the organosilicon-modified polyimide resin composition with a die bonding glue, followed by a wiring procedure, in which electric connections are established between adjacent LED chips and between the LED chip and the electrode with wires. To ensure the quality of die bonding and wiring, and to improve the product quality, the filament substrate should have a certain level of elastic modulus to resist the pressing force in the die bonding and wiring processes. Accordingly, the filament substrate should have an elastic modulus more geous for adding more fillers, such as more phosphor or heat dispersing particles. In order for the substrate to have superior elastic modulus and thermal conductivity, appropriate particle size distribution and mixing ratio may be selected so that the average particle size is within the range from 0.1 μm to 100 μm or from 1 μm to 50 μm.

In order for the LED filament to have good bending properties, the filament substrate should have an elongation at break of more than 0.5%, preferably 1~5%, most preferably 1.5~5%. As shown in Table 5, where no fluorescent powder or alumina particle is added, the organosilicon-modified polyimide resin composition has excellent elongation at break, and as the siloxane content increases, the elongation at break increases and the elastic modulus decreases, thereby reducing the occurrence of warpage. In contrast, where phosphor and alumina particles are added, the organosilicon-modified polyimide resin composition exhibits decreased elongation at break and increased elastic modulus, thereby increasing the occurrence of warpage.

By adding a thermal curing agent, not only the heat resistance and the glass transition temperature of the organosilicon-modified polyimide resin are increased, the mechanical properties, such as tensile strength, elastic modulus and elongation at break, of the organosilicon-modified polyimide are also increased. Adding different thermal curing agents may lead to different levels of improvement. Table 6 shows the tensile strength and the elongation at break of the organosilicon-modified polyimide resin composition after the addition of different thermal curing agents. For the full aliphatic organosilicon-modified polyimide, the addition of the thermal curing agent EHPE3150 leads to good tensile strength, while the addition of the thermal curing agent KF105 leads to good elongation.

TABLE 7

Specific Information of BPA

| Product Name | Viscosity at 25° C. (mPa·s) | Color (G) | Content of Hydrolysable Chlorine (mg/kg) | Equivalent of Epoxy (g/mol) | Hue APHA |
|---|---|---|---|---|---|
| BPA | 11000~15000 | ≤1 | ≤300 | 184~194 | ≤30 |

TABLE 8

Specific Information of 2021P

| Product Name | Viscosity at 25° C. (mPa·s) | Specific Gravity (25/25° C.) | Melting Point (° C.) | Boiling Point (° C./4 hPa) | Water Content (%) | Equivalent of Epoxy (g/mol) | Hue APHA |
|---|---|---|---|---|---|---|---|
| 2021P | 250 | 1.17 | −20 | 188 | 0.01 | 130 | 10 |

TABLE 9

Specific Information of EHPE3150 and EHPE3150CE

| Product Name | Viscosity at 25° C. (mPa·s) | Appearance | Softening Point | Equivalent of Epoxy (g/mol) | Hue APHA |
|---|---|---|---|---|---|
| EHPE3150 | — | Transparent Plate Solid | 75 | 177 | 20 (in 25% acetone solution) |
| EHPE3150CE | 50,000 | Light Yellow Transparent Liquid | — | 151 | 60 |

TABLE 10

Specific Information of PAME, KF8010, X22-161A, X22-161B, NH15D, X22-163, X22-163A and KF-105

| Product Name | Viscosity at 25° C. (mm$^2$/s) | Specific Gravity at 25° C. | Refractive Index at 25° C. | Equivalent of Functional Group |
|---|---|---|---|---|
| PAME | 4 | 0.90 | 1.448 | 130 g/mol |
| KF8010 | 12 | 1.00 | 1.418 | 430 g/mol |
| X22-161A | 25 | 0.97 | 1.411 | 800 g/mol |
| X22-161B | 55 | 0.97 | 1.408 | 1500 g/mol |
| NH15D | 13 | 0.95 | 1.403 | 1.6~2.1 g/mmol |
| X22-163 | 15 | 1.00 | 1.450 | 200 g/mol |
| X22-163A | 30 | 0.98 | 1.413 | 1000 g/mol |
| KF-105 | 15 | 0.99 | 1.422 | 490 g/mol |

The organosilicon-modified polyimide resin composition of the present embodiment may be used in a form of film or as a substrate together with a support to which it adheres. The film forming process comprises three steps: (a) coating step: spreading the above organosilicon-modified polyimide resin composition on a peelable body by coating to form a film; (b) heating and drying step: heating and drying the film together with the peelable body to remove the solvent from the film; and (c) peeling step: peeling the film from the peelable body after the drying is completed to give the organosilicon-modified polyimide resin composition in a form of film. The above peelable body may be a centrifugal film or other materials which do not undergo chemical reaction with the organosilicon-modified polyimide resin composition, e.g., PET centrifugal film.

The organosilicon-modified polyimide resin composition may be adhered to a support to give an assembly film, which may be used as the substrate. The process of forming the assembly film comprises two steps: (a) coating step: spreading the above organosilicon-modified polyimide resin composition on a support by coating to from an assembly film; and (b) heating and drying step: heating and drying the assembly film to remove the solvent from the film.

In the coating step, roll-to-roll coating devices such as roller coater, mold coating machine and blade coating machine, or simple coating means such as printing, inkjeting, dispensing and spraying may be used.

The drying method in the above heating and drying step may be drying in vacuum, drying by heating, or the like. The heating may be achieved by a heat source such as an electric heater or a heating media to produce heat energy and indirect convection, or by infrared heat radiation emitted from a heat source.

A film (composite film) with high thermal conductivity can be obtained from the above organosilicon-modified polyimide resin composition by coating and then drying and curing, so as to achieve any one or combination of the following properties: superior light transmittance, chemical resistance, heat resistance, thermal conductivity, film mechanical property and light resistance. The temperature and time in the drying and curing step may be suitably selected according to the solvent and the coated film thickness of the organosilicon-modified polyimide resin composition. The weight change of the organosilicon-modified polyimide resin composition before and after the drying and curing as well as the change in the peaks in the IR spectrum representing the functional groups in the thermal curing agent can be used to determine whether the drying and curing are completed. For example, when an epoxy resin is used as the thermal curing agent, whether the difference in the weight of the organosilicon-modified polyimide resin composition before and after the drying and curing is equal to the weight of the added solvent as well as the increase or decrease of the epoxy peak before and after the drying and curing are used to determine whether the drying and curing are completed.

Figure 6A:
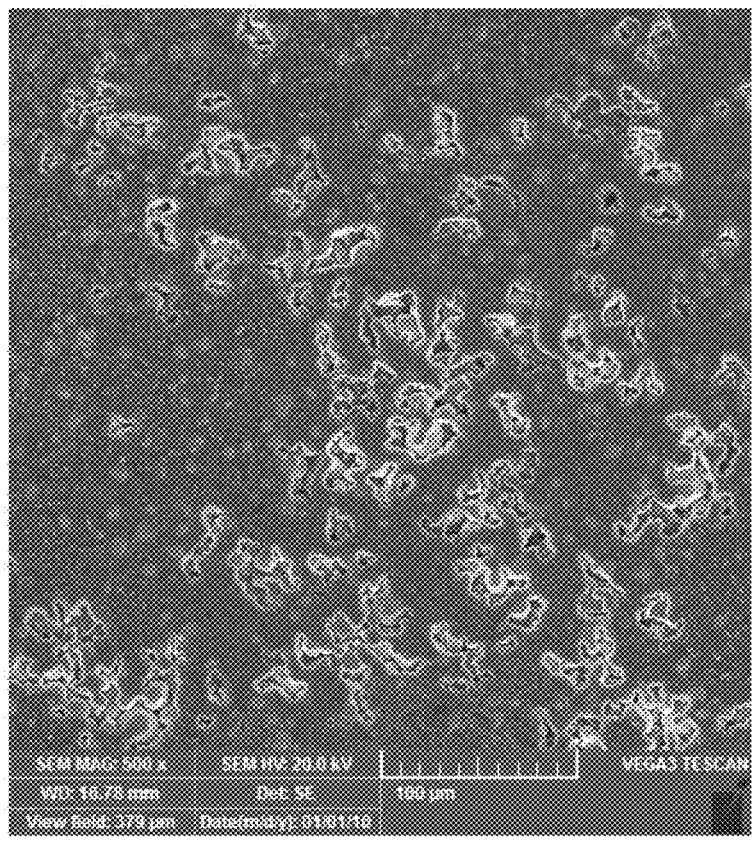
FIG. 6A shows the SEM image of an organosilicon-modified polyimide resin composition composite film (substrate)
Figure 6B:
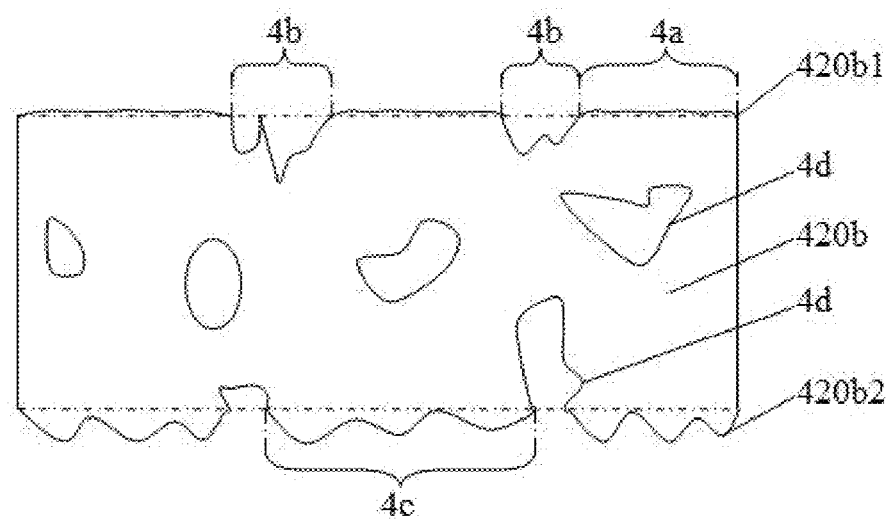
FIG. 6B shows the cross-sectional scheme of an organosilicon-modified polyimide resin composition composite film (substrate) according to an embodiment of the present invention.
Figure 6C:
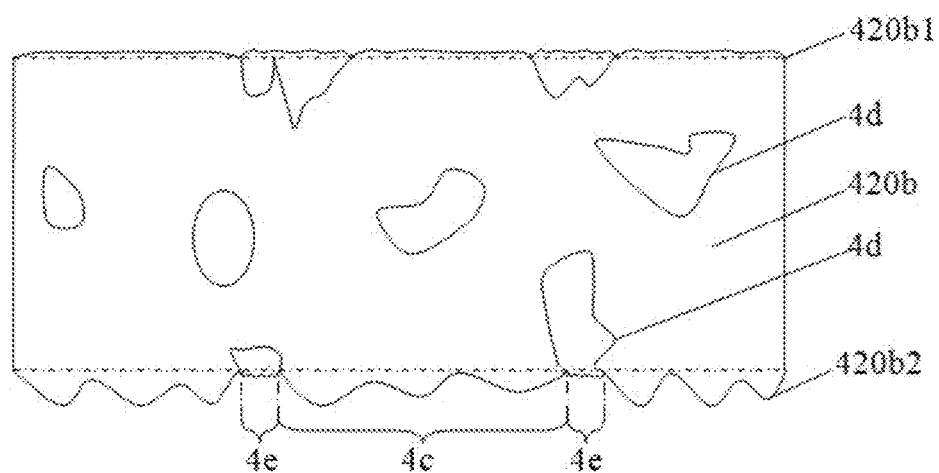
FIG. 6C shows the cross-sectional scheme of an organosilicon-modified polyimide resin composition composite film (substrate) according to another embodiment of the present disclosure.

In an embodiment, the amidation is carried out in a nitrogen atmosphere, or vacuum defoaming is employed in the synthesis of the organosilicon-modified polyimide resin composition, or both, so that the volume percentage of the cells in the organosilicon-modified polyimide resin composition composite film is 5~20%, preferably 5~10%. As shown in FIG. 6B, the organosilicon-modified polyimide resin composition composite film is used as the substrate for the LED soft filament. The substrate 420b has an upper surface 420b1 and an opposite lower surface 420b2. FIG. 6A shows the surface morphology of the substrate after gold is scattered on the surface thereof as observed with vega3 electron microscope from Tescan Corporation. As can be seen from FIG. 6B and the SEM image of the substrate surface shown in FIG. 6A, there is a cell 4d in the substrate, wherein the cell 4d represents 5~20% by volume, preferably 5~10% by volume, of the substrate 420b, and the cross section of the cell 4d is irregular. FIG. 6B shows the cross-sectional scheme of the substrate 420b, wherein the dotted line is the baseline. The upper surface 420b1 of the substrate comprises a first area 4a and a second area 4b, wherein the second area 4b comprises a cell 4d, and the first area 4a has a surface roughness which is less than that of the second area 4b. The light emitted by the LED chip passes through the cell in the second area and is scattered, so that the light emission is more uniform. The lower surface 420b2 of the substrate comprises a third area 4c, which has a surface roughness which is higher than that of the first area 4a. When the LED chip is positioned in the first area 4a, the smoothness of the first area 4a is favorable for subsequent bonding and wiring. When the LED chip is positioned in the second area 4b or the third area 4c, the area of contact between the die bonding glue and substrate is large, which improves the bonding strength between the die bonding glue and substrate. Therefore, by positioning the LED chip on the upper surface 420b1, bonding and wiring as well as the bonding strength between the die bonding glue and substrate can be ensured at the same time. When the organosilicon-modified polyimide resin composition is used as the substrate of the LED soft filament, the light emitted by the LED chip is scattered by the cell in the substrate, so that the light emission is more uniform, and glare can be further improved at the same time. In an embodiment, the surface of the substrate 420b may be treated with a silicone resin or a titanate coupling agent, preferably a silicone resin comprising methanol or a titanate coupling agent comprising methanol, or a silicone resin comprising isopropanol. The cross section of the treated substrate is shown in FIG. 6C. The upper surface 420b1 of the substrate has relatively uniform surface roughness. The lower surface 420b2 of the substrate comprises a third area 4c and a fourth area 4e, wherein the third area 4c has a surface roughness which is higher than that of the fourth area 4e. The surface roughness of the upper surface 420b1 of the substrate may be equal to that of the fourth area 4e. The surface of the substrate 420b may be treated so that a material with a high reactivity and a high strength can partially enter the cell 4d, so as to improve the strength of the substrate.

When the organosilicon-modified polyimide resin composition is prepared by vacuum defoaming, the vacuum used in the vacuum defoaming may be −0.5~−0.09 MPa, preferably −0.2~−0.09 MPa. When the total weight of the raw materials used in the preparation of the organosilicon-modified polyimide resin composition is less than or equal to 250 g, the revolution speed is 1200~2000 rpm, the rotation speed is 1200~2000 rpm, and time for vacuum defoaming is 3-8 min. This not only maintains certain amount of cells in the film to improve the uniformity of light emission, but also keeps good mechanical properties. The vacuum may be suitably adjusted according to the total weight of the raw materials used in the preparation of the organosilicon-modified polyimide resin composition. Normally, when the total weight is higher, the vacuum may be reduced, while the stirring time and the stirring speed may be suitably increased.

According to the present disclosure, a resin having superior transmittance, chemical resistance, resistance to thermochromism, thermal conductivity, film mechanical property and light resistance as required for a LED soft filament substrate can be obtained. In addition, a resin film having a high thermal conductivity can be formed by simple coating methods such as printing, inkjeting, and dispensing.

When the organosilicon-modified polyimide resin composition composite film is used as the filament substrate (or base layer), the LED chip is a hexahedral luminous body. In the production of the LED filament, at least two sides of the LED chip are coated by a top layer. When the prior art LED filament is lit up, non-uniform color temperatures in the top layer and the base layer would occur, or the base layer would give a granular sense. Accordingly, as a filament substrate, the composite film is required to have superior transparency. In other embodiments, sulfonyl group, non-coplanar structure, meta-substituted diamine, or the like may be introduced into the backbone of the organosilicon-modified polyimide to improve the transparency of the organosilicon-modified polyimide resin composition. In addition, in order for the bulb employing said filament to achieve omnidirectional illumination, the composite film as the substrate should have certain flexibility. Therefore, flexible structures such as ether (such as (4,4'-bis(4-amino-2-trifluoromethylphenoxy)diphenyl ether), carbonyl, methylene may be introduced into the backbone of the organosilicon-modified polyimide. In other embodiments, a diamine or dianhydride comprising a pyridine ring may be employed, in which the rigid structure of the pyridine ring can improve the mechanical properties of the composite film. Meanwhile, by using it together with a strong polar group such as —F, the composite film may have superior light transmittance. Examples of the anhydride comprising a pyridine ring include 2,6-bis(3',4'-dicarboxyphenyl)-4-(3",5"-bistrifluoromethylphenyl)pyridine dianhydride.

The LED filament structure in the aforementioned embodiments is mainly applicable to the LED light bulb product, so that the LED light bulb can achieve the omnidirectional light illuminating effect through the flexible bending characteristics of the single LED filament. The specific embodiment in which the aforementioned LED filament applied to the LED light bulb is further explained below.

Figure 7A:
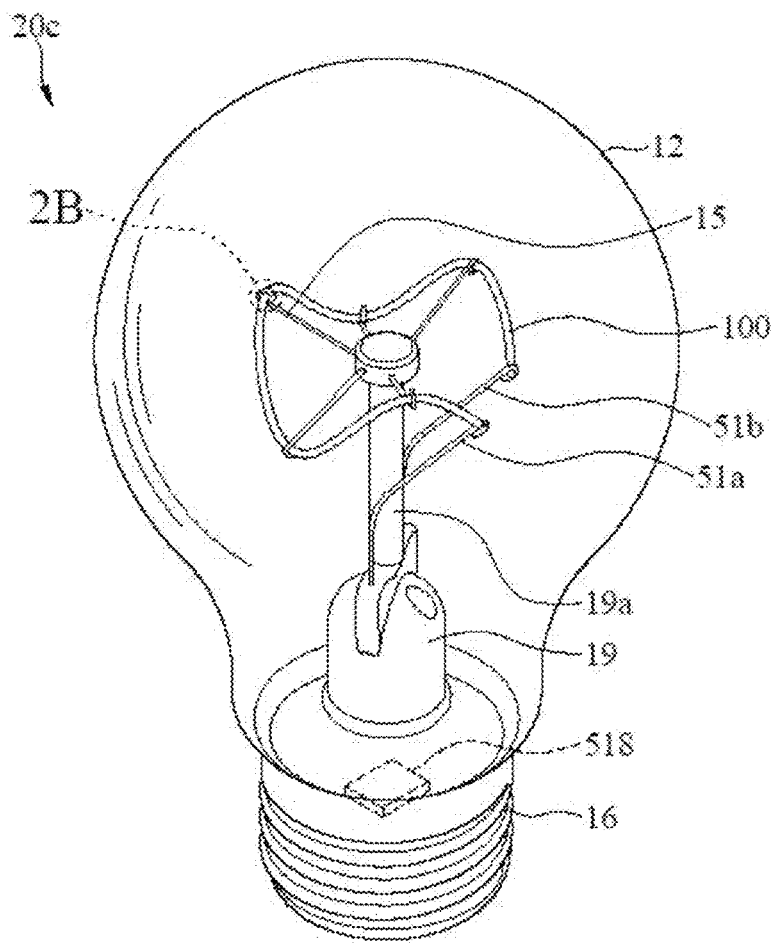
FIG. 7A illustrates a perspective view of an LED light bulb according to the third embodiment of the instant disclosure.

Please refer to FIG. 7A. FIG. 7A illustrates a perspective view of an LED light bulb according to the third embodiment of the present disclosure. According to the third embodiment, the LED light bulb 20c comprises a lamp housing 12, a bulb base 16 connected with the lamp housing 12, two conductive supports 51a, 51b disposed in the lamp housing 12, a driving circuit 518 electrically connected with both the conductive supports 51a, 51b and the bulb base 16, a stem 19, supporting arms 15 and a single LED filament 100.

The lamp housing 12 is a material which is preferably light transmissive or thermally conductive, such as, glass or plastic, but not limited thereto. In implementation, the lamp housing 12 may be doped with a golden yellow material or its surface coated with a yellow film to absorb a portion of the blue light emitted by the LED chip to reduce the color temperature of the light emitted by the LED light bulb 20c. In other embodiments of the present invention, the lamp housing 12 includes a layer of luminescent material (not shown), which may be formed on the inner surface or the outer surface of the lamp housing 12 according to design requirements or process feasibility, or even integrated in the material of the lamp housing 12. The luminescent material layer comprises low reabsorption semiconductor nanocrystals (hereinafter referred to as quantum dots), the quantum dots comprises a core, a protective shell and a light absorbing shell, and the light absorbing shell is disposed between the core and the protective shell. The core emits the emissive light with emission wavelength, and the light absorbing shell emits the excited light with excitation wavelength. The emission wavelength is longer than the excitation wavelength, and the protective shell provides the stability of the light.

The LED filament 100 shown in FIG. 7A is bent to form a contour resembling to a circle while being observed from the top view of FIG. 7A. According to the embodiment of FIG. 7A, the LED filament 100 is bent to form a wave shape from side view. The shape of the LED filament 100 is novel and makes the illumination more uniform. In comparison with a LED bulb having multiple LED filaments, single LED filament 100 has less connecting spots. In implementation, single LED filament 100 has only two connecting spots such that the probability of defect soldering or defect mechanical pressing is decreased.

The stem 19 has a stand 19a extending to the center of the bulb shell 12. The stand 19a supports the supporting arms 15. The first end of each of the supporting arms 15 is connected with the stand 19a while the second end of each of the supporting arms 15 is connected with the LED filament 100.

Figure 7B:
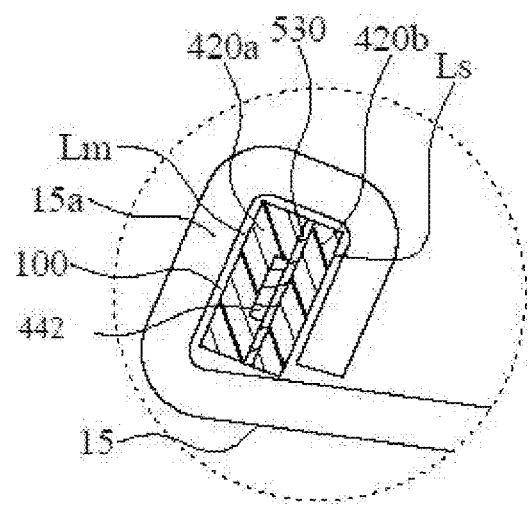
FIG. 7B illustrates an enlarged cross-sectional view of the dashed-line circle of FIG. 7A.

Please refer to FIG. 7B which illustrates an enlarged cross-sectional view of the dashed-line circle of FIG. 7A. The second end of each of the supporting arms 15 has a clamping portion 15a which clamps the body of the LED filament 100. The clamping portion 15a may, but not limited to, clamp at either the wave crest or the wave trough. Alternatively, the clamping portion 15a may clamp at the portion between the wave crest and the wave trough. The shape of the clamping portion 15a may be tightly fitted with the outer shape of the cross-section of the LED filament 100. The dimension of the inner shape (through hole) of the clamping portion 15a may be a little bit smaller than the outer shape of the cross-section of the LED filament 100. During manufacturing process, the LED filament 100 may be passed through the inner shape of the clamping portion 15a to form a tight fit. Alternatively, the clamping portion 15a may be formed by a bending process. Specifically, the LED filament 100 may be placed on the second end of the supporting arm 15 and a clamping tooling is used to bend the second end into the clamping portion to clamp the LED filament 100.

The supporting arms 15 may be, but not limited to, made of carbon steel spring to provide with adequate rigidity and flexibility so that the shock to the LED light bulb caused by external vibrations is absorbed and the LED filament 100 is not easily to be deformed. Since the stand 19a extending to the center of the bulb shell 12 and the supporting arms 15 are connected to a portion of the stand 19a near the top thereof, the position of the LED filaments 100 is at the level close to the center of the bulb shell 12. Accordingly, the illumination characteristics of the LED light bulb 20c are close to that of the traditional light bulb including illumination brightness. The illumination uniformity of LED light bulb 20c is better. In the embodiment, at least a half of the LED filaments 100 is around a center axle of the LED light bulb 20c. The center axle is coaxial with the axle of the stand 19a.

In the embodiment, the first end of the supporting arm 15 is connected with the stand 19a of the stem 19. The clamping portion of the second end of the supporting arm 15 is connected with the outer insulation surface of the LED filaments 100 such that the supporting arms 15 are not used as connections for electrical power transmission. In an embodiment where the stem 19 is made of glass, the stem 19 would not be cracked or exploded because of the thermal expansion of the supporting arms 15 of the LED light bulb 20c. Additionally, there may be no stand in an LED light bulb. The supporting arm 15 may be fixed to the stem or the bulb shell directly to eliminate the negative effect to illumination caused by the stand.

The supporting arm 15 is thus non-conductive to avoid a risk that the glass stem 19 may crack due to the thermal expansion and contraction of the metal filament in the supporting arm 15 under the circumstances that the supporting arm 15 is conductive and generates heat when current passes through the supporting arm 15.

In different embodiments, the second end of the supporting arm 15 may be directly inserted inside the LED filament 100 and become an auxiliary piece in the LED filament 100, which can enhance the mechanical strength of the LED filament 100. Relative embodiments are described later.

The inner shape (the hole shape) of the clamping portion 15a fits the outer shape of the cross section of the LED filament 100; therefore, based upon a proper design, the cross section of the LED filament 100 may be oriented to face towards a predetermined orientation. For example, as shown in FIG. 7B, the LED filament 100 comprises a top layer 420a, LED chips 104, and a base layer 420b. The LED chips 104 are aligned in line along the axial direction (or an elongated direction) of the LED filament 100 and are disposed between the top layer 420a and the base layer 420b. The top layer 420a of the LED filament 100 is oriented to face towards ten o'clock in FIG. 7B. A lighting face of the whole LED filament 100 may be oriented to face towards the same orientation substantially to ensure that the lighting face of the LED filament 100 is visually identical. The LED filament 100 comprises a main lighting face Lm and a subordinate lighting face Ls corresponding to the LED chips. If the LED chips in the LED filament 100 are wire bonded and are aligned in line, a face of the top layer 420a away from the base layer 420b is the main lighting face Lm, and a face of the base layer 420b away from the top layer 420a is the subordinate lighting face Ls. The main lighting face Lm and the subordinate lighting face Ls are opposite to each other. When the LED filament 100 emits light, the main lighting face Lm is the face through which the largest amount of light rays passes, and the subordinate lighting face Ls is the face through which the second largest amount of light rays passes. In the embodiment, there is, but is not limited to, a conductive foil 530 formed between the top layer 420a and the base layer 420b, which is utilized for electrical connection between the LED chips. In the embodiment, the LED filament 100 wriggles with twists and turns while the main lighting face Lm is always towards outside. That is to say, any portion of the main lighting face Lm is towards the bulb shell 12 or the bulb base 16 and is away from the stem 19 at any angle, and the subordinate lighting face Ls is always towards the stem 19 or towards the top of the stem 19 (the subordinate lighting face Ls is always towards inside).

The LED filament 100 shown in FIG. 7A is curved to form a circular shape in a top view while the LED filament is curved to form a wave shape in a side view. The wave shaped structure is not only novel in appearance but also guarantees that the LED filament 100 illuminates evenly. In the meantime, the single LED filament 100, comparing to multiple LED filaments, requires less joint points (e.g., pressing points, fusing points, or welding points) for being connected to the conductive supports 51a, 51b. In practice, the single LED filament 100 (as shown in FIG. 7A) requires only two joint points respectively formed on the two conductive electrodes, which effectively lowers the risk of fault welding and simplifies the process of connection compared to the mechanically connection in the tightly pressing manner.

Figure 7C:
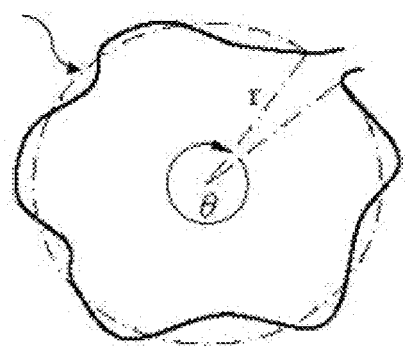
FIG. 7C is a projection of a top view of an LED filament of the LED light bulb of FIG. 7A.

Please refer to FIG. 7C. FIG. 7C is a projection of a top view of an LED filament of the LED light bulb 20c of FIG. 7A. As shown in FIG. 7C, in an embodiment, the LED filament may be curved to form a wave shape resembling a circle observed in a top view to surround the center of the light bulb or the stem. In different embodiments, the LED filament observed in the top view can form a quasi-circle or a quasi U shape.

As shown in FIG. 7B and FIG. 7C, the LED filament 100 surrounds with the wave shape resembling a circle and has a quasi-symmetric structure in the top view, and the lighting face of the LED filament 100 is also symmetric, e.g., the main lighting face Lm in the top view may face outwardly; therefore, the LED filament 100 may generate an effect of an omnidirectional light due to a symmetry characteristic with respect to the quasi-symmetric structure of the LED filament 100 and the arrangement of the lighting face of the LED filament 100 in the top view. Whereby, the LED light bulb 20c as a whole may generate an effect of an omnidirectional light close to a 360 degrees illumination. Additionally, the two joint points may be close to each other such that the conductive supports 51a, 51b are substantially below the LED filament 100. Visually, the conductive supports 51a, 51b keeps a low profile and is integrated with the LED filament 100 to show an elegance curvature.

Figure 8A:
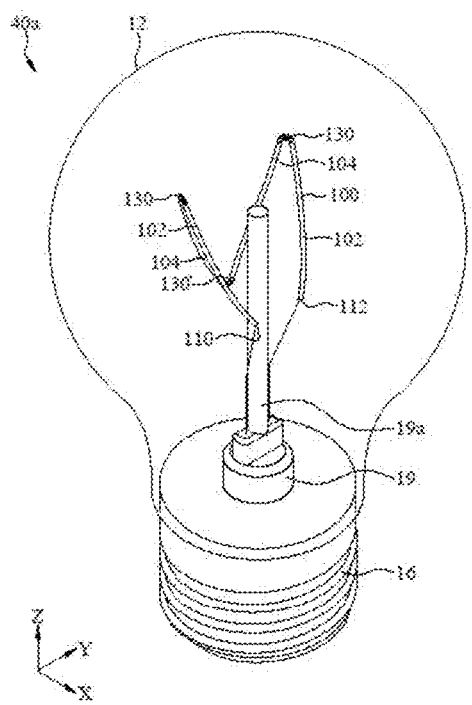
FIGS. 8A to 8D are respectively a perspective view, a side view, another side view and a top view of an LED light bulb in accordance with an embodiment of the present invention.
Figure 8B:
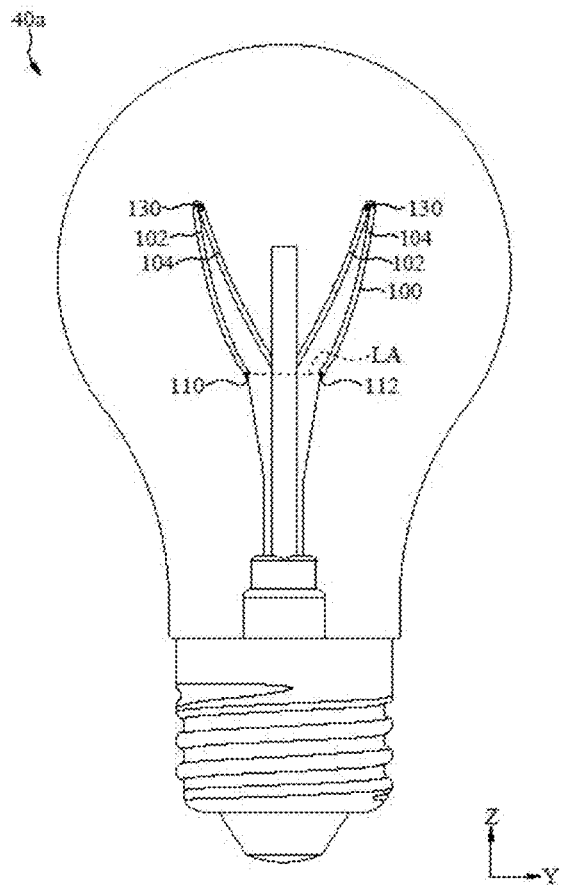
Figure 8C:
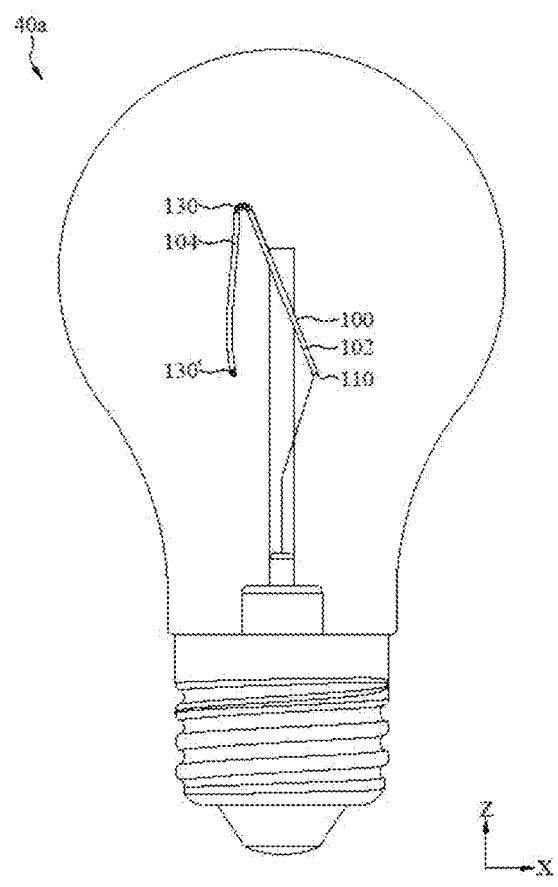
Figure 8D:
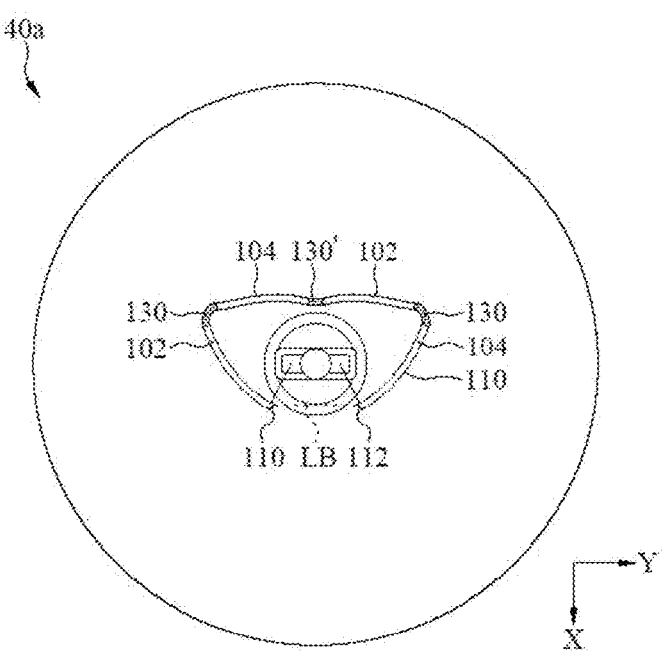

Referring to FIGS. 8A, 8B, 8C and FIG. 8D, FIG. 8A illustrates a schematic diagram of an LED light bulb 40a according to an embodiment of the present invention, FIG. 8B to FIG. 8D are a side view, another side view and the top view of the LED light bulb, respectively. In the present embodiment, the LED light bulb 40a includes a lamp housing 12, a bulb base 16 connected to the lamp housing 12, a stem 19, and a single LED filament 100. Moreover, the LED light bulb 40a and the single LED filament 100 disposed in the LED light bulb 40a can refer to related descriptions of the previous embodiments, wherein the same or similar components and the connection relationship between components is no longer detailed.

In the present embodiment, the stem 19 is connected to the bulb base 16 and located in the lamp housing 12, the stem 19 has a stand 19a extending vertically to the center of the lamp housing 12, the stand 19a is located on the central axis of the bulb base 16, or is located on the central axis of the LED light bulb 40a. The LED filament 100 is disposed around the stand 19a and is located within the lamp housing 12, and the LED filament 100 can be coupled to the stand 19a through a cantilever to maintain a predetermined curve and shape. Wherein a detailed description of the cantilever can be referenced to the previous embodiment and the drawings. The LED filament 100 includes two conductive electrodes 110, 112 at both ends, a plurality of LED sections 102, 104 and a plurality of conductive sections 130. As shown in FIG. 8A to FIG. 8D, in order to separate the conductive section 130 and the LED sections 102, 104 in the drawing, the plurality of the conductive sections 130 of the LED filament 100 is illustrated as points or small segments, which is only for the illustrations. It is easier to understand, and not for any limitation, and the subsequent embodiments are similar to the related drawings by the point or small segment distribution of the conductive section 130 to distinguish from the LED sections 102, 104. As described in various previous embodiments, each of the LED sections 102, 104 can include a plurality of LED chips connected to each other, and each of the conductive sections 130 can include a conductor. Each conductive section 130 is located between adjacent two LED sections 102, 104. The conductors in each conductive section 130 connect the LED chips in the adjacent two LED sections 102, 104, and the LED chips in the two LED sections 102 adjacent to the two conductive electrodes 110, 112 are respectively connected to the two conductive electrodes 110, 112. The stem 19 can be connected to the two conductive electrodes 110, 112 by means of conductive brackets, details of the conductive brackets can be referred to the previous embodiment and the drawings.

As shown in FIG. 8A to FIG. 8D, the LED filament 100 comprises two first conductive sections 130, one second conductive sections 130', and four LED sections 102, 104, and every two adjacent LED sections 102, 104 are connected through the bending first and second conductive section 130, 130'. Moreover, since the first and second conductive sections 130, 130' have better bendability than that of the LED sections 102, 104, the first and second conductive sections 130, 130' between the two adjacent LED sections 102, 104 can be bent severely, so that the angle between the two adjacent LED sections 102, 104 can be smaller, for example, the included angle can reach 45 degrees or less. In the present embodiment, each LED section 102, 104 is slightly curved or not bent compared to the first and second conductive sections 130, 130', so that a single LED filament 100 in the LED light bulb 40a can be bent severer because of the first and second conductive sections 130, 130', and the curling change in bending is more significant. Moreover, the LED filament 100 can be defined as a piece following each bending conductive sections 130, 130', and each LED section 102, 104 is formed into a respective piece.

As shown in FIG. 8B and FIG. 8C, each of the first and second conductive sections 130, 130' and the two adjacent LED sections 102, 104 is composed to form a U-shaped or V-shaped bent structure, that is, the U-shaped or V-shaped bent structure formed by each of the first and second conductive sections 130, 130' and the adjacent two LED sections 102, 104 is bent with two pieces, and the two LED sections 102, 104 are respectively formed the two pieces. In the present embodiment, the LED filament 100 is bent into four pieces by the first and second conductive sections 130, 130', the four LED sections 102, 104 are respectively formed the four pieces. Also, the number of LED sections 102, 104 is one more than the number of the conductive sections 130, 130'.

As shown in FIG. 8B, in the present embodiment, the conductive electrodes 110, 112 are located between the highest point and the lowest point of the LED filament 100 in the Z direction. The highest point is located at the highest first conductive section 130 in the Z direction, and the lowest point is located at the lowest second conductive section 130' in the Z direction. The lower second conductive section 130' and the higher first conductive section 130 are defined with the conductive electrodes 110, 112 as being close to or away from the bulb base 16. Referring to FIG. 8B, in the YZ plane, the positions of the conductive electrodes 110, 112 may constitute a line LA showing with dotted line, there are two first conductive sections 130 above the line LA, and one second conductive sections 130' below the line LA. In other words, in the Z direction, the number of the first conductive sections 130 positioned above the line LA to which the conductive electrodes 110, 112 are connected may be one more than the number of the second conductive section 130' positioned below the line LA. It is also contemplated that relative to the conductive electrodes 110, 112 as a whole, the number of the first conductive sections 130 away from the bulb base 16 is one more than the number of the second conductive section 130' near the bulb base 16. Further, if the LED filament 100 is projected on the YZ plane (refer to FIG. 8B), the line LA connected by the conductive electrodes 110, 112 has at least one intersection with the projection of the LED sections 102, 104. In the YZ plane, the lines LA connected by the conductive electrodes 110, 112 respectively intersect the projections of the two LED sections 104, so that the line LA and the projection of the adjacent two LED sections 104 have two intersections.

As shown in FIG. 8C, if the LED filament 100 is projected on the XZ plane, the projections of the opposing two LED sections 102, 104 overlap each other. In some embodiments, the projections of the opposing two LED sections 102, 104 on a particular plane may be parallel to each other.

As shown in FIG. 8D, if the LED filament 100 is projected on the XY plane, the projections of the conductive electrodes 110, 112 on the XY plane can be connected in a straight line LB showing with dotted line, and the projections of the first and second conductive sections 130,130' on the XY plane are not intersected or overlapped with the line LB, and the projections of the first and second conductive sections 130, 130' on the XY plane are respectively located on one side of the line LB. For example, as showing in FIG. 8D, the projections of the first conductive sections 130 on the XY plane are above the line LB.

As shown in FIGS. 8B to 8D, in the present embodiment, and the projection lengths of the LED filament 100 on the projection planes perpendicular to each other can have a designed proportion, so that the illumination is more uniform. For example, the projection of the LED filament 100 on the first projection surface, such as the XY plane, has a length L1, the projection of the LED filament 100 on the second projection surface, such as the YZ plane, has a length L2, and the projection of the LED filament 100 on the third projection planes, such as the XZ plane, has a length L3. The first projection plane, the second projection plane and the third projection plane are perpendicular to each other, and the normal line of the first projection plane is parallel to the axis of the LED light bulb 40a from the center of the lamp housing 12 to the center of the bulb base 16. Further, the projection of the LED filament 100 on the XY plane as shown in FIG. 8D, and the projection thereof will be similar to an inverted and deformed U shape, and the total length of the projection of the LED filament 100 on the XY plane is the length L1. The projection of the LED filament 100 on the YZ plane as shown in FIG. 8B, the projection thereof will be similar to the inverted and deformed W shape, and the total length of the projection of the LED filament 100 on the YZ plane is the length L2. The projection of the LED filament 100 on the XZ plane can be as shown in FIG. 8C, the projection of which will be similar to an inverted V shape, and the total length of the projection of the LED filament 100 on the XZ plane is the length L3. In the present embodiment, the length L1, the length L2, and the length L3 are approximately in a ratio of 1:1:0.9. In some embodiments, the length L1, the length L2, and the length L3 are approximately in a ratio of 1:(0.5 to 1):(0.6 to 0.9). For example, if the ratio of the length L1, the length L2, and the length L3 is closer to 1:1:1, the illumination uniformity of the single LED filament 100 in the LED light bulb 40a is better, and the omni-directional light appearance is better.

In some embodiments, the projected length of the LED filament 100 in the XZ plane or in the YZ plane is, for example but not limited thereto, a minimum of the height difference between the first conductive section 130 and the second conductive section 130' in the Z direction multiply by the number of LED sections 102, 104, or a minimum of the height difference of the LED filament 100 in the Z direction multiply by the number of LED sections 102, 104. In the present embodiment, the total length of the LED filament 100 is about 7 to 9 times the total length of the first conductive section 130 or the second conductive section 130'.

In the present embodiment, the LED filament 100 can be bent at the positions of the first and second conductive sections 130, 130' to form various curves, so that not only the overall aesthetic appearance of the LED light bulb 40a can be increased but also the light emitting of the LED light bulb 40a can be more uniform, and the better illumination is achieved.

As shown in FIG. 9A to FIG. 9D, the LED filament 100 comprises two first conductive sections 130 and one second conductive section 130', and four LED sections 102, 104, and every two adjacent LED sections 102, 104 are connected by the bending first or second conductive sections 130, 130'. Therefore, the single LED filament 100 in the LED light bulb 40d can be bent severer because of the first and second conductive sections 130, 130', and the curling change in bending is more significant. Moreover, the LED filament 100 can be defined as having a plurality of sections, each of the sections is connected between the first and second conductive sections 130, 130', and each LED section 102, 104 is formed into a respective section. In the present embodiment, the LED filament 100 is bent into four sections by two first conductive sections 130 and one second conductive sections 130', wherein the four LED sections 102, 104 are respectively the four sections.

Figure 9A:
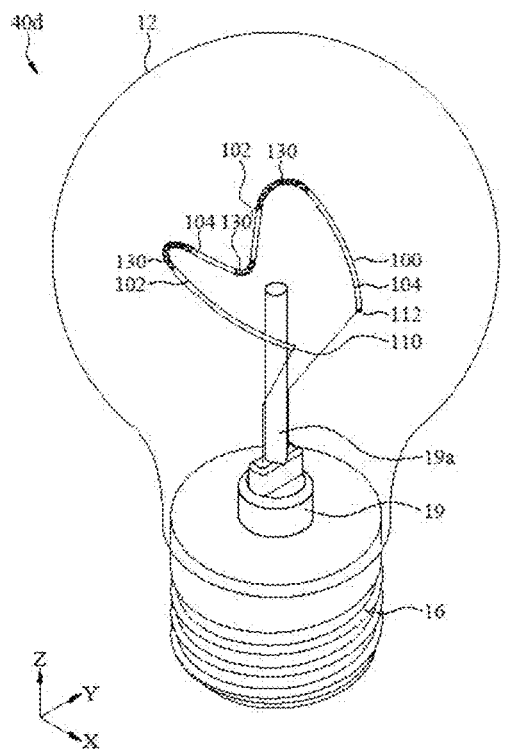
FIGS. 9A to 9D are respectively a perspective view, a side view, another side view and a top view of an LED light bulb in accordance with an embodiment of the present invention.
Figure 9B:
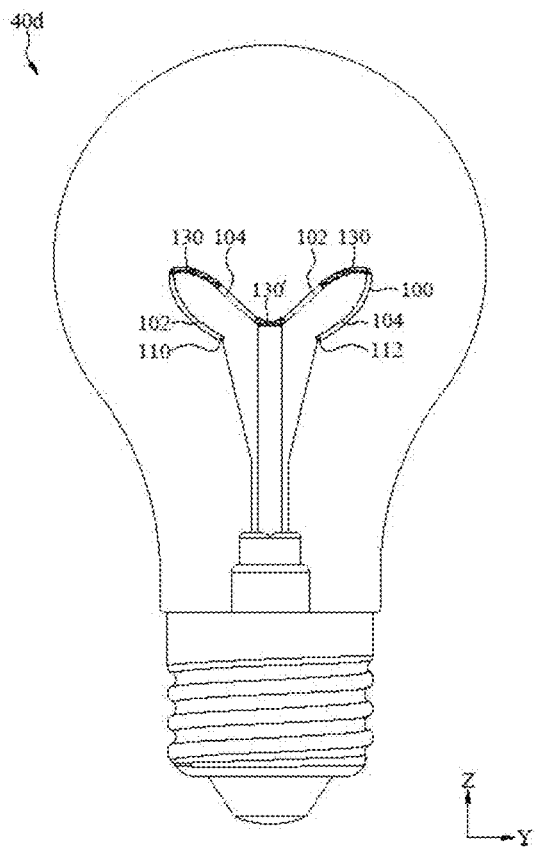
Figure 9C:
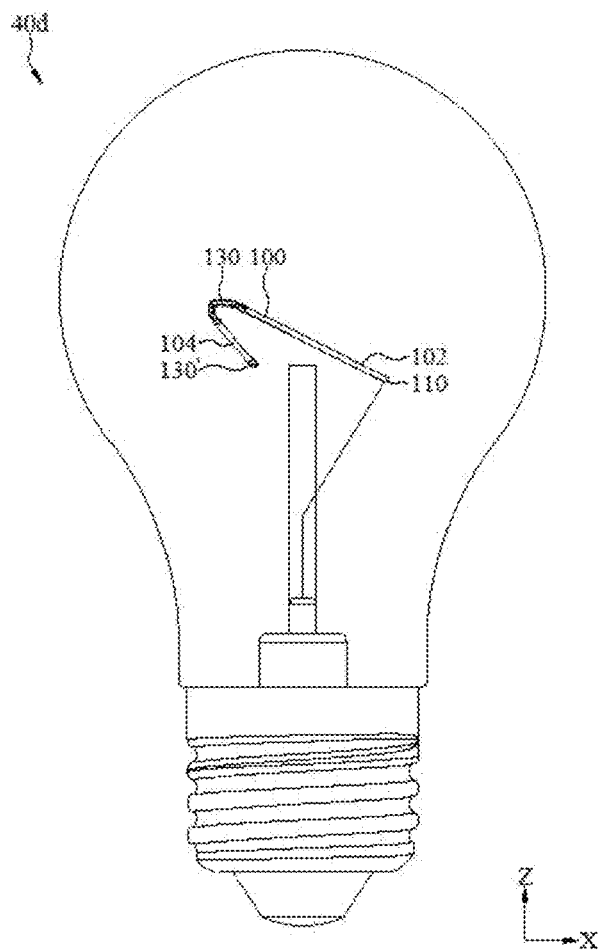
Figure 9D:
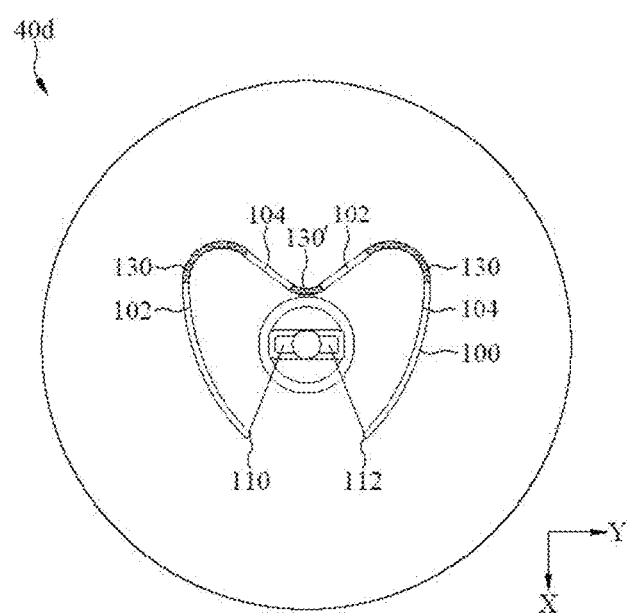

Referring to FIG. 9A, FIG. 9B and FIG. 9C, in the present embodiment, the height of the upper two first conductive sections 130 may be greater than the height of the second conductive sections 130' in the Z direction. The height of the two LED sections 102, 104 is between the upper first conductive section 130 and the lower second conductive section 130' in the Z direction. The other two LED sections 102, 104 extend downward from the corresponding first conductive section 130 in the Z direction, and the height of the conductive electrodes 110, 112 is less than the height of the second conductive section 130' in the Z direction. As shown in FIG. 9C of the present embodiment, the projections of the opposite LED sections 102, 104 are overlapped each other when the LED filament 100 is projected on the XZ plane. In the embodiment as shown in FIG. 9D, when the LED filament 100 is projected on the XY plane, all the projections of the first and second conductive sections 130, 130' are located in one side of a straight line connecting between the conductive electrodes 110, 112.

Compared to the LED filament 100 of the LED light bulb 40a shown in FIGS. 8A to 8D, the height difference between the first and second conductive sections 130, 130' of the LED filament 100 of the LED light bulb 40d shown in FIGS. 9A to 9D is smaller in the Z direction, the bending curvature of the first and second conductive sections 130, 130' is relatively large, so that the fluctuation curve of the LED filament 100 as a whole is tending to smaller.

Figure 10A:
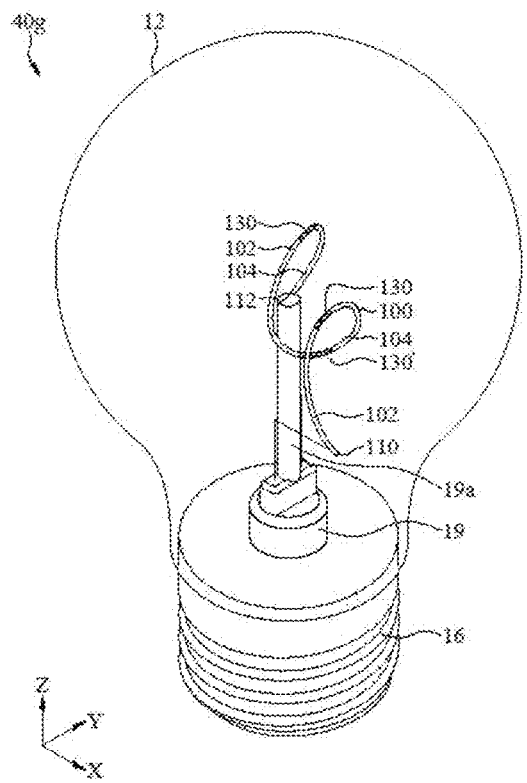
FIGS. 10A to 10D are respectively a perspective view, a side view, another side view and a top view of an LED light bulb in accordance with an embodiment of the present invention.
Figure 10B:
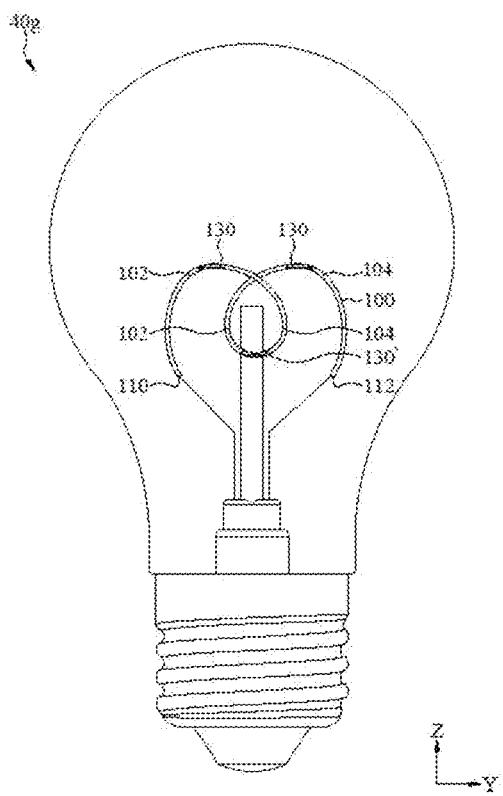
Figure 10C:
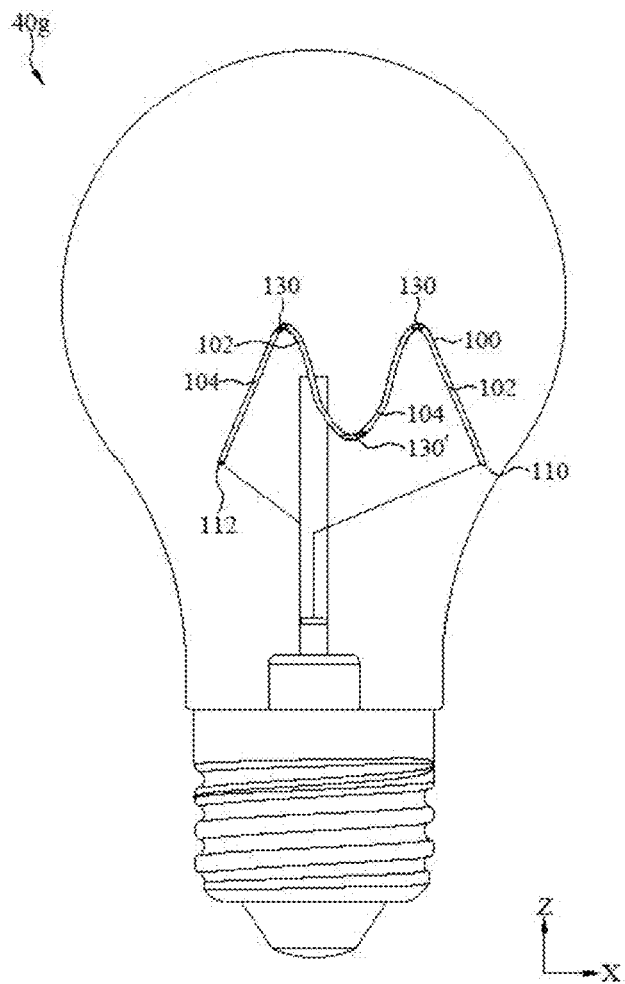
Figure 10D:
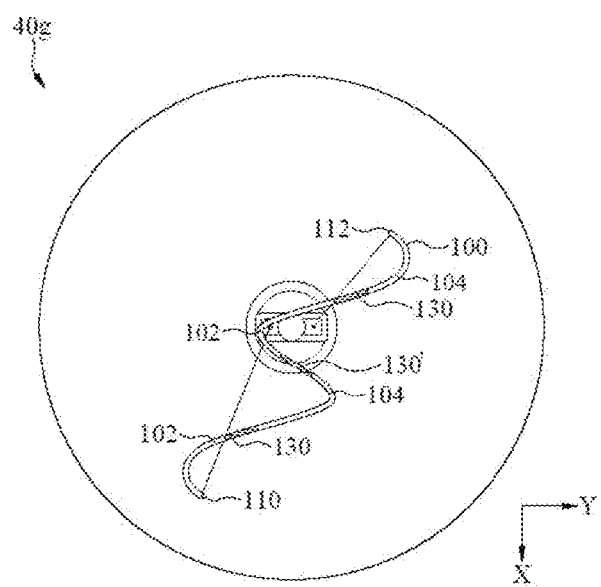

Referring to FIGS. 10A to 10D, FIG. 10A is a perspective diagram of an LED light bulb 40g according to an embodiment of the present invention, and FIGS. 10B to 10D are respectively side view, another side view, and top view of the FIG. 10A. In the present embodiment, the LED light bulb 40g includes a lamp housing 12, a bulb base 16 connected to the lamp housing 12, a stem 19, a stand 19a, and a single LED filament 100. The LED filament 100 includes two conductive electrodes 110, 112 disposed at two ends, a plurality of LED sections 102, 104 and a plurality of first and second conductive sections 130, 130'. Moreover, the LED light bulb 40g and a single LED filament 100 disposed in the LED light bulb 40g can refer to related descriptions of the previous embodiments, wherein the same or similar components and the connection relationship between components is no longer detailed.

As shown in FIG. 10A to FIG. 10D, the LED filament 100 comprises two conductive sections 130, one second conductive section 130', and four LED sections 102, 104, and every two adjacent LED sections 102, 104 are connected by the bending first and second conductive sections 130, 130'. Therefore, the single LED filament 100 in the LED light bulb 40g can be bent severer because of the first and second conductive sections 130, 130', and the curling change in bending is more significant. Moreover, the LED filament 100 can be defined as having a plurality of sections, each of the sections is connected between the first and second conductive sections 130, 130', and each LED section 102, 104 is formed into a respective section. In the present embodiment, the LED filament 100 is bent into four sections by the two conductive sections 130 and the one second conductive section 130', wherein the four LED sections 102, 104 are respectively the four sections.

Referring to FIG. 10A, FIG. 10B and FIG. 10C, in the present embodiment, the height of the upper two first conductive sections 130 may be greater than the height of the lower one second conductive sections 130' in the Z direction. The height of the two LED sections 104 is between the upper first conductive section 130 and the lower second conductive section 130' in the Z direction. The other two LED sections 102, 104 extend downward from the corresponding first conductive section 130 in the Z direction, and the height of the conductive electrodes 110, 112 is less than the height of the second conductive section 130' in the Z direction.

In the present embodiment as shown in FIG. 10A, the LED filament 100 extends around an axial direction and is resulted of a curling posture similar to spiral-like. As shown in FIG. 10B, the diameter of the spiral-like intermediate coil of the LED filament 100 (ie, the portion around which the two LED sections 102, 104 are formed) is relatively small, and the diameter of the outer spiral-like coil of the LED filament 100 (ie, the portion of the other two LED sections 102, 104 that extends outwardly and connects respectively with the conductive electrodes 110, 112) is relatively large. Moreover, the contour of the LED filament in the YZ plane may form a heart-like shape, and the distance between the two first conductive sections 130 is less than the distance between the two conductive electrodes 110, 112 in the Y direction. In other embodiments, the distance between the two first conductive sections 130 may be greater than or equal to the distance between the two conductive electrodes 110, 112 in the Y direction. In the present embodiment as shown in FIG. 10C, the LED filament 100 is in a shape like deformed S letter in the XZ plane. If the length of the LED filament 100 continues extending in a spiral-like posture along its axial direction, the curling posture of the LED filament 100 may have a plurality of overlapping shapes like deformed S letter in the XZ plane. In the present embodiment as shown in FIG. 10D, the curling posture of the LED filament 100 also has a shape like deformed S letter in the XY plane. If the length of the LED filament 100 continues extending in a spiral-like posture along its axial direction, the curling posture of the LED filament 100 may have a plurality of overlapping shapes like deformed S letter in the XY plane. As shown in FIGS. 10C and 10D, in the present embodiment, the first and second conductive sections 130, 130' are located between the conductive electrodes 110, 112.

Figure 11:
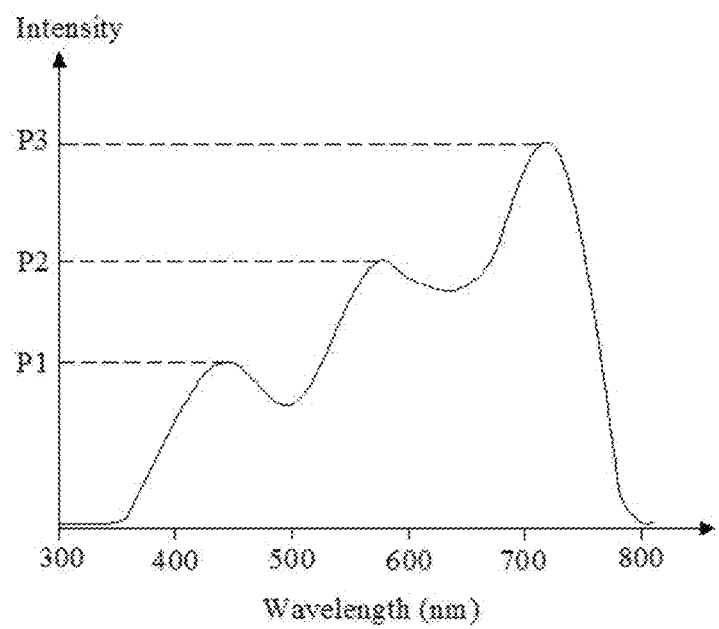
FIG. 11 is a schematic view showing the light emission spectrum of an LED light bulb in accordance with an embodiment of the present invention.
Figure 12:
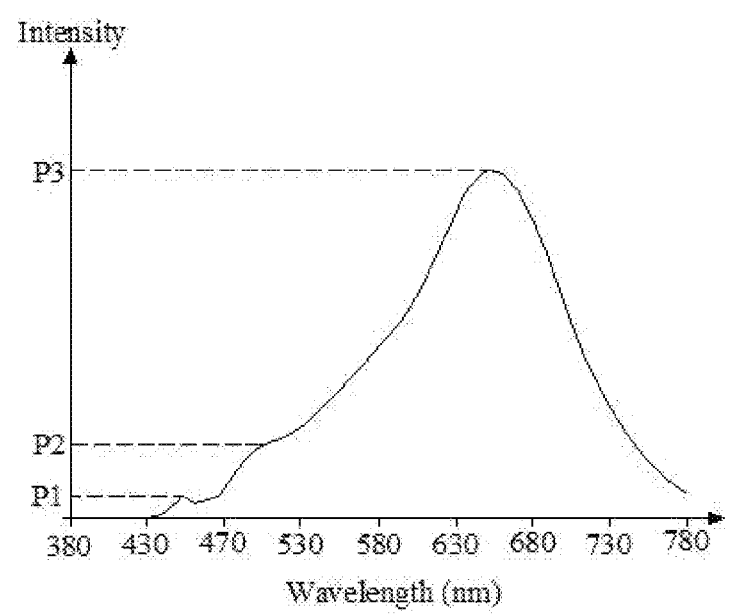
FIG. 12 is a schematic view showing the light emission spectrum of an LED light bulb in accordance with another embodiment of the present invention.

Referring to FIG. 11, which is a schematic diagram of the light emission spectrum of an LED light bulb according to an embodiment of the present invention. In the present embodiment, the LED light bulb may be any of the LED light bulbs disclosed in the previous embodiments, and any one of the LED light bulbs disclosed in the previous embodiments is provided. The light emitted by the LED light bulb is measured by a spectrometer to obtain a spectrum diagram as shown in FIG. 11. From the spectrum diagram, the spectral distribution of the LED light bulb is mainly between the wavelength range of about 400 nm to 800 nm. Moreover, there are three peaks of intensity values P1, P2, P3 in wavelength ranges corresponding to the light emitted by the LED light bulb. The wavelength of the intensity value P1 is between about 430 nm and 480 nm, the wavelength of the intensity value P2 is between about 580 nm and 620 nm, and the wavelength of the intensity value P3 is between about 680 nm and 750 nm. The light intensity of the peak P1 is less than that of the peak P2, and the light intensity of the peak P2 is less than the light intensity of the peak P3. As shown in FIG. 11, such a spectral distribution is close to the spectral distribution of a conventional incandescent filament lamp and also close to the spectral distribution of natural light. In accordance with an embodiment of the present invention, a schematic diagram of the light emission spectrum of a single LED filament is shown in FIG. 12. From the spectrum diagram, it can be seen that the spectral distribution of the LED light bulb is mainly between the wavelength range of about 400 nm to 800 nm, and there are three peaks of intensity values P1, P2, P3 in that wavelength range. The wavelength of the intensity value P1 is between about 430 nm and 480 nm, the wavelength of the intensity value P2 is between about 480 nm and 530 nm, and the wavelength of the intensity value peak P3 is between about 630 nm and 680 nm. Such a spectral distribution is close to the spectral distribution of a conventional incandescent filament lamp and also close to the spectral distribution of natural light.

The meaning of the term "a single LED filament" and "a single strip LED filament" as used in the present invention is mainly composed of the aforementioned conductive section, the LED section, the connection between thereof, the light conversion layer (including the consecutive top layer or the bottom layer, with continuous formation to cover or support all the components), and two conductive electrodes electrically connected to the conductive brackets of the LED light bulb disposing at both ends of the LED filament, which is the single LED filament structure referred to in the present invention.

The various embodiments of the present invention described above may be arbitrarily combined and transformed without being mutually exclusive, and are not limited to a specific embodiment. For example, some features as described in the embodiment shown in FIG. C although not described in the embodiment shown in FIG. A, those features may be included in the embodiment of FIG. A. That is, those skilled in the art can applies some features of the FIG. A to the embodiment shown in the FIG. C without additional creativity. Or alternatively, although the invention has illustrated various creation schemes by taking the LED light bulb as an example, it is obvious that these designs can be applied to other shapes or types of light bulb without additional creativity, such as LED candle bulbs, and the like.

The invention has been described above in terms of the embodiments, and it should be understood by those skilled in the art that the present invention is not intended to limit the scope of the invention. It should be noted that variations and permutations equivalent to those of the embodiments are intended to be within the scope of the present invention. Therefore, the scope of the invention is defined by the scope of the appended claims.

What is claimed is:
1. An LED light bulb, consisting of:
a lamp housing with inner surface and outer surface opposite to the inner surface of the lamp housing, the inner surface of the lamp housing is doped with a golden yellow material or its surface coated with a yellow film;
a bulb base connected to the lamp housing;
a stem connected to the bulb base and located in the lamp housing, the stem comprises a stand extending to the center of the lamp housing;
a single flexible LED filament, disposed in the lamp housing, the flexible LED filament comprising:
a plurality of LED sections, each of the LED sections includes at least two LED chips that are electrically connected to each other by a wire;
a plurality of conductive sections, each of the conductive sections is located between the two adjacent LED sections and configured to electrically connect the two adjacent LED sections, each of the conductive section includes a conductor connecting the LED sections, and length of the wire being less than that of the conductor, the conductor comprises joint region and transition regions, the joint region is located between the transition regions and configured to connect the transition regions, wherein taking the central point of the LED chip as the center, the shortest distance from the center to the closest boundary of the joint region is set to r1, and the shortest distance from the center to the closest boundary of the transition region is set to r2, where the distance r1 is greater than or equal to the distance r2;
at least two conductive electrodes, respectively disposed corresponding to the LED sections and electrically connected to the LED section; and
a light conversion layer, coated on at least two sides of the LED chip and the conductive electrodes, and a portion of each of the conductive electrodes is not coated with the light conversion layer, the light conversion layer has at least one top layer and one base layer, the top layer and the base layer are disposed on the opposing surface of the LED chip;
two conductive supports, each of the two conductive supports connected with the stem and the flexible LED filament;
a driving circuit, electrically connected with both the two conductive supports and the bulb base; and
a plurality of supporting arms, each of the supporting arms comprise a first end and a second end opposite to the first end of the supporting arms, the first end of each of the supporting arms is connected with the stand while the second end of each of the supporting arms is connected with the flexible LED filament;
wherein the base layer of the light conversion layer is formed from organosilicon-modified polyimide resin composition comprising an organosilicon-modified polyimide and a thermal curing agent, wherein the organosilicon-modified polyimide comprises a repeating unit represented by the following general Formula (I):

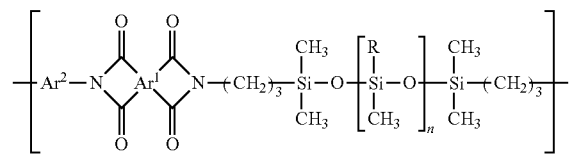

Formula (I)

wherein $Ar^1$ is a tetra-valent organic group having a benzene ring or an alicyclic hydrocarbon structure, $Ar^2$ is a di-valent organic group having a monocyclic alicyclic hydrocarbon structure, R is each independently methyl or phenyl, n is 1~5;
wherein the organosilicon-modified polyimide has a number average molecular weight of 5000~100000;
wherein the thermal curing agent is selected from the group consisting of epoxy resin, isocyanate and bisoxazoline compounds.

2. The LED light bulb according to claim 1, wherein the shortest distance between the two LED chips respectively located in the two adjacent LED sections is greater than that between two adjacent LED chips of one of the LED section.

3. The LED light bulb according to claim 2, wherein the LED chip is partly overlapping with the conductor in the radial direction of the flexible LED filament.

4. The LED light bulb according to claim 3, wherein the LED chip is partly overlapping with the transition region of the conductor.

5. The LED light bulb according to claim 4, wherein the maximum thickness of the LED chip in the radial direction of the flexible LED filament is H, where the thickness of the conductive electrode in the radial direction of the filament is 0.5H to 1.4H.

6. The LED light bulb according to claim 5, wherein each transition region of the conductor having two symmetrical contours symmetrically arranged about the longitudinal axis of the flexible LED filament and a portion of the contour is in contact with the joint region.

7. The LED light bulb according to claim 6, wherein the transition region has a fixed end contacting with the joint region, the width of the transition region is gradually reduced from the fixed end to the other end in the radial direction of the flexible LED filament.

8. The LED light bulb according to claim 7, wherein the transition region have two triangles symmetrical about the longitudinal axis of the flexible LED filament, one lateral of each of the triangle is aligned with the outer side of the flexible LED filament, and the other lateral of each of the triangle are connected with the joint region.

9. The LED light bulb according to claim 8, wherein the width of the transition region is gradually increased from the lateral of each of the triangle parallel with the short axial direction of the flexible LED filament.

10. The LED light bulb according to claim 9, wherein the conductor comprises one joint region and two transition regions, one transition region is connected to the middle of the joint region, and another transition region is connected to the middle or one end of the joint region.

11. The LED light bulb according to claim 10, wherein the average width of the transition region is less than that of the joint region.

12. The LED light bulb according to claim 11, wherein $Ar^1$ is derived from a dianhydride, and $Ar^2$ is derived from a diamine.

13. The LED light bulb according to claim 12, wherein $Ar^1$ is a tetra-valent organic group having a monocyclic alicyclic hydrocarbon structure or a bridged-ring alicyclic hydrocarbon structure, $Ar^2$ is a di-valent organic group comprising a functional group having active hydrogen, where the functional group having active hydrogen is any one of hydroxyl, amino, carboxy and mercapto.

14. The LED light bulb according to claim 13, wherein the organosilicon-modified polyimide resin composition further comprises an additive selected from the group consisting of fluorescent powders, heat dispersing particles and a coupling agent.

15. The LED light bulb according to claim 14, wherein the base layer comprise an upper surface where the LED chips is positioned and a lower surface opposite to the upper surface of the base layer, the lower surface of the base layer has a third area and a fourth area, where the surface roughness of the third area of the lower surface is higher than that of the fourth area with a cell.

16. The LED light bulb according to claim 15, wherein the surface roughness of the upper surface of the base layer is equal to the fourth area of the lower surface.

17. The LED light bulb according to claim 16, wherein the base layer of the light conversion layer have an elastic modulus more than 2.0 Gpa and elongation at break of 1.5~5%.

18. The LED light bulb according to claim 17, wherein points of the flexible LED filament in an xyz coordinates are defined as X, Y, and Z, an x-y plane of the xyz coordinates is perpendicular to the height direction of the light bulb, a z-axis of xyz coordinates is parallel with the stem, the number of LED sections is one more than the number of the conductive sections.

19. The LED light bulb according to claim 18, wherein the conductor sections comprises two first conductive sections and one second conductive sections, the two conductive electrodes constitute a line LA on the YZ plane, the two first conductive sections above the line LA, and one second conductive section below the LA.

20. The LED light bulb according to claim 19, wherein the projection of the flexible LED filament on the XY plane, YZ plane and XZ plane respectively has a length L1, L2 and L3, the length L1, the length L2, and the length L3 are substantially in a ratio of 1:(0.5 to 1):(0.6 to 0.9).

\* \* \* \* \*